(12) United States Patent
Lee et al.

(10) Patent No.: US 11,812,619 B2
(45) Date of Patent: Nov. 7, 2023

(54) RESISTIVE MEMORY DEVICES

(71) Applicant: SAMSUNG ELECTRONICS CO., LTD., Suwon-si (KR)

(72) Inventors: Jinwoo Lee, Seoul (KR); Zhe Wu, Seoul (KR); Dongsung Choi, Hwaseong-si (KR); Chungman Kim, Suwon-si (KR); Seunggeun Yu, Seoul (KR); Jabin Lee, Hwaseong-si (KR); Soyeon Choi, Gangjin-gun (KR)

(73) Assignee: Samsung Electronics Co., Ltd.

( * ) Notice: Subject to any disclaimer, the term of this patent is extended or adjusted under 35 U.S.C. 154(b) by 249 days.

(21) Appl. No.: 17/227,852

(22) Filed: Apr. 12, 2021

(65) Prior Publication Data

US 2022/0052116 A1 Feb. 17, 2022

(30) Foreign Application Priority Data

Aug. 12, 2020 (KR) .................. 10-2020-0101397

(51) Int. Cl.
*H10B 63/00* (2023.01)
*H10N 70/00* (2023.01)

(52) U.S. Cl.
CPC .......... *H10B 63/84* (2023.02); *H10N 70/826* (2023.02); *H10N 70/841* (2023.02)

(58) Field of Classification Search
CPC ..................................................... H10B 63/84
See application file for complete search history.

(56) References Cited

U.S. PATENT DOCUMENTS

| 9,620,713 | B2 | 4/2017 | Pellizzer |
| 9,716,129 | B1 | 7/2017 | Sim et al. |
| 9,806,129 | B2 | 10/2017 | Ravasio et al. |
| 10,141,373 | B2 | 11/2018 | Kim et al. |
| 10,249,820 | B2 | 4/2019 | Lee et al. |
| 10,475,853 | B2 | 11/2019 | Lee et al. |
| 2015/0243885 | A1 | 8/2015 | Sciarrillo |
| 2017/0243919 | A1* | 8/2017 | Seong .................... H10B 63/24 |
| 2017/0244026 | A1 | 8/2017 | Wu et al. |

(Continued)

FOREIGN PATENT DOCUMENTS

| JP | 4363136 | 11/2009 |
| KR | 1020170089633 | 8/2017 |

(Continued)

*Primary Examiner* — Mounir S Amer
(74) *Attorney, Agent, or Firm* — Myers Bigel, P.A.

(57) ABSTRACT

A resistive memory device includes a first conductive line extending in a first horizontal direction on a substrate, a plurality of second conductive lines separated from the first conductive line in a vertical direction and extending in a second horizontal direction intersecting with the first horizontal direction, on the substrate, a plurality of memory cells respectively connected between the first conductive line and one second conductive line selected from among the plurality of second conductive lines at a plurality of intersection points between the first conductive line and the plurality of second conductive lines, each of the plurality of memory cells including a selection device and a resistive memory pattern, and a bottom electrode shared by the plurality of memory cells, the bottom electrode having a variable thickness in the first horizontal direction, and including a top surface having a concave-convex shape.

15 Claims, 50 Drawing Sheets

(56) References Cited

U.S. PATENT DOCUMENTS

2017/0271581 A1* 9/2017 Seong ................ H10N 70/8413
2018/0175109 A1   6/2018 Choi et al.
2020/0006431 A1   1/2020 Mayuzumi et al.
2021/0202834 A1* 7/2021 Wu ..................... H10N 70/063

FOREIGN PATENT DOCUMENTS

| KR | 1020170099214 | 8/2017 |
| KR | 1020170107203 | 9/2017 |
| KR | 1020170109793 | 10/2017 |
| KR | 1020180069463 | 6/2018 |
| KR | 1020190143501 | 12/2019 |

* cited by examiner (B)

Y1-Y1'

RESISTIVE MEMORY DEVICES

CROSS-REFERENCE TO RELATED APPLICATION

This application is based on and claims priority under 35 U.S.C. § 119 to Korean Patent Application No. 10-2020-0101397, filed on Aug. 12, 2020, in the Korean Intellectual Property Office, the disclosure of which is incorporated by reference herein in its entirety.

BACKGROUND

The inventive concepts relate to memory devices, and particularly, to resistive memory devices having a cross-point array structure.

Resistive memory devices having a three-dimensional (3D) cross-point stack structure have been proposed where a memory cell is disposed at a cross-point between two electrodes intersecting with each other. As large-capacity and high-speed resistive memory devices are increasingly demanded, it is advantageous to develop a new structure for enhancing the reliability of resistive memory devices having a cross-point stack structure and increasing the lifetime thereof.

SUMMARY

The inventive concepts provide resistive memory devices having a structure for enhancing reliability and increasing device lifetime.

According to an aspect of the inventive concepts, there is provided a resistive memory device including a first conductive line extending in a first horizontal direction on a substrate, a plurality of second conductive lines separated from the first conductive line in a vertical direction and extending in a second horizontal direction intersecting with the first horizontal direction, on the substrate, a plurality of memory cells respectively connected between the first conductive line and one second conductive line selected from among the plurality of second conductive lines at a plurality of intersection points between the first conductive line and the plurality of second conductive lines, each of the plurality of memory cells including a selection device and a resistive memory pattern, and a bottom electrode shared by the plurality of memory cells, the bottom electrode having a variable thickness in the first horizontal direction and including a top surface having a concave-convex shape.

According to another aspect of the inventive concepts, there is provided a resistive memory device including a plurality of first conductive lines extending in a first horizontal direction on a substrate, a plurality of second conductive lines separated from the plurality of first conductive lines in a vertical direction and extending in a second horizontal direction intersecting with the first horizontal direction on the substrate, and a plurality of memory cells at respective intersection points between the plurality of first conductive lines and the plurality of second conductive lines, each of the plurality of memory cells including a selection device and a resistive memory pattern, wherein each of the plurality of memory cells includes one of a plurality of bottom electrodes extending in the first horizontal direction between the plurality of first conductive lines and the selection devices, each of the plurality of bottom electrodes having a variable thickness in the first horizontal direction and including a top surface having a concave-convex shape, and a first group among the plurality of memory cells that are arranged in one row in the first horizontal direction share a first bottom electrode selected from among the plurality of bottom electrodes.

According to another aspect of the inventive concepts, there is provided a resistive memory device including a first conductive line extending in a first horizontal direction on a substrate, a plurality of second conductive lines separated from the first conductive line in a vertical direction and extending on the substrate in a second horizontal direction intersecting with the first horizontal direction, a plurality of memory cells respectively at a plurality of intersection points between the first conductive line and the plurality of second conductive lines and arranged in one row in the first horizontal direction on the first conductive line, a bottom electrode shared by the plurality of memory cells, the bottom electrode having a variable thickness in the first horizontal direction and including a bottom surface contacting a top surface of the first conductive line and a top surface having alternating recess and protrusion surfaces, a pair of insulation spacers on sidewalls of the bottom electrode and on the first conductive line, a plurality of lower insulation lines on a sidewall of the first conductive line and a sidewall of each of the pair of insulation spacers, and an upper insulation structure on a sidewall of each of the plurality of memory cells and on the plurality of lower insulation lines.

BRIEF DESCRIPTION OF THE DRAWINGS

Embodiments of the inventive concepts will be more clearly understood from the following detailed description taken in conjunction with the accompanying drawings in which:

FIG. 5B is a perspective view illustrating some elements of FIG. 5A;

FIG. 8B is a perspective view illustrating some elements of FIG. 8A;

FIG. 10B is a perspective view illustrating some elements of FIG. 10A;

FIG. 11B is a perspective view illustrating some elements of FIG. 11A;

DETAILED DESCRIPTION

Hereinafter, embodiments of the inventive concepts will be described in detail with reference to the accompanying drawings. For convenience of illustration, the accompanying drawings may not be suitable for a dimension, and elements may be illustrated to be exaggerated or reduced. Like numeral references refer to like elements, and their repetitive descriptions are omitted.

Figure 1:
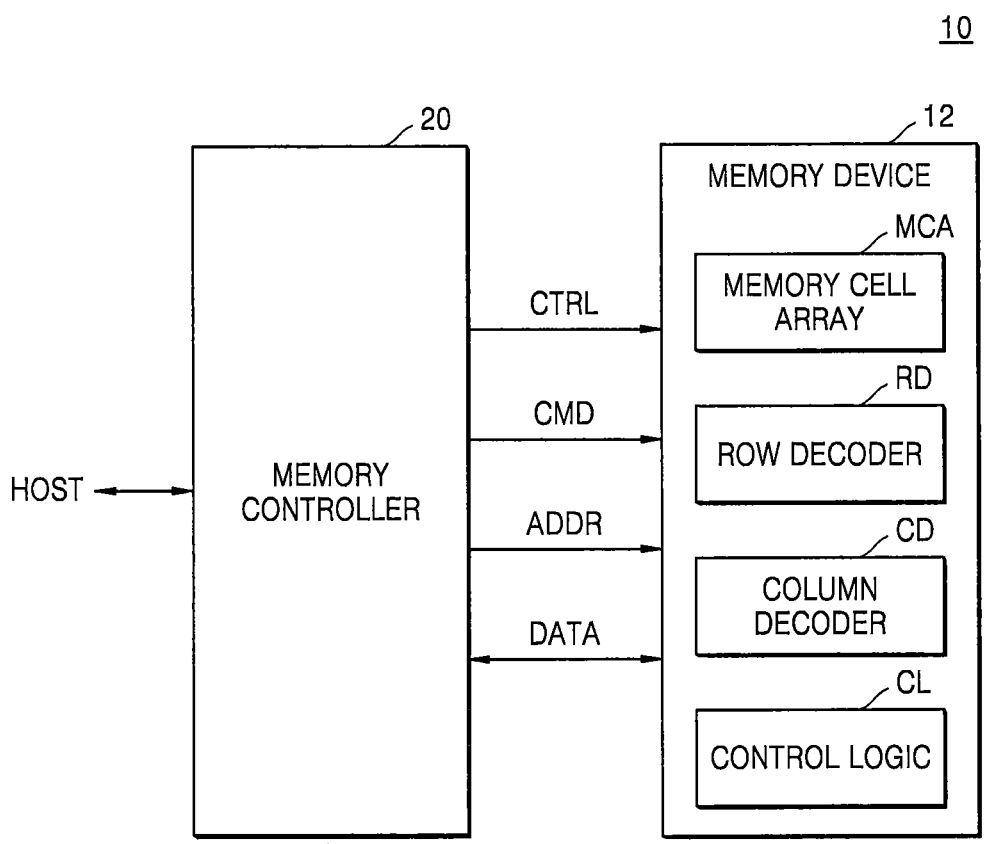
FIG. 1 is a block diagram for describing a memory system including a resistive memory device, according to some embodiments of the inventive concepts.

FIG. 1 is a block diagram for describing a memory system 10 including a resistive memory device, according to some embodiments of the inventive concepts.

Referring to FIG. 1, the memory system 10 may include a memory device 12 and a memory controller 20. The memory device 12 may include a memory cell array MCA, a row decoder RD, a column decoder CD, and a control logic CL.

In response to a write/read request from a host HOST, the memory controller 20 may control the memory device 12 to read data stored in the memory device 12 or to write data in the memory device 12. The memory controller 20 may provide an address ADDR, a command CMD, and a control signal CTRL to the memory device 12, and thus, may control a program (or write) operation, a read operation, and an erase operation. Also, data DATA to be written and read data DATA may be transmitted and received between the memory controller 20 and the memory device 12.

The memory cell array MCA may include a plurality of memory cells (for example, a plurality of memory cells MC illustrated in FIG. 3) respectively disposed in a plurality of regions formed by intersections of a plurality of first signal lines and a plurality of second signal lines. In some embodiments, the plurality of first signal lines may include a plurality of bit lines, and the plurality of second signal lines may include a plurality of word lines. In other embodiments, the plurality of first signal lines may include a plurality of word lines, and the plurality of second signal lines may include a plurality of bit lines.

Each of the plurality of memory cells may be a single level cell (SLC) for storing one bit, a multi-level cell (MLC) for storing data of two or more bits, or a combination thereof.

Figure 3:
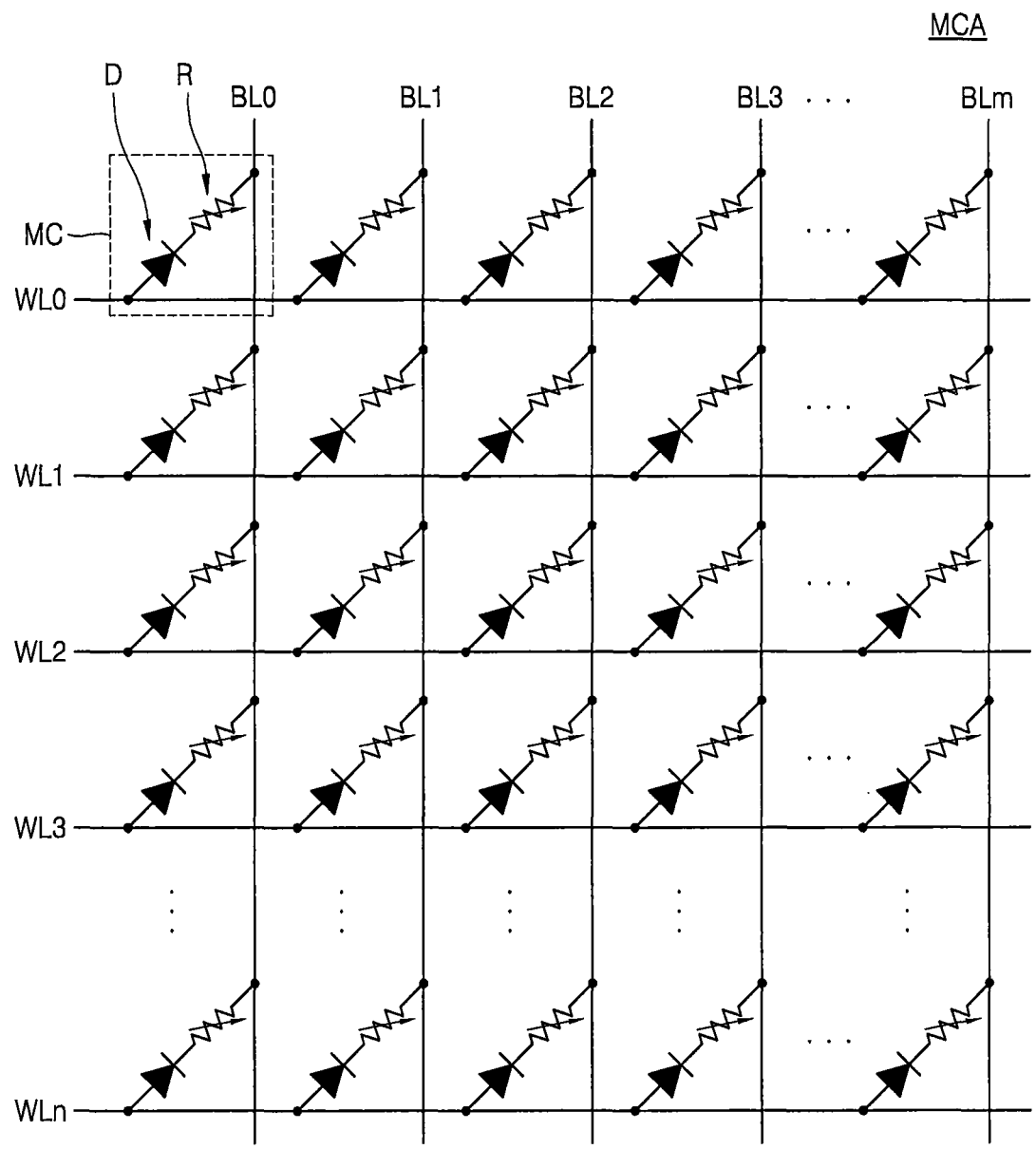
FIG. 3 is a circuit diagram illustrating an implementation example of a memory cell array illustrated in FIG. 2.

The memory cell array MCA may include a variable resistance device, and for example, may include a plurality of resistive memory cells including a variable resistor R illustrated in FIG. 3. In some embodiments, when the variable resistance device includes a phase change material where a resistance thereof varies based on a temperature, the memory device 12 may include a phase-change random access memory (PRAM) device.

The row decoder RD may drive a plurality of word lines configuring the memory cell array MCA, and the column decoder CD may drive a plurality of bit lines configuring the memory cell array MCA. The row decoder RD may include a decoding means for decoding a row address and a switch means where switching is controlled in response to various row control signals based on a decoding result. The column decoder CD may include a decoding means for decoding a column address and a switch means where switching is controlled in response to various column control signals based on a decoding result.

The control logic CL may control an overall operation of the memory device 12 and may control the row decoder RD and the column decoder CD so as to perform an operation of selecting a memory cell in the memory cell array MCA. For example, the control logic CL may process an address from the outside (e.g., external to the memory device 12) to generate a row address and a column address. The memory device 12 may include a power generating means (not shown) which generates various write voltages and read voltages used for a write operation and a read operation, and based on control by the control logic CL, a write voltage and a read voltage may be provided to a memory cell through the row decoder RD and the column decoder CD.

Figure 2:
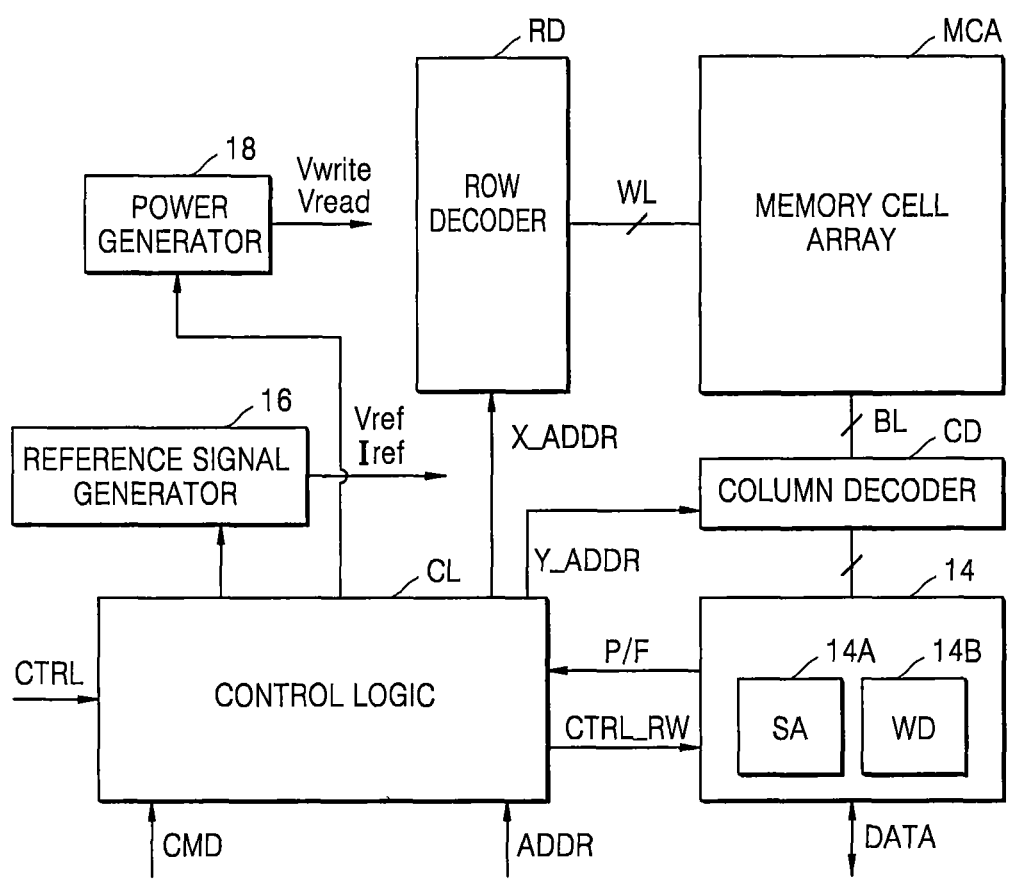
FIG. 2 is a block diagram for describing a configuration of a memory device illustrated in FIG. 1.

FIG. 2 is a block diagram for describing a configuration of the memory device 12 illustrated in FIG. 1.

Referring to FIG. 2, the memory device 12 may include a memory cell array MCA, a row decoder RD, a column decoder CD, and a control logic CL. Also, the memory device 12 may further include a write/read circuit 14, a reference signal generator 16, and a power generator 18. The write/read circuit 14 may include a sense amplifier 14A and a write driver 14B.

A plurality of memory cells included in the memory cell array MCA may be connected to a plurality of word lines WL and a plurality of bit lines BL. Various voltage signals or current signals may be provided through the plurality of word lines WL and the plurality of bit lines BL, and thus, data may be written in or read from selected memory cells and data may be prevented from being written in or read from the other unselected memory cells.

The control logic CL may receive an address ADDR for indicating a memory cell which is to be accessed, based on a command CMD. The address ADDR may include a row address X_ADDR for selecting a word line WL of the memory cell array MCA and a column address Y_ADDR for selecting a bit line BL of the memory cell array MCA. The row decoder RD may perform a word line selecting operation in response to the row address X_ADDR, and the column decoder CD may perform a bit line selecting operation in response to the column address Y_ADDR.

The write/read circuit 14 may be connected to the bit line BL and may write data in a memory cell or may read data from the memory cell.

The power generator 18 may generate a write voltage Vwrite used for a write operation and a read voltage Vread used for a read operation. The write voltage Vwrite may include a set voltage and a reset voltage. The write voltage Vwrite and the read voltage Vread may be provided to the bit line BL through the column decoder CD, or may be provided to the word line WL through the row decoder RD.

The reference signal generator 16 may generate a reference voltage Vref and a reference current Iref as various reference signals associated with a data read operation.

In the write/read circuit 14, the sense amplifier 14A may be connected to a sensing node of the bit line BL so as to determine data by using the reference voltage Vref or the reference current Iref. The write/read circuit 14 may provide the control logic CL with a pass/fail signal P/F based on a result of determination of read data. The control logic CL may control a write operation and a read operation each performed on the memory cell array MCA with reference to the pass/fail signal P/F.

The control logic CL may output various control signals CTRL_RW for writing data in the memory cell array MCA or reading data from the memory cell array MCA on the basis of the address ADDR, the command CMD, and a control signal CTRL each received from a memory controller 20 (see FIG. 1).

FIG. 3 is a circuit diagram illustrating an implementation example of the memory cell array MCA illustrated in FIG. 2.

Referring to FIG. 3, the memory cell array MCA may include a plurality of cell areas, and FIG. 3 may represent one of the plurality of cell areas.

The memory cell array MCA may include a plurality of word lines WL0, WL1, . . . , and WLn (where n is an integer of 2 or more), a plurality of bit lines BL0, BL1, . . . , and BLm (where m is an integer of 2 or more), and a plurality of memory cells MC.

The plurality of word lines WL0, WL1, . . . , and WLn may correspond to the word line WL of FIG. 2, and the plurality of bit lines BL0, BL1, . . . , and BLm may correspond to the bit line BL of FIG. 2. The plurality of memory cells MC may be disposed at intersection points between the plurality of word lines WL0, WL1, . . . , and WLn and the plurality of bit lines BL0, BL1, . . . , and BLm (e.g., at points at which the plurality of word lines cross, in plan view, the plurality of bit lines). The number of word lines WL, the number of bit lines BL, and the number of memory cells MC may be variously changed according to some embodiments.

Each of the plurality of memory cells MC may include a variable resistor R for storing information and a selection device D for selecting a memory cell. The selection device D may be electrically connected to one of the plurality of word lines WL0, WL1, . . . , and WLn, the variable resistor R may be electrically connected to one of the plurality of bit lines BL0, BL1, . . . , and BLm, and the variable resistor R may be serially connected to the selection device D. However, the inventive concepts are not limited thereto. For example, the variable resistor R may be connected to a word line, and the selection device D may be connected to a bit line.

In order to drive a memory device 12 (see FIG. 2), a voltage may be applied to the variable resistor R of the memory cell MC through the plurality of word lines WL0, WL1, . . . , and WLn and the plurality of bit lines BL0, BL1, . . . , and BLm, and thus, a current may flow in the variable resistor R. The variable resistor R may be changed to one of a plurality of resistance states by an electrical pulse applied thereto. In some embodiments, the variable resistor R may include a phase change material where a crystal state thereof is changed based on the amount of current. The phase change material may be changed to an amorphous state where a resistance is relatively high, or a crystal state where a resistance is relatively low. A phase of the phase change material may be changed by Joule's heat which is generated based on the amount of current, and data may be written by using a phase change.

An arbitrary memory cell MC may be selected by selecting the plurality of word lines WL0, WL1, . . . , and WLn and the plurality of bit lines BL0, BL1, . . . , and BLm, and by applying a certain signal to a selected word line and a selected bit line, the arbitrary memory cell MC may be programmed. Also, a value of a current may be measured through the plurality of bit lines BL0, BL1, . . . , and BLm, and thus, information (i.e., programmed information) based on a resistance value of a resistive memory pattern of a corresponding memory cell MC may be read.

Figure 4:
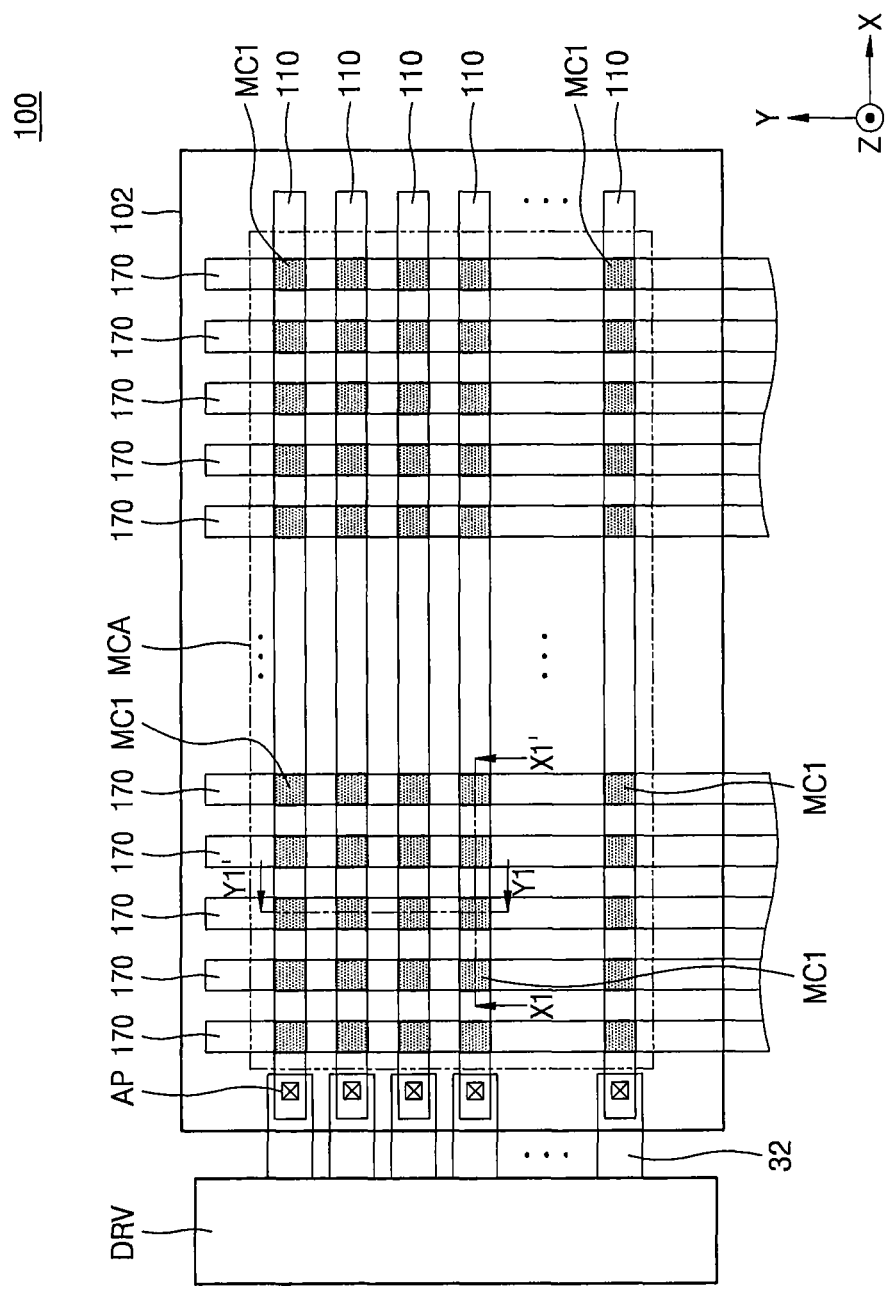
FIG. 4 is a plan layout diagram illustrating some elements of a resistive memory device according to some embodiments of the inventive concepts.
Figure 5A:
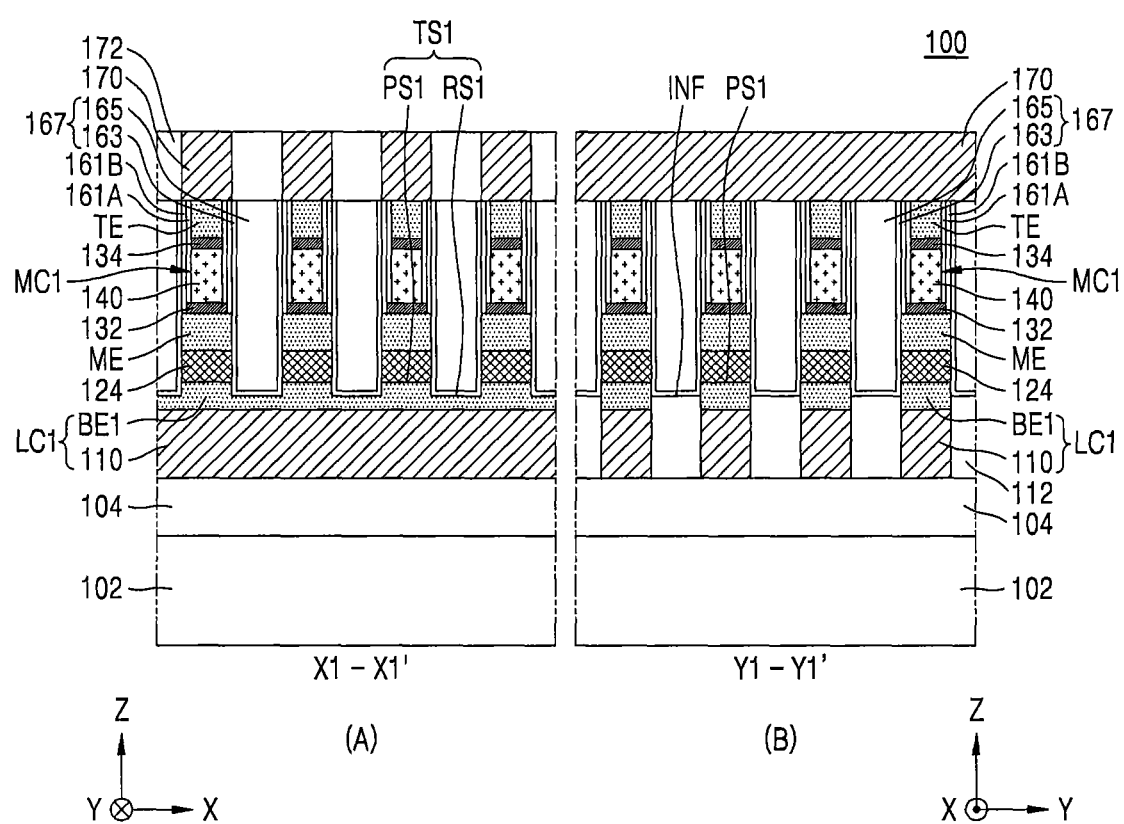
FIGS. 5A and 5B are diagrams illustrating some elements of the resistive memory device illustrated in FIG. 4, in which region (A) of FIG. 5A is a cross-sectional view taken along line X1-X1' of FIG. 4, region (B) of FIG. 5A is a cross-sectional view taken along line Y1-Y1' of FIG. 4.
Figure 5B:
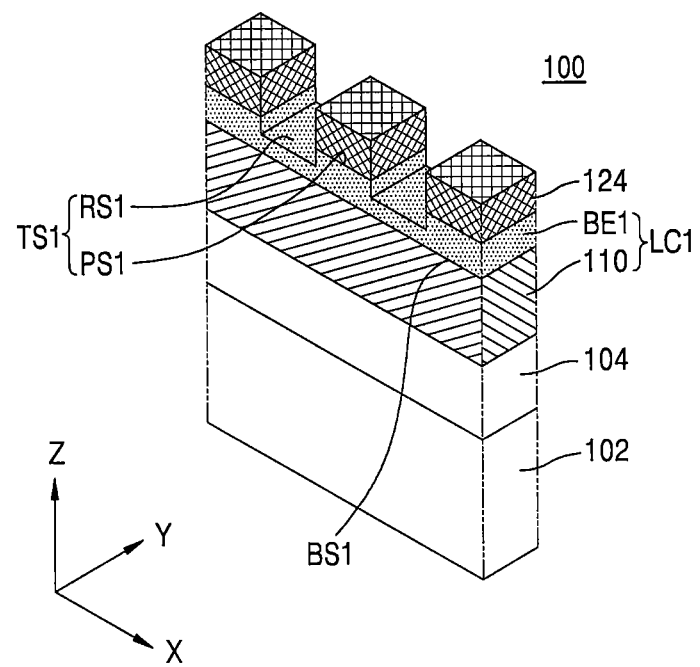

FIG. 4 is a plan layout diagram illustrating some elements of a resistive memory device 100 according to some embodiments of the inventive concepts, FIGS. 5A and 5B are diagrams illustrating some elements of the resistive memory device 100 illustrated in FIG. 4. Region (A) of FIG. 5A is a cross-sectional view taken along line X1-X1' of FIG. 4, region (B) of FIG. 5A is a cross-sectional view taken along line Y1-Y1' of FIG. 4, and FIG. 5B is a perspective view illustrating some elements of FIG. 5A. The resistive memory device 100 illustrated in FIGS. 4, 5A, and 5B may have an equivalent circuit configuration described above with reference to FIG. 3.

Referring to FIGS. 4, 5A, and 5B, a memory cell array MCA of the resistive memory device 100 may include a plurality of first conductive lines 110, extending in parallel in a first horizontal direction (e.g., an X direction) on a substrate 102, and a plurality of second conductive lines 170 extending in parallel in a second horizontal direction (e.g., a Y direction) intersecting with the first horizontal direction (e.g., the X direction). In the present embodiment, an example where the first horizontal direction (e.g., the X direction) is perpendicular to the second horizontal direction (e.g., the Y direction) will be described below, but the inventive concepts are not limited thereto. In some embodiments, the plurality of first conductive lines 110 may configure the plurality of word lines WL0, WL1, . . . , and WLn illustrated in FIG. 3, and the plurality of second conductive lines 170 may configure the plurality of bit lines BL0, BL1, . . . , and BLm illustrated in FIG. 3. In other embodiments, the plurality of first conductive lines 110 may configure the plurality of bit lines BL0, BL1, . . . , and BLm, and the plurality of second conductive lines 170 may configure the plurality of word lines WL0, WL1, . . . , and WLn.

A plurality of memory cells MC1 may be disposed at a plurality of intersection points between the plurality of word lines WL0, WL1, . . . , and WLn and the plurality of bit lines BL0, BL1, . . . , and BLm. Each of the plurality of memory cells MC1 may be configured to be connected to one of the plurality of word lines WL0, WL1, . . . , and WLn and one of the plurality of bit lines BL0, BL1, . . . , and BLm. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

An interlayer insulation layer 104 may be disposed on the substrate 102. The interlayer insulation layer 104 may include, for example, oxide, nitride, or a combination thereof. The interlayer insulation layer 104 may electrically disconnect (e.g., insulate) the plurality of first conductive lines 110 from the substrate 102. In FIG. 5A, a configuration where the interlayer insulation layer 104 is disposed on the substrate 102 is illustrated, but the inventive concepts are not limited thereto. For example, an integrated circuit layer may be disposed on the substrate 102, and the plurality of memory cells MC1 may be disposed on the integrated circuit layer. The integrated circuit layer may include, for example, a peripheral circuit for an operation of each of the plurality of memory cells MC1 and/or a core circuit for an arithmetical operation. As used herein, the term "and/or" includes any and all combinations of one or more of the associated listed items.

The plurality of first conductive lines 110 may be connected to a driver DRV. The driver DRV may include a plurality of circuits for applying a voltage to the plurality of first conductive lines 110, and for example, may include the row decoder RD described above with reference to FIG. 2. As illustrated in FIG. 4, the driver DRV may apply a voltage of an access point AP of each of the plurality of first conductive lines 110 through a wiring 32. In performing a set write operation, a selected memory cell MC1 may be supplied with a voltage through a selected first conductive line 110 and a selected second conductive line 170 each connected thereto. For example, a set high voltage may be applied to the selected first conductive line 110 through the access point AP and a set low voltage, which is lower than the set high voltage, may be applied to the selected second conductive line 170, and thus, a voltage corresponding to a potential difference between the set high voltage and the set low voltage may be applied to both ends of the selected memory cell MC1 and a set current may flow in the selected memory cell MC1, whereby a current may flow in the plurality of first conductive lines 110 and the plurality of second conductive lines 170.

A plurality of lower insulation lines 112 may each be disposed between two adjacent first conductive lines 110 of the plurality of first conductive lines 110, and a plurality of second insulation lines 172 may each be disposed between two adjacent second conductive lines 170 of the plurality of second conductive lines 170. The plurality of lower insulation lines 112 and the plurality of second insulation lines 172 may each include, for example, silicon oxide, silicon nitride, or a combination thereof.

The plurality of first conductive lines 110 and the plurality of second conductive lines 170 may each include, for example, metal, conductive metal nitride, conductive metal oxide, or a combination thereof. In some embodiments, the plurality of first conductive lines 110 and the plurality of second conductive lines 170 may each include tungsten (W), titanium (Ti), tantalum (Ta), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), titanium carbon silicon nitride (TiCSiN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), gold (Au), silver (Ag), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), or an alloy thereof or a combination thereof. The plurality of first conductive lines 110 and the plurality of second conductive lines 170 may each include a conductive barrier layer. The conductive barrier layer may include, for example, Ti, TiN, Ta, TaN, and a combination thereof. In some embodiments, the plurality of first conductive lines 110 may each include a metal layer, and the plurality of second conductive lines 170 may each include a multilayer including a conductive metal nitride layer and a metal layer.

The plurality of memory cells MC1 disposed at a plurality of intersection points between the plurality of first conductive lines 110 and the plurality of second conductive lines 170 (e.g., at points at which the plurality of first conductive lines 110 cross, in plan view, the plurality of second conductive lines 170) may be insulated from one another by the plurality of lower insulation lines 112 and an upper insulation structure 167. The upper insulation structure 167 may cover a sidewall of each of the plurality of memory cells MC1, on the plurality of lower insulation lines 112. The upper insulation structure 167 may include an encapsulation liner 163, on and/or contacting a sidewall of each of the plurality of memory cells MC1, and a gap-fill insulation layer 165 which is apart from (e.g., separated from) the plurality of memory cells MC1 with the encapsulation liner 163 therebetween and is within a space between two adjacent memory cells MC1 of the plurality of memory cells MC1 above and/or on the encapsulation liner 163.

The plurality of memory cells MC1 may include a plurality of bottom electrodes BE1. Each of the plurality of bottom electrodes BE1 may extend long (e.g., have a longitudinal axis extending) in a first horizontal direction (e.g., an X direction) on the first conductive line 110 and may have a variable thickness in the first horizontal direction (e.g., the X direction). One first conductive line 110 selected from among the plurality of first conductive lines 110 and one bottom electrode BE1 overlapping the one first conductive line 110 in a vertical direction (e.g., a Z direction) may configure one lower conductive line LC1.

Memory cells MC1 of one group arranged in one row in the first horizontal direction (e.g., the X direction) above one first conductive line 110 among the plurality of memory cells MC1 may share one bottom electrode BE1 selected from among the plurality of bottom electrodes BE1.

The plurality of bottom electrodes BE1 may each include a bottom surface BS1 (see FIG. 5B) contacting the first conductive line 110 and a top surface TS1 having a concave-convex shape. As used herein, a concave-convex shape refers to a shape in which the top surface TS1 alternately extends outward and inward, such as in a toothed shape. The top surface TS1 of each of the plurality of bottom electrodes BE1 may include a protrusion surface PS1 and a recess surface RS1 disposed at a level which is lower than the protrusion surface PS1 thereof. The term "level" described herein may denote a distance based on the vertical direction (e.g., the Z direction or a −Z direction) from a top surface of the substrate 102. The recess surface RS1 of each of the plurality of bottom electrodes BE1 may be closer to the substrate 102 than the protrusion surface PS1 thereof. In each of the plurality of bottom electrodes BE1, a thickness of a portion thereof including the protrusion surface PS1 thereof in the vertical direction (e.g., the Z direction) may be greater than a thickness of a portion thereof including the recess surface RS1 thereof in the vertical direction (e.g., the Z direction). With respect to the second horizontal direction (e.g., the Y direction), a width of each bottom electrode BE1 may be the same as or similar to that of each first conductive line 110.

The plurality of memory cells MC1 may each include a selection device 124, a middle electrode ME, a lower barrier 132, a resistive memory pattern 140, an upper barrier 134, and a top electrode TE, which are sequentially stacked on a corresponding bottom electrode BE1.

Each of the bottom electrodes BE1 may extend long (e.g., have a longitudinal axis extending) in the first horizontal direction (e.g., the X direction) between a corresponding first conductive line 110 and the selection device 124. The protrusion surface PS1 of the top surface TS1 of each bottom electrode BE1 may face a bottom surface of the selection device 124. The protrusion surface PS1 may contact the bottom surface of the selection device 124. The recess surface RS1 of the top surface TS1 of each bottom electrode BE1 may be disposed at a level, which is lower than the bottom surface of the selection device 124, at a periphery of the selection device 124. The recess surface RS1 of each bottom electrode BE1 may not include a portion overlapping the selection device 124 in the vertical direction (e.g., the Z direction). The recess surface RS1 of each bottom electrode BE1 may contact a bottom surface of the encapsulation liner 163 included in the upper insulation structure 167.

A space between two adjacent memory cells MC1 of the plurality of memory cells MC1 may be filled with the upper insulation structure 167 including the encapsulation liner 163 and the gap-fill insulation layer 165. It will be understood that "an element A fills an element B" (or similar language) as used herein means that the element A is in the element B but does not necessarily mean that the element A fills the element B entirely. The encapsulation liner 163 may contact the recess surface RS1 and may not contact the protrusion surface PS1 in the top surface TS1 of each bottom electrode BE1. The bottom surface of the encapsulation liner 163 may contact a top surface of the lower insulation line 112. A level of an interface INF between the top surface of the lower insulation line 112 and the bottom surface of the encapsulation liner 163 may be higher than a level of an uppermost surface of the first conductive line 110, or may be equal to or lower than a level of an uppermost surface of the bottom electrode BE1. A vertical level of a lowermost surface of the upper insulation structure 167 may be higher than a vertical level of the uppermost surface of the first conductive line 110. The encapsulation liner 163 may be apart from (e.g., separated from) the first conductive line 110 in the vertical direction (e.g., the Z direction).

In some embodiments, each of the lower insulation line 112, the encapsulation liner 163, and the gap-fill insulation layer 165 may include silicon oxide, silicon nitride, or a combination thereof. In some embodiments, the gap-fill insulation layer 165 may include a seam or an air gap. Herein, the term "air" may denote other gases which are in air or in a manufacturing process. For example, the lower insulation line 112 may include silicon nitride, the encapsulation liner 163 may include silicon oxide, silicon nitride, or a combination thereof, and the gap-fill insulation layer 165 may include silicon oxide.

In each of the plurality of memory cells MC1, each of the bottom electrode BE1, the middle electrode ME, and the top electrode TE may include a conductive material, and for example, may include W, Ti, Ta, Al, Cu, C, CN, TiN, TiAlN, TiSiN, TiCN, TiCSiN, WN, CoSiN, WSiN, TaN, TaCN, TaSiN, or a combination thereof, but is not limited thereto.

In the plurality of memory cells MC1, the selection device 124 may include a chalcogenide switching material having an amorphous state. The selection device 124 may include a material layer where a resistance thereof varies based on a level of a voltage applied to both ends of the selection device 124. For example, the selection device 124 may include an ovonic threshold switching (OTS) material. The OTS material may include a chalcogenide switching material. In some embodiments, the selection device 124 may include a single layer or a multi layer including a material from among two-component materials such as GeSe, GeS, AsSe, AsTe, AsS, SiTe, SiSe, SiS, GeAs, SiAs, SnSe, and SnTe, three-component materials such as GeAsTe, GeAsSe, AlAsTe, AlAsSe, SiAsSe, SiAsTe, GeSeTe, GeSeSb, GaAsSe, GaAsTe, InAsSe, InAsTe, SnAsSe, and SnAsTe, four-component materials such as GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, and GeAsTeZn, five-component materials such as GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, and GeAsSeZnSn, and six-component materials such as GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeS-GaTl, GeAsSeSGaZn, and GeAsSeSGaSn, GeAsSeSAlSn.

In some embodiments, the selection device 124 may include at least one material selected from among the two- to six-component materials described above as materials of the selection device 124, and at least one additional element selected from among boron (B), carbon (C), nitrogen (N), and oxygen (O).

The resistive memory pattern 140 may include a phase change material which is reversibly changed between an amorphous state and a crystalline state on the basis of a heating time. For example, a phase of the resistive memory pattern 140 may include a material where a phase thereof is reversibly changed by Joule's heat, occurring due to a voltage applied to both ends of the resistive memory pattern 140, and a resistance thereof varies based on the phase change. In some embodiments, the resistive memory pattern 140 may include a chalcogenide material as a phase change material. In some embodiments, the resistive memory pattern 140 may include a single layer or a multilayer including a material from among two-component materials such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb, three-component materials such as GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS, four-component materials such as GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeSn, GeSbSeGa, GeSbSeAl, GeSbSeTl, GeSbSeSn, GeSbSeZn, GeSbTeSn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS, and five-component materials such as InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeSTl, GeSbSeSZn, GeSbSeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSbSeZnSn.

In other embodiments, the resistive memory pattern 140 may include at least one material selected from among the two- to five-component materials described above as materials of the resistive memory pattern 140, and at least one additional element selected from among B, C, N, O, P, Cd, W, Ti, Hf, and Zr.

A bottom surface of the resistive memory pattern 140 may contact the lower barrier 132, and a top surface of the resistive memory pattern 140 may contact the upper barrier 134. Each of the lower barrier 132 and the upper barrier 134 may include a conductive material, and for example, may include W, WN, WC, or a combination thereof, but is not limited thereto.

With respect to the first horizontal direction (e.g., the X direction) and the second horizontal direction (e.g., the Y direction), a width of the resistive memory pattern 140 may be less than that of each of the bottom electrode BE1, the selection device 124, and/or the middle electrode ME.

The resistive memory device 100 may further include a first insulation liner 161A and a second insulation liner 161B, which are on and, in some embodiments, cover a sidewall of the resistive memory pattern 140. The first insulation liner 161A may contact the sidewall of the resistive memory pattern 140. A bottom surface of the first insulation liner 161A may contact a top surface of the lower barrier 132. The second insulation liner 161B may be on and, in some embodiments, cover the sidewall of the resistive memory pattern 140 with the first insulation liner 161A therebetween. A bottom surface of the second insulation liner 161B may contact a top surface of the middle electrode ME.

In some embodiments, each of the first insulation liner 161A and the second insulation liner 161B may include silicon oxide, silicon nitride, or a combination thereof. The first insulation liner 161A and the second insulation liner 161B may include different insulating materials. For example, the first insulation liner 161A may include silicon oxide, and the second insulation liner 161B may include silicon nitride. However, the inventive concepts are not limited thereto.

In each of the plurality of memory cells MC1, a sidewall of each of the bottom electrode BE1, the selection device 124, and the middle electrode ME may contact the encapsulation liner 163. The encapsulation liner 163 may be horizontally apart from the lower barrier 132 with the second insulation liner 161B therebetween. The encapsulation liner 163 may be horizontally apart from the resistive memory pattern 140, the upper barrier 134, and the top electrode TE with the first insulation liner 161A and the second insulation liner 161B therebetween.

In FIGS. 5A and 5B, it is illustrated that sidewalls of the bottom electrode BE1, the selection device 124, the middle electrode ME, the lower barrier 132, the resistive memory pattern 140, the upper barrier 134, and the top electrode TE extend in parallel to the vertical direction (e.g., the Z direction), but the inventive concepts are not limited thereto. For example, each of the sidewalls of the bottom electrode BE1, the selection device 124, the middle electrode ME, the lower barrier 132, the resistive memory pattern 140, the upper barrier 134, and the top electrode TE may include an inclined tapered sidewall.

In the resistive memory device 100 described above with reference to FIGS. 4, 5A, and 5B, the bottom electrode BE1 configuring the plurality of memory cells MC1 may have a structure which extends long (e.g., has a longitudinal axis extending) in the first horizontal direction (e.g., the X direction) along with the first conductive line 110, and memory cells MC1 of one group arranged in one row in the first horizontal direction (e.g., the X direction) among the plurality of memory cells MC1 may be implemented to have a structure which shares one bottom electrode BE1. Therefore, a state where the first conductive line 110 is on and/or covered by the bottom electrode BE1 may be maintained while the plurality of memory cells MC1 are being formed in a manufacturing process of the resistive memory device 100, and thus, a process margin may be secured to be equal to a height of the plurality of bottom electrodes BE1 in the vertical direction (e.g., the Z direction) and the first conductive line 110 may not be exposed to a chemical material (for example, a cleaning solution) even after the plurality of memory cells MC1 are formed. Therefore, a defect such as a dented surface or a non-uniform thickness of each of the plurality of first conductive lines 110 may not occur and/or may be reduced, and in the manufacturing process of the resistive memory device 100, metal or metal-containing impurities caused by materials of the plurality of first conductive lines 110 may be prevented and/or hindered from being deposited on the sidewalls of the memory cells MC1. Therefore, the reliability of the resistive memory device 100 may be enhanced.

Figure 6:
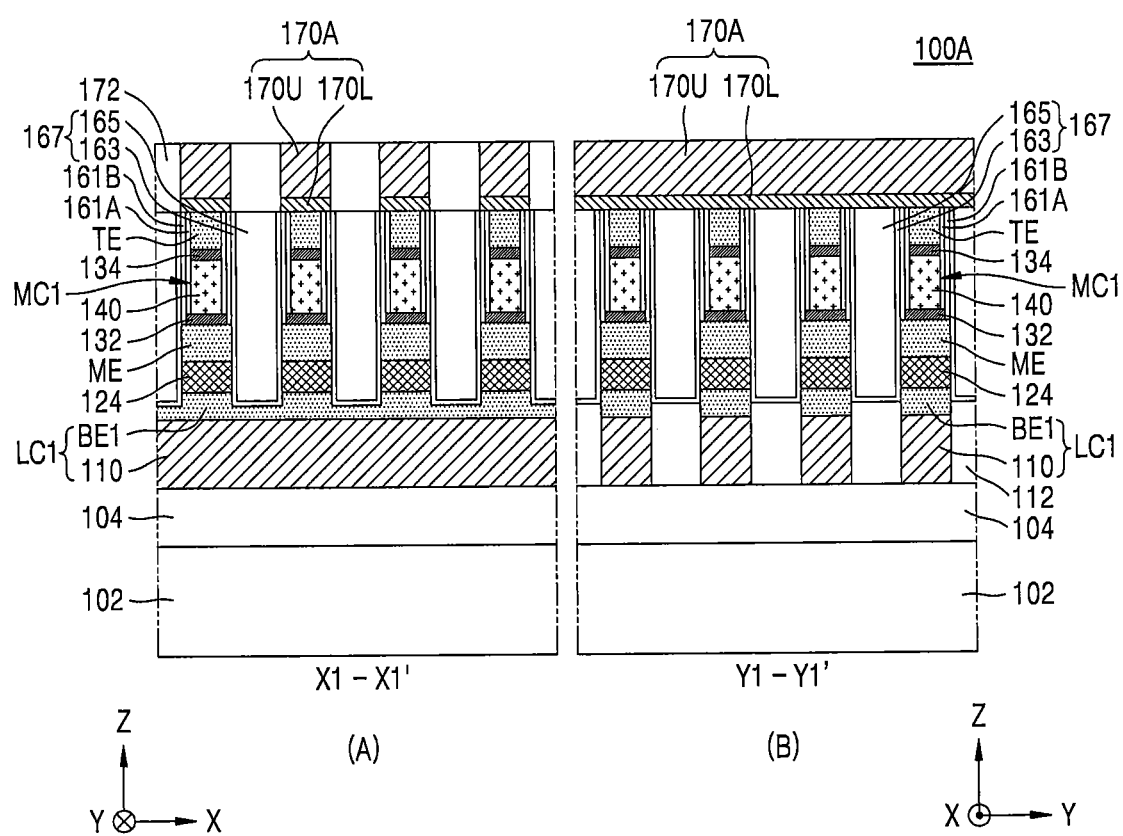
FIG. 6 is a cross-sectional view for describing a resistive memory device according to some embodiments of the inventive concepts.

FIG. 6 is a cross-sectional view for describing a resistive memory device 100A according to some embodiments of the inventive concepts. In FIG. 6, the same reference numerals as FIGS. 5A and 5B refer to like elements, and their repetitive descriptions are omitted.

Referring to FIG. 6, the resistive memory device 100A may include substantially the same elements as those of the resistive memory device 100 described above with reference to FIGS. 4, 5A, and 5B. The resistive memory device 100A may include a plurality of second conductive lines 170A, instead of the plurality of second conductive lines 170.

The plurality of second conductive lines 170A may include substantially the same elements as those of the plurality of second conductive lines 170 described above with reference to FIGS. 4, 5A, and 5B. Each of the plurality of second conductive lines 170A may include a multilayer which includes a lower second conductive line 170L and an upper second conductive line 170U. The lower second conductive line 170L and the upper second conductive line 170U may include different conductive materials. In some embodiments, the lower second conductive line 170L may include a conductive metal nitride layer, and the upper second conductive line 170U may include a metal layer. For example, the lower second conductive line 170L may include a TiN layer, and the upper second conductive line 170U may include W.

Figure 7:
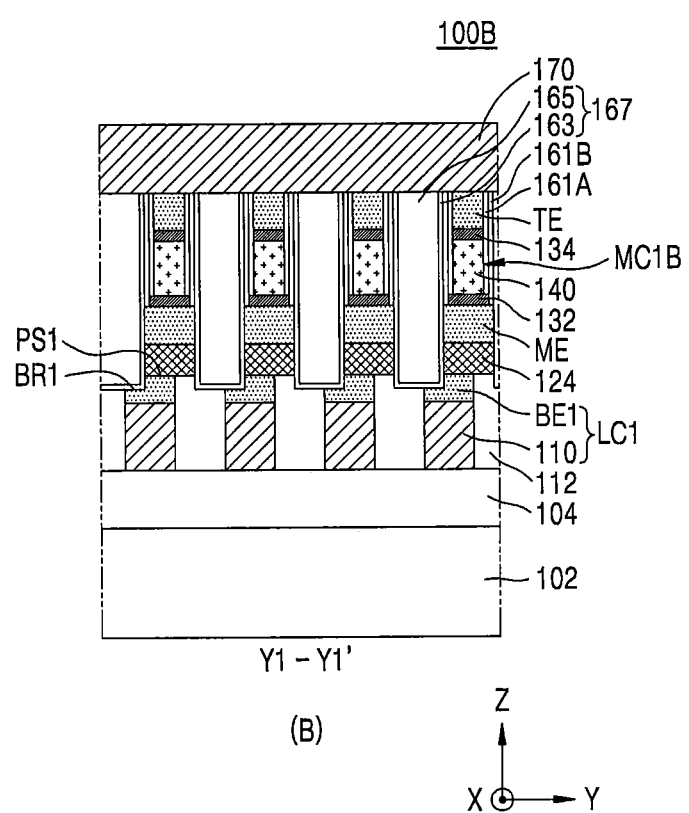
FIG. 7 is a cross-sectional view for describing a resistive memory device according to some embodiments of the inventive concepts.

FIG. 7 is a cross-sectional view for describing a resistive memory device 100B according to some embodiments of the inventive concepts. FIG. 7 illustrates some elements of a portion corresponding to a cross-sectional surface taken along line Y1-Y1' of FIG. 4. In FIG. 7, the same reference numerals as FIGS. 5A and 5B refer to like elements, and their repetitive descriptions are omitted.

Referring to FIG. 7, the resistive memory device 100B may include substantially the same elements as those of the resistive memory device 100 described above with reference to FIGS. 4, 5A, and 5B. The resistive memory device 100B may include a plurality of memory cells MC1B, instead of the plurality of memory cells MC1. In the plurality of memory cells MC1B, a stack structure including a selection device 124, a middle electrode ME, a lower barrier 132, a resistive memory pattern 140, an upper barrier 134, and a top electrode TE may have a structure which is offset in a horizontal direction (for example, the second horizontal direction, e.g., the Y direction) from a bottom electrode BE1. Therefore, the bottom electrode BE1 may include an offset recess portion BR1 which does not overlap the stack structure included in each of the plurality of memory cells MC1B in the vertical direction (e.g., the Z direction) and is covered by an upper insulation structure 167. A thickness of a portion, including the offset recess portion BR1, of the bottom electrode BE1 in the vertical direction (e.g., the Z direction) may be less than that of a portion, including a protrusion surface PS1, of the bottom electrode BE1 in the vertical direction (e.g., the Z direction).

In the plurality of memory cells MC1B, when the stack structure on the bottom electrode BE1 is offset in a horizontal direction from the bottom electrode BE1 and thus a thickness of a portion, including the offset recess portion BR1, of the bottom electrode BE1 in the vertical direction (e.g., the Z direction) is relatively small, before an upper insulation structure 167 is formed after the plurality of memory cells MC1B are formed in a manufacturing process of the resistive memory device 100B, the portion, including the offset recess portion BR1, of the bottom electrode BE1 may maintain a sufficient thickness for protecting a plurality of first conductive lines 110 so that the plurality of first conductive lines 110 are not exposed to a cleaning process and/or the like. Therefore, a problem may be solved and/or reduced where metal or metal-containing impurities caused by the plurality of first conductive lines 110 is/are deposited on sidewalls of the memory cells MC1B before the upper insulation structure 167 is formed after the plurality of memory cells MC1B are formed in the manufacturing process of the resistive memory device 100B, or a problem caused by a non-uniform thickness of each of the plurality of first conductive lines 110 may be solved and/or reduced, thereby enhancing the reliability of the resistive memory device 100B.

Figure 8A:
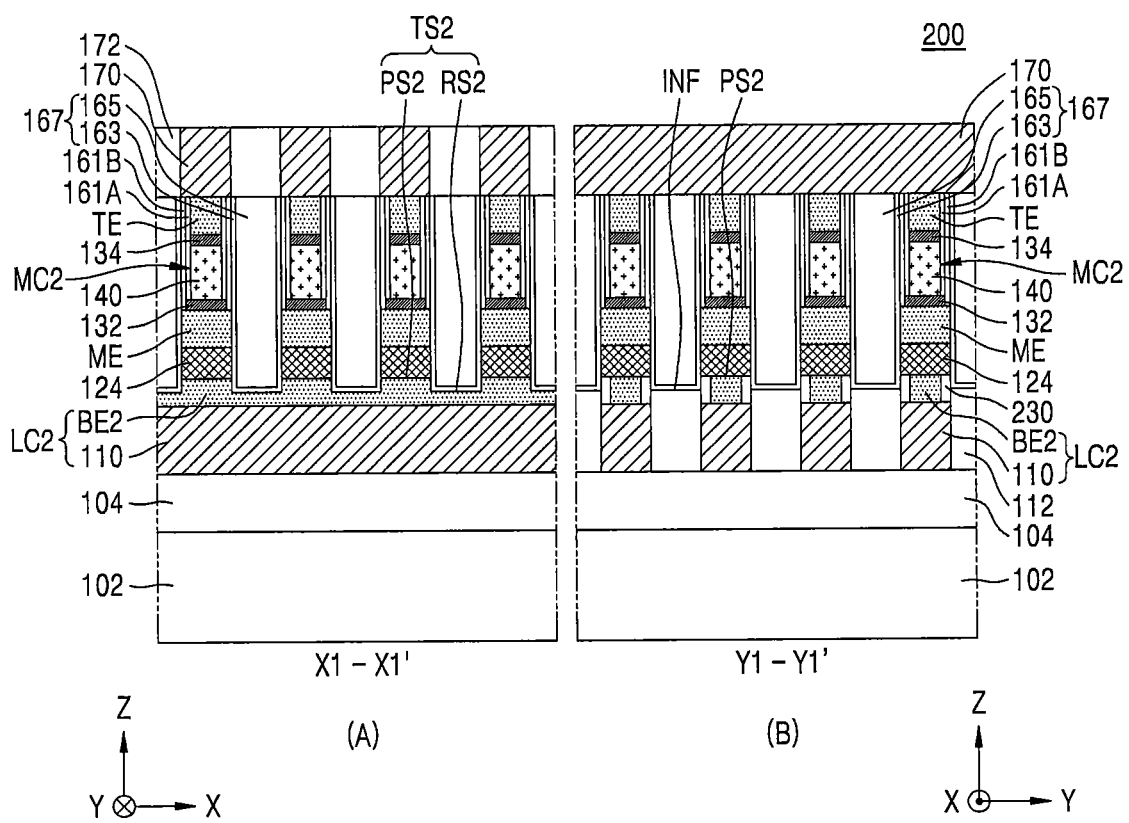
FIGS. 8A and 8B are diagrams for describing a resistive memory device according to some embodiments of the inventive concepts, in which region (A) of FIG. 8A is a cross-sectional view of some elements of a portion corresponding to a cross-sectional surface taken along line X1-X1' of FIG. 4, region (B) of FIG. 8A is a cross-sectional view of some elements of a portion corresponding to a cross-sectional surface taken along line Y1-Y1' of FIG. 4.
Figure 8B:
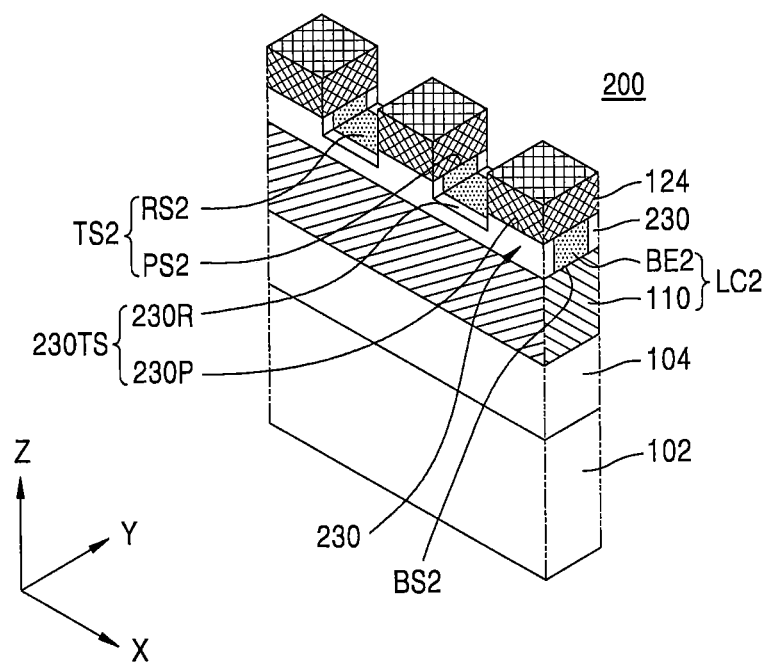

FIGS. 8A and 8B are diagrams for describing a resistive memory device 200 according to some embodiments of the inventive concepts, region (A) of FIG. 8A is a cross-sectional view of some elements of a portion corresponding to a cross-sectional surface taken along line X1-X1' of FIG. 4, region (B) of FIG. 8A is a cross-sectional view of some elements of a portion corresponding to a cross-sectional surface taken along line Y1-Y1' of FIG. 4, and FIG. 8B is a perspective view illustrating some elements of FIG. 8A. The resistive memory device 200 illustrated in FIGS. 8A and 8B may have an equivalent circuit configuration described above with reference to FIG. 3. In FIGS. 8A and 8B, the same reference numerals as FIGS. 5A and 5B refer to like elements, and their repetitive descriptions are omitted.

Referring to FIGS. 8A and 8B, the resistive memory device 200 may include substantially the same elements as those of the resistive memory device 100 described above with reference to FIGS. 4, 5A, and 5B. The resistive memory device 200 may include a plurality of memory cells MC2, instead of the plurality of memory cells MC1. The plurality of memory cells MC2 may include a plurality of bottom electrodes BE2 which extend long (e.g., have a longitudinal axis extending) in the first horizontal direction (e.g., the X direction) on a plurality of first conductive lines 110 and have a variable thickness in the first horizontal direction (e.g., the X direction). One first conductive line 110 selected from among the plurality of first conductive lines 110 and one bottom electrode BE2 overlapping the one first conductive line 110 in the vertical direction (e.g., the Z direction) may configure one lower conductive line LC2.

Memory cells MC2 of one group arranged in one row in the first horizontal direction (e.g., the X direction) above one first conductive line 110 among the plurality of memory cells MC2 may share one bottom electrode BE2 selected from among the plurality of bottom electrodes BE2. The plurality of bottom electrodes BE1 may each include a bottom surface BS2 (see FIG. 8B) contacting the first conductive line 110 and a top surface TS2 having a concave-convex shape. The top surface TS2 of each of the plurality of bottom electrodes BE2 may include a protrusion surface PS2 and a recess surface RS2 disposed at a level which is lower than the protrusion surface PS2 thereof. The recess surface RS2 of each of the plurality of bottom electrodes BE2 may be closer to a substrate 102 than the protrusion surface PS2 thereof. In each of the plurality of bottom electrodes BE2, a thickness of a portion thereof including the protrusion surface PS2 thereof in the vertical direction (e.g., the Z direction) may be greater than a thickness of a portion thereof including the recess surface RS2 thereof in the vertical direction (e.g., the Z direction). With respect to the second horizontal direction (e.g., the Y direction), a width of each bottom electrode BE2 may be less than that of each first conductive line 110.

The plurality of memory cells MC2 may each include a selection device 124, a middle electrode ME, a lower barrier 132, a resistive memory pattern 140, an upper barrier 134, and a top electrode TE, which are sequentially stacked on a corresponding bottom electrode BE2.

Each of the bottom electrodes BE2 may extend long (e.g., have a longitudinal axis extending) in the first horizontal direction (e.g., the X direction) between a corresponding first conductive line 110 and the selection device 124. The protrusion surface PS2 of the top surface TS2 of each bottom electrode BE1 may face a bottom surface of the selection device 124. The protrusion surface PS2 may contact the bottom surface of the selection device 124. The recess surface RS2 of the top surface TS2 of each bottom electrode BE2 may be disposed at a level, which is lower than the bottom surface of the selection device 124, at a periphery of the selection device 124. The recess surface RS2 of each bottom electrode BE2 may not include a portion overlapping the selection device 124 in the vertical direction (e.g., the Z direction). The recess surface RS2 of each bottom electrode BE2 may contact a bottom surface of an encapsulation liner 163 included in an upper insulation structure 167. A material of each of the plurality of bottom electrodes BE2 may be substantially the same as the material of each of the plurality of first bottom electrodes BE1 described above with reference to FIGS. 5A and 5B.

A space between two adjacent memory cells MC2 of the plurality of memory cells MC2 may be filled with the upper insulation structure 167 including the encapsulation liner 163 and a gap-fill insulation layer 165. The encapsulation liner 163 may contact the recess surface RS2 and may not contact the protrusion surface PS2 in the top surface TS2 of each bottom electrode BE2. The bottom surface of the encapsulation liner 163 may contact a top surface of a lower insulation line 112. A level of an interface INF between the top surface of the lower insulation line 112 and the bottom surface of the encapsulation liner 163 may be higher than a level of an uppermost surface of the first conductive line 110, or may be equal to or lower than a level of an uppermost surface of the bottom electrode BE2.

The resistive memory device 200 may further include a plurality of insulation spacers 230 which are on and/or cover a sidewall of each of the plurality of bottom electrodes BE2. Each of the plurality of insulation spacers 230 may extend long (e.g., have a longitudinal axis extending) in the first horizontal direction (e.g., the X direction) between a corresponding first conductive line 110 and the selection device 124. Each of the plurality of insulation spacers 230 may include a bottom surface, facing a top surface of a corresponding first conductive line 110, and a top surface facing a bottom surface of the selection device 124.

Each of the plurality of insulation spacers 230 may have a variable thickness in the first horizontal direction (e.g., the X direction). Each of the plurality of insulation spacers 230 may include a top surface 230TS having a concave-convex shape. The top surface 230 TS of each of the plurality of insulation spacers 230 may include a plurality of protrusion surfaces 230P, which are covered by the selection device 124, and a plurality of recess surfaces 230R which are disposed at a periphery of the selection device 124 and are at a level which is lower than the plurality of protrusion surfaces 230P. A thickness of each of the plurality of insulation spacers 230 in the vertical direction (e.g., the Z direction) may vary in the first horizontal direction (e.g., the X direction). In the plurality of insulation spacers 230, a thickness of a portion thereof including the protrusion surface 230P in the vertical direction (e.g., the Z direction) may be greater than a thickness of a portion thereof including the recess surface 230R thereof in the vertical direction (e.g., the Z direction). The protrusion surface 230P of the top surface 230TS of the insulation spacer 230 may face a bottom surface of the selection device 124. The protrusion surface 230P of the top surface 230TS of the insulation spacer 230 may contact the bottom surface of the selection device 124. The recess surface 230R of the top surface 230TS of the insulation spacer 230 may not include a portion overlapping the selection device 124 in the vertical direction (e.g., the Z direction). The recess surface 230R of the top surface 230TS of the insulation spacer 230 may contact a bottom surface of the encapsulation liner 163 included in the upper insulation structure 167.

In the resistive memory device 200 described above with reference to FIGS. 8A, and 8B, the bottom electrode BE2 configuring the plurality of memory cells MC2 and a pair of insulation spacers 230 covering both sidewalls of the bottom electrode BE2 may have a structure which extends long (e.g., has a longitudinal axis extending) in the first horizontal direction (e.g., the X direction) along with the first conductive line 110, and memory cells MC2 of one group arranged in one row in the first horizontal direction (e.g., the X direction) among the plurality of memory cells MC2 may share one bottom electrode BE2. Therefore, a state where the first conductive line 110 is covered by the bottom electrode BE2 and a pair of insulation spacers 230 may be maintained in a manufacturing process of the resistive memory device 200, and thus, a process margin may be secured to be equal to a height of the bottom electrode BE2 and the pair of insulation spacers 230 and the first conductive line 110 may not be exposed to a chemical material (for example, a cleaning solution) even after the plurality of memory cells MC2 are formed. Therefore, a defect such as a dented surface or a non-uniform thickness of each of the plurality of first conductive lines 110 may not occur and/or may be reduced, and in the manufacturing process of the resistive memory device 200, metal or metal-containing impurities caused by materials of the plurality of first conductive lines 110 may be prevented and/or hindered from being deposited on the sidewalls of the memory cells MC2. Therefore, the reliability of the resistive memory device 200 may be enhanced.

Figure 9A:
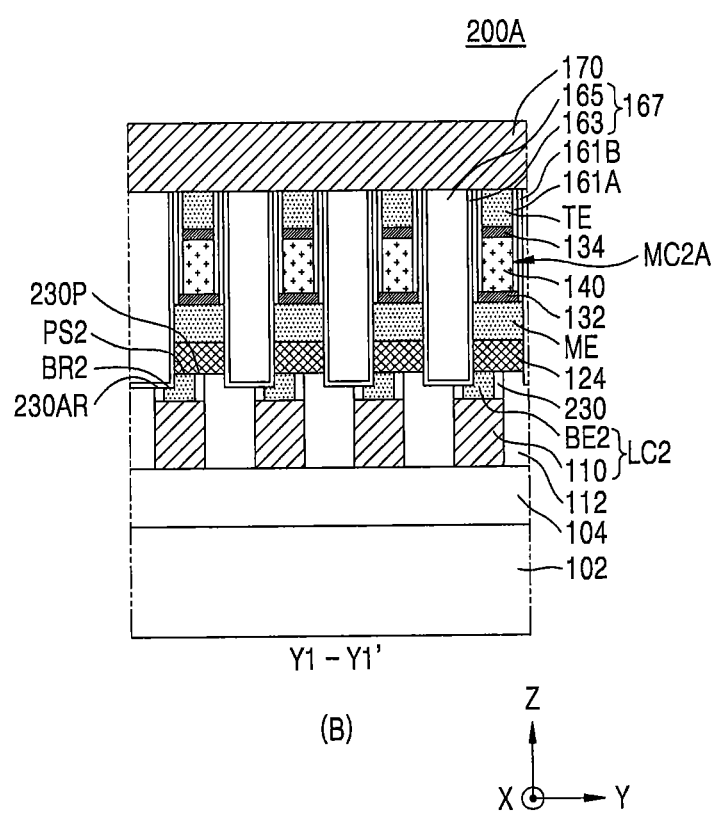
FIGS. 9A to 9C are cross-sectional views for describing a resistive memory device according to some embodiments of the inventive concepts.

FIG. 9A is a cross-sectional view for describing a resistive memory device 200A according to some embodiments of the inventive concepts. FIG. 9A illustrates some elements of a portion corresponding to a cross-sectional surface taken along line Y1-Y1' of FIG. 4. In FIG. 9A, the same reference numerals as FIGS. 8A and 8B refer to like elements, and their repetitive descriptions are omitted.

Referring to FIG. 9A, the resistive memory device 200A may include substantially the same elements as those of the resistive memory device 200 described above with reference to FIGS. 8A and 8B. The resistive memory device 200A may include a plurality of memory cells MC2A, instead of the plurality of memory cells MC2. In the plurality of memory cells MC2A, a stack structure including a selection device 124, a middle electrode ME, a lower barrier 132, a resistive memory pattern 140, an upper barrier 134, and a top electrode TE may have a structure which is offset in a horizontal direction (for example, the second horizontal direction (e.g., the Y direction) from a bottom electrode BE2. Therefore, the bottom electrode BE2 may include an offset recess portion BR2 which does not overlap the stack structure included in each of the plurality of memory cells MC2A in the vertical direction (e.g., the Z direction) and is covered by an upper insulation structure 167. A thickness of a portion, including the offset recess portion BR2, of the bottom electrode BE2 in the vertical direction (e.g., the Z direction) may be less than that of a portion, including a protrusion surface PS2, of the bottom electrode BE2 in the vertical direction (e.g., the Z direction).

In the resistive memory device 200A, the insulation spacer 230 may include an insulation offset recess portion 230AR which does not overlap the stack structure included in each of the plurality of memory cells MC2A in the vertical direction (e.g., the Z direction) and is covered by an upper insulation structure 167. A thickness of a portion, including the insulation offset recess portion 230AR, of the insulation spacer 230 in the vertical direction (e.g., the Z direction) may be less than that of a portion, including a protrusion surface 230P, of the insulation spacer 230 in the vertical direction (e.g., the Z direction).

In the plurality of memory cells MC2A, even when the stack structure on the bottom electrode BE2 is offset in a horizontal direction from the bottom electrode BE2 and thus a thickness of each of a portion, including the offset recess portion BR2, of the bottom electrode BE2 and a portion, including the insulation offset recess portion 230AR, of the insulation spacer 230 in the vertical direction (e.g., the Z direction) is relatively small, before an upper insulation structure 167 is formed after the plurality of memory cells MC2A are formed in a manufacturing process of the resistive memory device 200A, each of the portion, including the offset recess portion BR2, of the bottom electrode BE2 and the portion, including the insulation offset recess portion 230AR, of the insulation spacer 230 may maintain a sufficient thickness for protecting a plurality of first conductive lines 110 so that the plurality of first conductive lines 110 are not exposed to a cleaning process and/or the like. Therefore, a problem may be solved and/or reduced where metal or metal-containing impurities caused by the plurality of first conductive lines 110 is/are deposited on sidewalls of the memory cells MC2A before the upper insulation structure 167 is formed after the plurality of memory cells MC2A are formed in the manufacturing process of the resistive memory device 200A, or a problem caused by a non-uniform thickness of each of the plurality of first conductive lines 110 may be solved and/or reduced, thereby enhancing the reliability of the resistive memory device 200A.

Figure 9B:
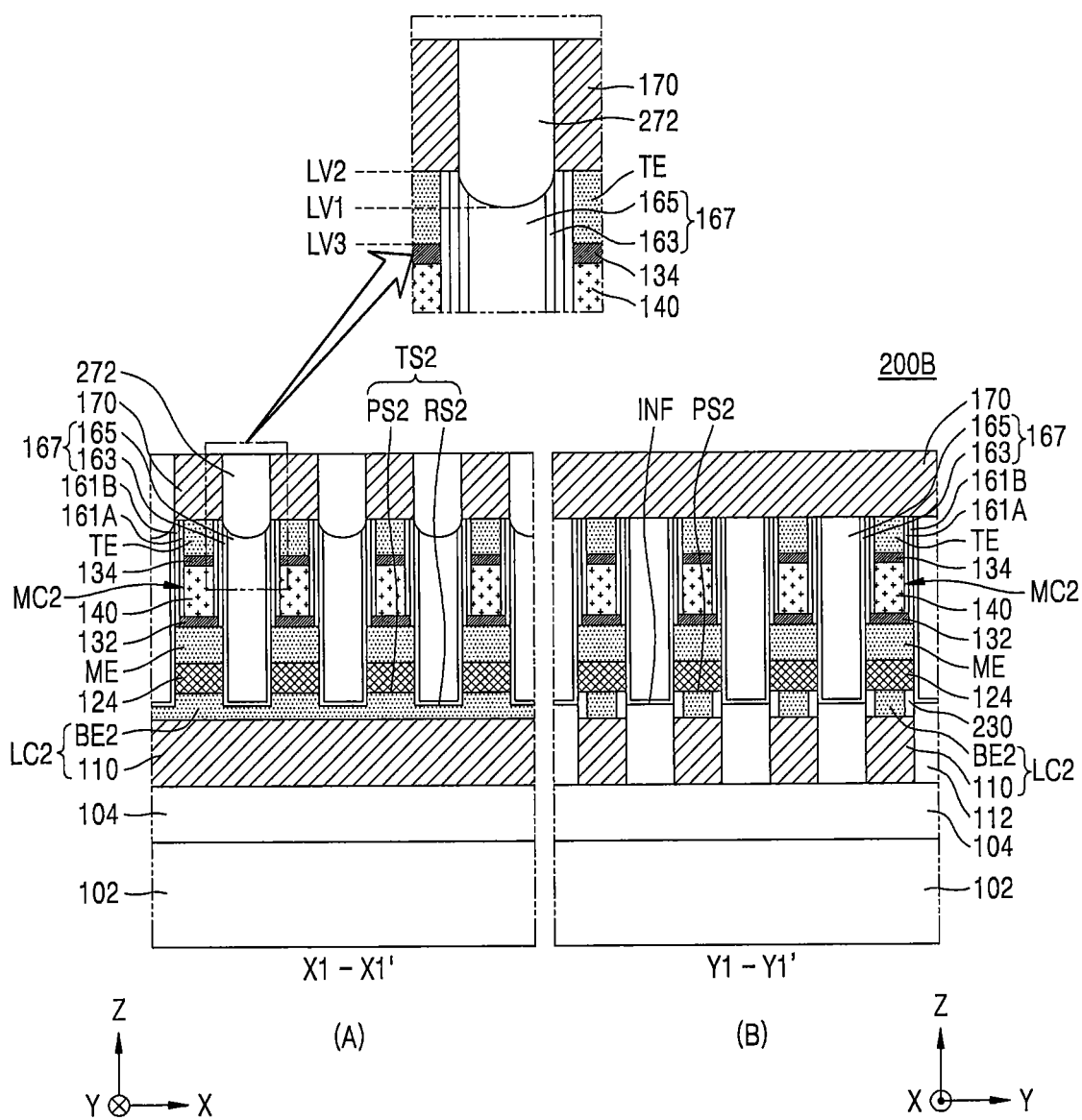

FIG. 9B is a cross-sectional view for describing a resistive memory device 200B according to some embodiments of the inventive concepts. In FIG. 9B, region (A) is a cross-sectional view of some elements of a portion corresponding to a cross-sectional surface taken along line X1-X1' of FIG. 4, and region (B) is a cross-sectional view of some elements of a portion corresponding to a cross-sectional surface taken along line Y1-Y1' of FIG. 4. In FIG. 9B, the same reference numerals as FIGS. 8A and 8B refer to like elements, and their repetitive descriptions are omitted.

Referring to FIG. 9B, the resistive memory device 200B may include substantially the same elements as those of the resistive memory device 200 described above with reference to FIGS. 8A and 8B. The resistive memory device 200B may include a plurality of second insulation lines 272, each disposed between two adjacent second conductive lines 170 of a plurality of second conductive lines 170. A level LV1 of a lowermost surface of each of the plurality of second insulation lines 272 may be lower than a level LV2 of a bottom surface of each of the plurality of second conductive lines 170 and may be higher than a level LV3 of a top surface of an upper barrier 134. A more detailed configuration of each of the plurality of second insulation lines 272 may be the same as that of each of the plurality of second insulation lines 172 described above with reference to FIGS. 5A and 5B.

Figure 9C:
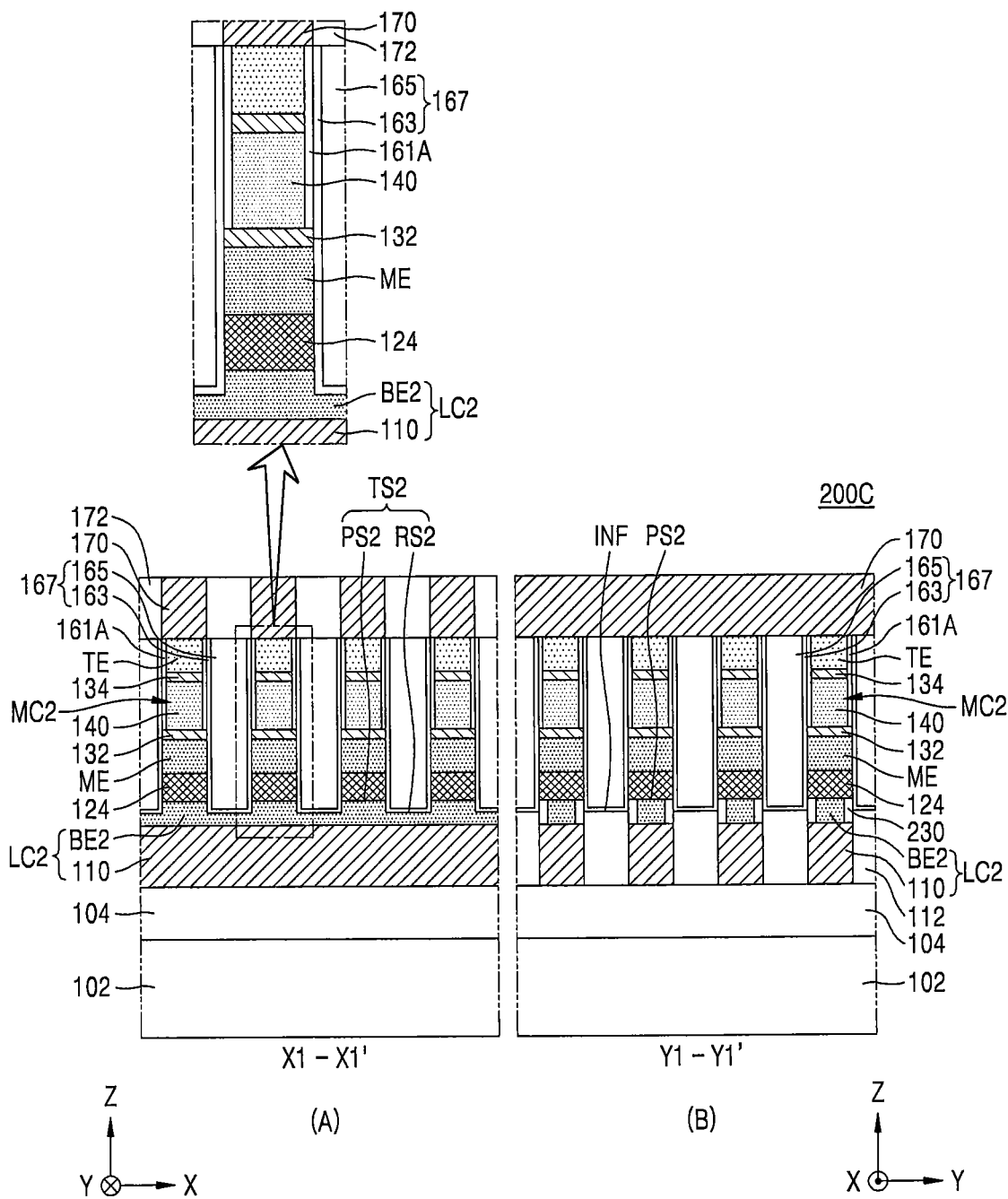

FIG. 9C is a cross-sectional view for describing a resistive memory device 200C according to some embodiments of the inventive concepts. Region (A) of FIG. 9C is a cross-sectional view of some elements of a portion corresponding to a cross-sectional surface taken along line X1-X1' of FIG. 4, and region (B) of FIG. 9C is a cross-sectional view of some elements of a portion corresponding to a cross-sectional surface taken along line Y1-Y1' of FIG. 4. In FIG. 9C, the same reference numerals as FIGS. 8A and 8B refer to like elements, and their repetitive descriptions are omitted.

Referring to FIG. 9C, the resistive memory device 200C may include substantially the same elements as those of the resistive memory device 200 described above with reference to FIGS. 8A and 8B. In the resistive memory device 200C, a first insulation liner 161A may be disposed between a sidewall of a resistive memory pattern 140 and an encapsulation liner 163. A more detailed configuration of the first insulation liner 161A may be the same as described above with reference to FIGS. 5A and 5B.

Figure 10A:
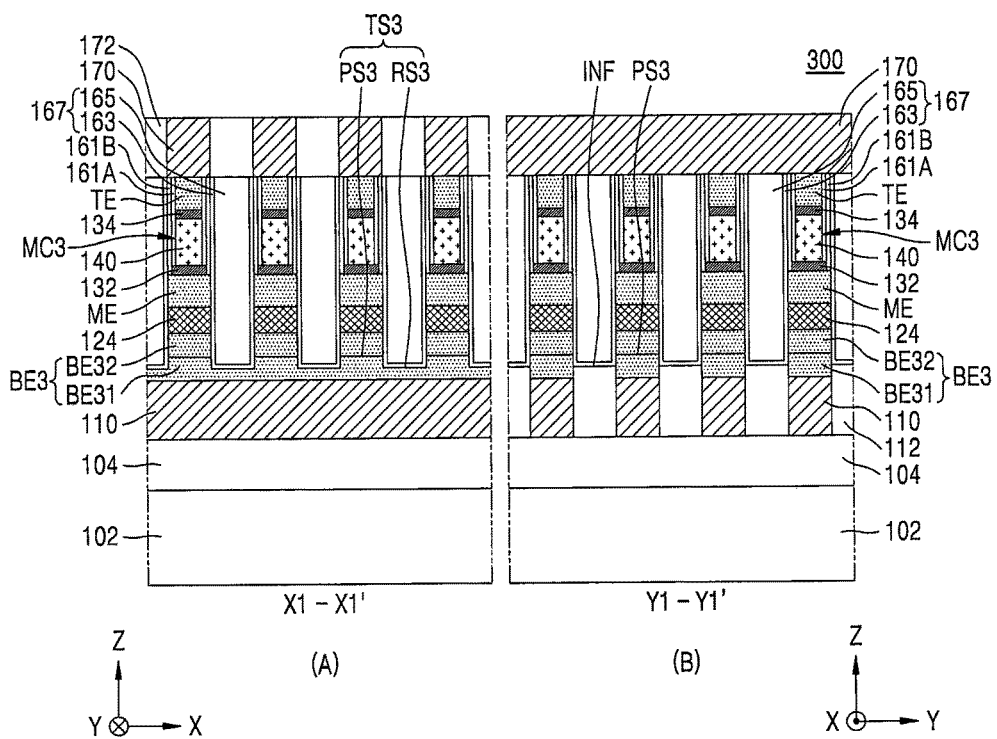
FIGS. 10A and 10B are diagrams for describing a resistive memory device according to some embodiments of the inventive concepts, in which region (A) of FIG. 10A is a cross-sectional view of some elements of a portion corresponding to a cross-sectional surface taken along line X1-X1' of FIG. 4, region (B) of FIG. 10A is a cross-sectional view of some elements of a portion corresponding to a cross-sectional surface taken along line Y1-Y1' of FIG. 4.
Figure 10B:
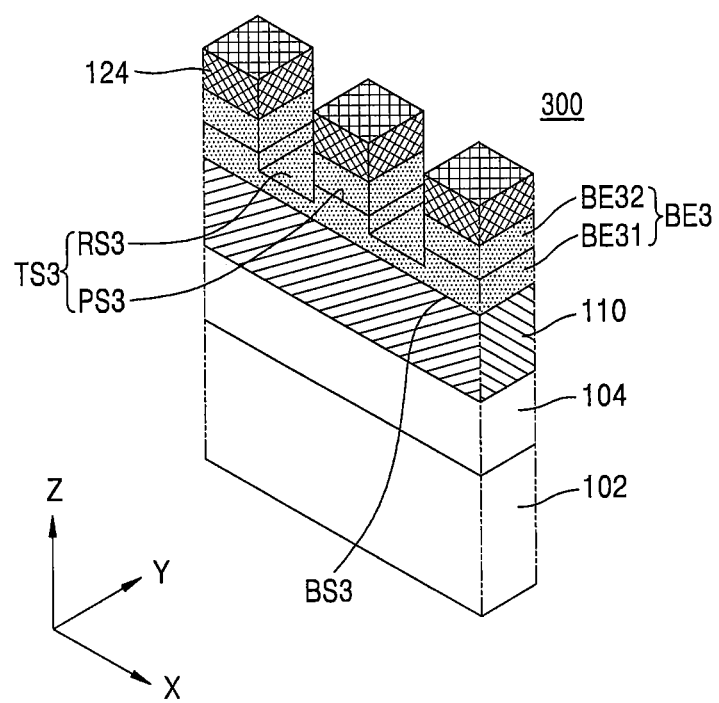

FIGS. 10A and 10B are diagrams for describing a resistive memory device 300 according to some embodiments of the inventive concepts, region (A) of FIG. 10A is a cross-sectional view of some elements of a portion corresponding to a cross-sectional surface taken along line X1-X1' of FIG. 4, region (B) of FIG. 10A is a cross-sectional view of some elements of a portion corresponding to a cross-sectional surface taken along line Y1-Y1' of FIG. 4, and FIG. 10B is a perspective view illustrating some elements of FIG. 10A. The resistive memory device 300 illustrated in FIGS. 10A and 10B may have an equivalent circuit configuration described above with reference to FIG. 3. In FIGS. 10A and 10B, the same reference numerals as FIGS. 5A and 5B refer to like elements, and their repetitive descriptions are omitted.

Referring to FIGS. 10A and 10B, the resistive memory device 300 may include substantially the same elements as those of the resistive memory device 100 described above with reference to FIGS. 4, 5A, and 5B. The resistive memory device 300 may include a plurality of memory cells MC3, instead of the plurality of memory cells MC1. The plurality of memory cells MC3 may include a plurality of bottom electrodes BE3. The plurality of bottom electrodes BE3 may include a plurality of lower bottom electrodes BE31 and a plurality of upper bottom electrodes BE32 disposed on the plurality of lower bottom electrodes BE31. A plurality of upper bottom electrodes BE32 may be disposed on one lower bottom electrode BE31. Memory cells MC3 of one group arranged in one row in a first horizontal direction (e.g., an X direction) among the plurality of memory cells MC3 may share one lower bottom electrode BE31. Each of the plurality of memory cells MC3 may include one upper bottom electrode BE32.

The plurality of lower bottom electrodes BE31 may extend long (e.g., have a longitudinal axis extending) in the first horizontal direction (e.g., the X direction) on the plurality of first conductive lines 110 and may each have a variable thickness in the first horizontal direction (e.g., the X direction). The plurality of lower bottom electrodes BE31 may each include a bottom surface BS3 contacting the first conductive line 110 and a top surface TS3 having a concave-convex shape. The top surface TS3 of each of the plurality of lower bottom electrodes BE31 may include a protrusion surface PS3 and a recess surface RS3 disposed at a level which is lower than the protrusion surface PS3 thereof. The recess surface RS3 of each of the plurality of lower bottom electrodes BE31 may be closer to a substrate 102 than the protrusion surface PS3 thereof. In each of the plurality of lower bottom electrodes BE31, a thickness of a portion thereof including the protrusion surface PS3 thereof in the vertical direction (e.g., the Z direction) may be greater than a thickness of a portion thereof including the recess surface RS3 thereof in the vertical direction (e.g., the Z direction).

The recess surface RS2 of each of the lower bottom electrodes BE31 may contact a bottom surface of an encapsulation liner 163 included in an upper insulation structure 167. In the second horizontal direction (e.g., the Y direction), a width of each of the lower bottom electrode BE31 and the upper bottom electrode BE32 may be the same as or similar to that of each of the first conductive lines 110.

One lower bottom electrode BE31 may include a plurality of protrusion surfaces PS3, and the plurality of protrusion surfaces PS3 included in one lower bottom electrode BE31 may face a selection device 124 of each of memory cells MC3 of one group arranged in one row in the first horizontal direction (e.g., the X direction) among the plurality of memory cells MC3. Each of the plurality of upper bottom electrodes BE32 may be disposed between a corresponding lower bottom electrode BE31 and the selection device 124. A plurality of upper bottom electrodes BE32 disposed on one lower bottom electrode BE31 may contact a plurality of protrusion surfaces PS3 of the one lower bottom electrode BE31.

The plurality of memory cells MC3 may each include the selection device 124, a middle electrode ME, a lower barrier 132, a resistive memory pattern 140, an upper barrier 134, and a top electrode TE, which are sequentially stacked on a corresponding upper bottom electrode BE32.

A space between two adjacent memory cells MC3 of the plurality of memory cells MC3 may be filled with the upper insulation structure 167 including the encapsulation liner 163 and a gap-fill insulation layer 165. The encapsulation liner 163 may contact the recess surface RS3 and may not contact the protrusion surface PS3 in the top surface TS3 of each of the lower bottom electrodes BE31. A bottom surface of the encapsulation liner 163 may contact a top surface of a lower insulation line 112. A level of an interface INF between the top surface of the lower insulation line 112 and the bottom surface of the encapsulation liner 163 may be higher than a level of an uppermost surface of the first conductive line 110, or may be equal to or lower than a level of an uppermost surface of the lower bottom electrode BE31. A material of each of the plurality of lower bottom electrodes BE31 and the plurality of upper bottom electrodes BE32 may be substantially the same as the material of each of the plurality of first bottom electrodes BE1 described above with reference to FIGS. 5A and 5B.

In the resistive memory device 300 described above with reference to FIGS. 10A and 10B, the lower bottom electrode BE31 configuring the plurality of memory cells MC3 may have a structure which extends long (e.g., has a longitudinal axis extending) in the first horizontal direction (e.g., the X direction) along with the first conductive line 110, and memory cells MC3 of one group arranged in one row in the first horizontal direction (e.g., the X direction) among the plurality of memory cells MC3 may be implemented to have a structure which shares one lower bottom electrode BE31.

Therefore, a state where the first conductive line 110 is on and/or covered by the lower bottom electrode BE31 may be maintained in a manufacturing process of the resistive memory device 300, and thus, a process margin may be secured to be equal to a height of the plurality of lower bottom electrodes BE31 and the plurality of upper bottom electrodes BE32 in the vertical direction (e.g., the Z direction) and the first conductive line 110 may not be exposed to a chemical material (for example, a cleaning solution) even after the plurality of memory cells MC3 are formed. Therefore, a defect such as a dented surface or a non-uniform thickness of each of the plurality of first conductive lines 110 may not occur and/or may be reduced, and in the manufacturing process of the resistive memory device 300, metal or metal-containing impurities caused by materials of the plurality of first conductive lines 110 may be prevented and/or hindered from being deposited on the sidewalls of the memory cells MC3. Therefore, the reliability of the resistive memory device 300 may be enhanced.

Figure 11A:
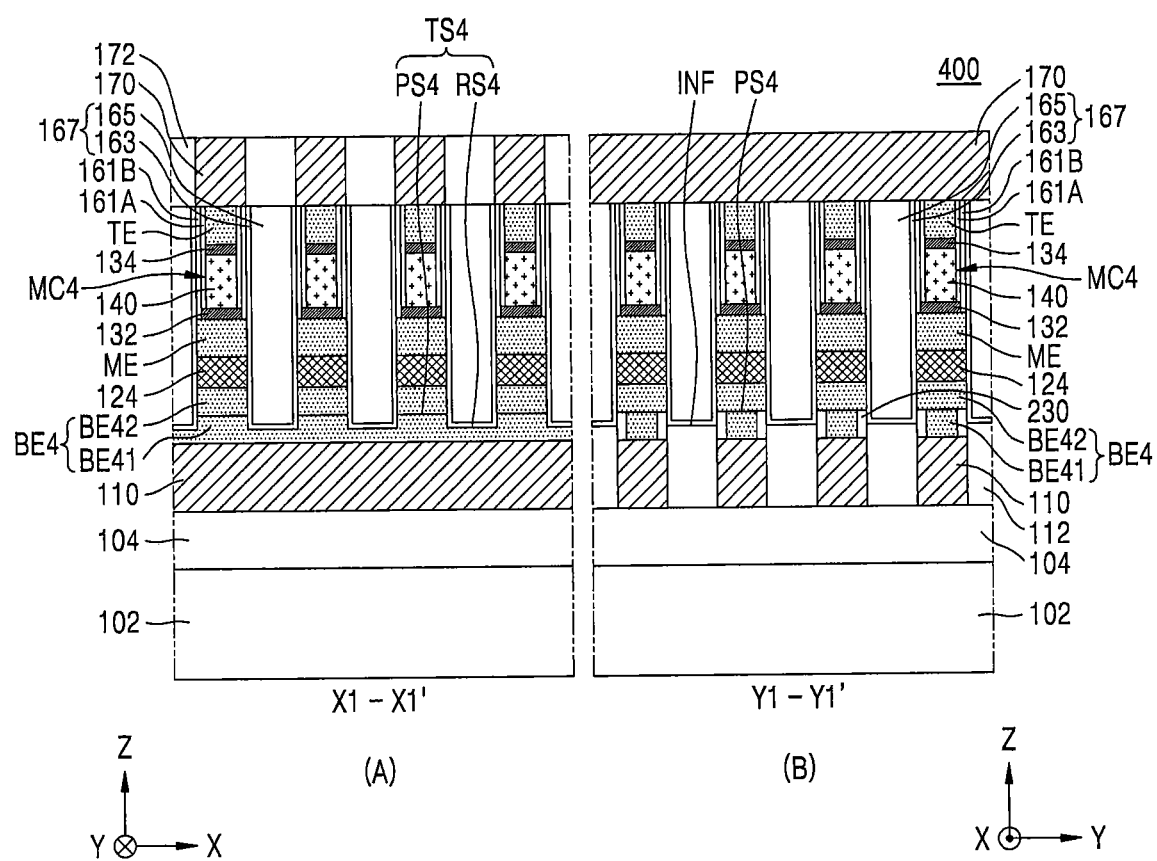
FIGS. 11A and 11B are diagrams for describing a resistive memory device according to some embodiments of the inventive concepts, in which region (A) of FIG. 11A is a cross-sectional view of some elements of a portion corresponding to a cross-sectional surface taken along line X1-X1' of FIG. 4, region (B) of FIG. 11A is a cross-sectional view of some elements of a portion corresponding to a cross-sectional surface taken along line Y1-Y1' of FIG. 4.
Figure 11B:
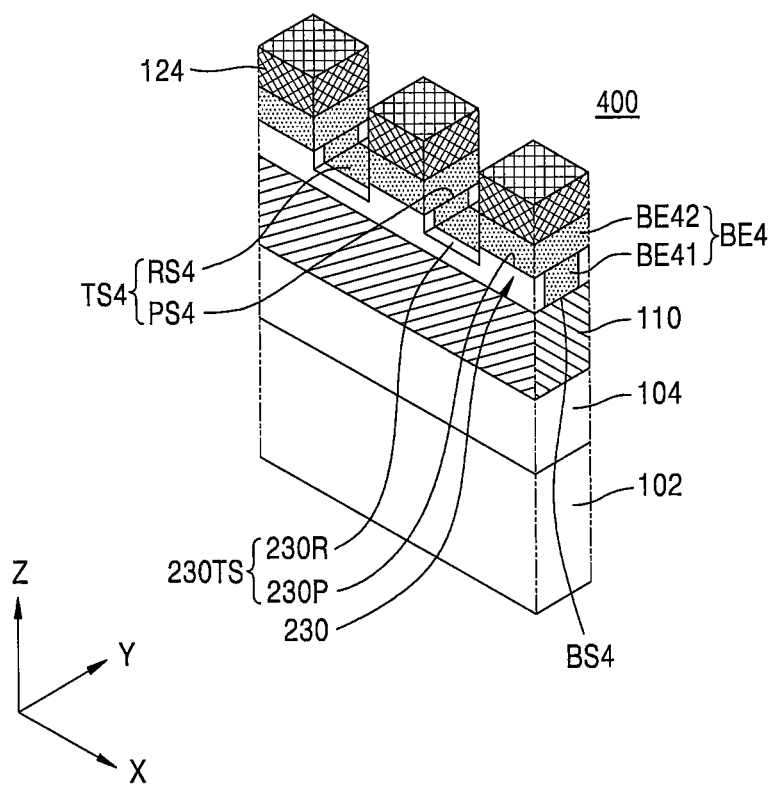

FIGS. 11A and 11B are diagrams for describing a resistive memory device 400 according to some embodiments of the inventive concepts, region (A) of FIG. 11A is a cross-sectional view of some elements of a portion corresponding to a cross-sectional surface taken along line X1-X1' of FIG. 4, region (B) of FIG. 11A is a cross-sectional view of some elements of a portion corresponding to a cross-sectional surface taken along line Y1-Y1' of FIG. 4, and FIG. 11B is a perspective view illustrating some elements of FIG. 11A. The resistive memory device 400 illustrated in FIGS. 11A and 11B may have an equivalent circuit configuration described above with reference to FIG. 3. In FIGS. 11A and 11B, the same reference numerals as FIGS. 5A to 10B refer to like elements, and their repetitive descriptions are omitted.

Referring to FIGS. 11A and 11B, the resistive memory device 400 may include substantially the same elements as those of the resistive memory device 200 described above with reference to FIGS. 8A and 8B. The resistive memory device 400 may include a plurality of memory cells MC4, instead of the plurality of memory cells MC2. The plurality of memory cells MC4 may include a plurality of bottom electrodes BE4. The plurality of bottom electrodes BE4 may include a plurality of lower bottom electrodes BE41 and a plurality of upper bottom electrodes BE42 disposed on the plurality of lower bottom electrodes BE41. A plurality of upper bottom electrodes BE42 may be disposed on one lower bottom electrode BE41. Memory cells MC4 of one group arranged in one row in the first horizontal direction (e.g., the X direction) among the plurality of memory cells MC4 may share one lower bottom electrode BE41. Each of the plurality of memory cells MC4 may include one upper bottom electrode BE42.

The plurality of lower bottom electrodes BE41 may extend long (e.g., have a longitudinal axis extending) in the first horizontal direction (e.g., the X direction) on a plurality of first conductive lines 110 and may each have a variable thickness in the first horizontal direction (e.g., the X direction). The plurality of lower bottom electrodes BE41 may each include a bottom surface BS4 contacting the first conductive line 110 and a top surface TS4 having a concave-convex shape. The top surface TS4 of each of the plurality of lower bottom electrodes BE41 may include a protrusion surface PS4 and a recess surface RS4 disposed at a level which is lower than the protrusion surface PS4 thereof. The recess surface RS4 of each of the plurality of lower bottom electrodes BE41 may be closer to a substrate 102 than the protrusion surface PS4 thereof. In each of the plurality of lower bottom electrodes BE41, a thickness of a portion thereof including the protrusion surface PS4 thereof in the vertical direction (e.g., the Z direction) may be greater than a thickness of a portion thereof including the recess surface RS4 thereof in the vertical direction (e.g., the Z direction).

The recess surface RS4 of each of the lower bottom electrodes BE41 may contact a bottom surface of an encapsulation liner 163 included in an upper insulation structure 167. With respect to the second horizontal direction (e.g., the Y direction), a width of each of the lower bottom electrodes BE41 may be less than that of each of the first conductive lines 110, and a width of each of the upper bottom electrodes BE42 may be the same as or similar to that of each of the first conductive lines 110.

One lower bottom electrode BE41 may include a plurality of protrusion surfaces PS4, and the plurality of protrusion surfaces PS4 included in one lower bottom electrode BE41 may face a selection device 124 of each of memory cells MC4 of one group arranged in one row in the first horizontal direction (e.g., the X direction) among the plurality of memory cells MC4. Each of the plurality of upper bottom electrodes BE42 may be disposed between a corresponding lower bottom electrode BE41 and the selection device 124. A plurality of upper bottom electrodes BE42 disposed on one lower bottom electrode BE41 may contact a plurality of protrusion surfaces PS4 of the one lower bottom electrode BE41.

The plurality of memory cells MC4 may each include the selection device 124, a middle electrode ME, a lower barrier 132, a resistive memory pattern 140, an upper barrier 134, and a top electrode TE, which are sequentially stacked on a corresponding upper bottom electrode BE42.

A space between two adjacent memory cells MC4 of the plurality of memory cells MC4 may be filled with the upper insulation structure 167 including the encapsulation liner 163 and a gap-fill insulation layer 165. The encapsulation liner 163 may contact the recess surface RS4 and may not contact the protrusion surface PS4 in the top surface TS4 of each of the lower bottom electrodes BE41. A bottom surface of the encapsulation liner 163 may contact a top surface of a lower insulation line 112. A level of an interface INF between the top surface of the lower insulation line 112 and the bottom surface of the encapsulation liner 163 may be higher than a level of an uppermost surface of the first conductive line 110, or may be equal to or lower than a level of an uppermost surface of the lower bottom electrode BE41. A material of each of the plurality of lower bottom electrodes BE41 and the plurality of upper bottom electrodes BE42 may be substantially the same as the material of each of the plurality of first bottom electrodes BE1 described above with reference to FIGS. 5A and 5B.

In the resistive memory device 400 described above with reference to FIGS. 11A and 11B, the lower bottom electrode BE41 configuring the plurality of memory cells MC4 and a pair of insulation spacers 230 on and/or covering both sidewalls of the lower bottom electrode BE41 may have a structure which extends long (e.g., has a longitudinal axis extending) in the first horizontal direction (e.g., the X direction) along with the first conductive line 110, and memory cells MC4 of one group arranged in one row in the first horizontal direction (e.g., the X direction) among the plurality of memory cells MC4 may share one lower bottom electrode BE41. Therefore, a state where the first conductive line 110 is on and/or covered by the lower bottom electrode BE41 and a pair of insulation spacers 230 may be maintained in a manufacturing process of the resistive memory device 400, and thus, a process margin may be secured to be equal to a height of the lower bottom electrode BE41 and the pair of insulation spacers 230 and the plurality of first conductive lines 110 may not be exposed to a chemical material (for example, a cleaning solution) even after the plurality of memory cells MC4 are formed. Therefore, a defect such as a dented surface or a non-uniform thickness of each of the plurality of first conductive lines 110 may not occur and/or may be reduced, and in the manufacturing process of the resistive memory device 400, metal or metal-containing impurities caused by materials of the plurality of first conductive lines 110 may be prevented and/or hindered from being deposited on the sidewalls of the memory cells MC4. Therefore, the reliability of the resistive memory device 400 may be enhanced.

Figure 12A:
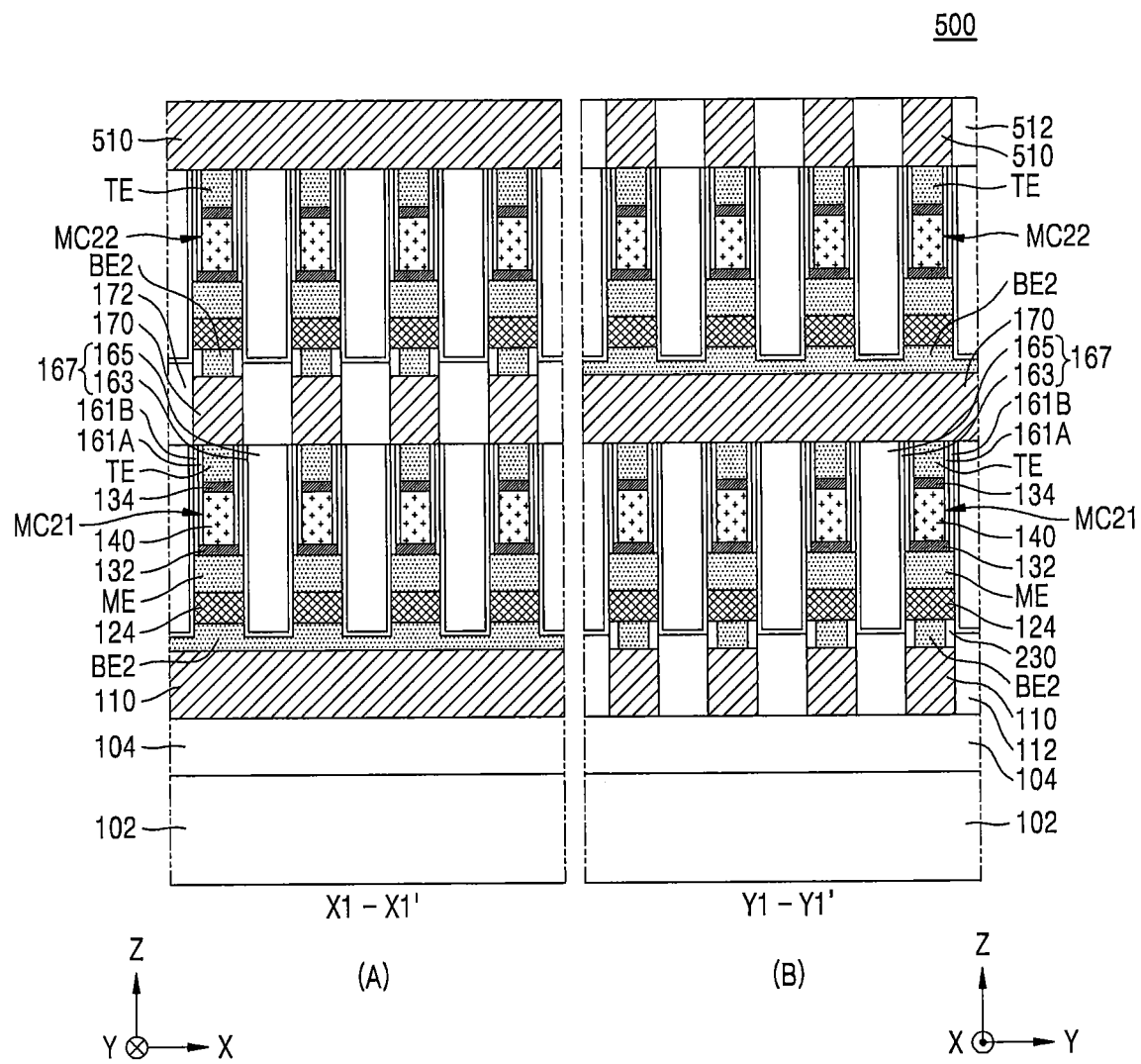
FIG. 12A is a cross-sectional view for describing a resistive memory device according to some embodiments of the inventive concepts.
Figure 12B:
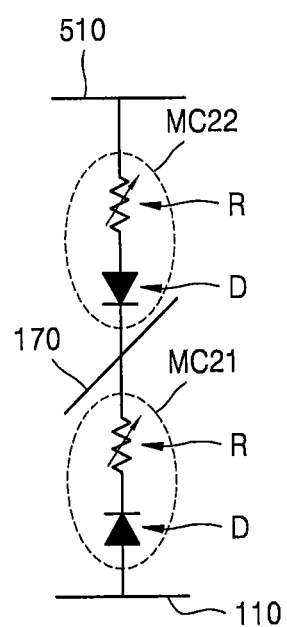
FIG. 12B is an equivalent circuit diagram of some memory cells included in the resistive memory device illustrated in FIG. 12A.

FIG. 12A is a cross-sectional view for describing a resistive memory device 500 according to some embodiments of the inventive concepts, and FIG. 12B is an equivalent circuit diagram of some memory cells included in the resistive memory device 500 illustrated in FIG. 12A. In FIGS. 12A and 12B, the same reference numerals as FIGS. 8A and 8B refer to like elements, and their repetitive descriptions are omitted.

Referring to FIGS. 12A and 12B, the resistive memory device 500 may include a plurality of first conductive lines 110 extending in parallel in a first horizontal direction (e.g., the X direction) on a substrate 102, a plurality of second conductive lines 170 extending in parallel in the second horizontal direction (e.g., the Y direction), and a plurality of third conductive lines 510 extending in parallel in the first horizontal direction (e.g., the X direction). A plurality of third insulation lines 512 may each be disposed between two adjacent third conductive lines 510 of the plurality of third conductive lines 510. The plurality of third insulation lines 512 may include, for example, silicon oxide, silicon nitride, or a combination thereof.

A plurality of first level memory cells MC21 may be respectively disposed at a plurality of intersection points between the plurality of first conductive lines 110 and the plurality of second conductive lines 170, and a plurality of second level memory cells MC22 may be respectively disposed at a plurality of intersection points between the plurality of second conductive lines 170 and the plurality of third conductive lines 510. The plurality of first level memory cells MC21 and the plurality of second level memory cells MC22 may be provided at different levels in the vertical direction (e.g., the Z direction). The plurality of first level memory cells MC21 and the plurality of second level memory cells MC22 may be substantially the same as the plurality of memory cells MC2 described above with reference to FIGS. 8A and 8B. In the plurality of first level memory cells MC21, first level memory cells MC21 of one group arranged in one row in the first horizontal direction (e.g., the X direction) above one first conductive line 110 among the plurality of first level memory cells MC21 may share one bottom electrode BE2 selected from among a plurality of bottom electrodes BE2. In the plurality of second level memory cells MC22, second level memory cells MC22 of one group arranged in one row in the first horizontal direction (e.g., the X direction) above one second conductive line 170 among the plurality of second level memory cells MC22 may share one bottom electrode BE2 selected from among a plurality of bottom electrodes BE2 provided on the one second conductive line 170. A top electrode TE of each of the plurality of second level memory cells MC22 may be connected to one third conductive line 510 selected from among the plurality of third conductive lines 510.

Each of the plurality of first conductive lines 110, the plurality of second conductive lines 170, and the plurality of third conductive lines 510 may configure a plurality of word lines or a plurality of bit lines. For example, each of the plurality of first conductive lines 110 and the plurality of third conductive lines 510 may configure a plurality of bit lines, and each of the plurality of second conductive lines 170 may configure a common word line. As another example, each of the plurality of first conductive lines 110 and the plurality of third conductive lines 510 may configure a plurality of word lines, and each of the plurality of second conductive lines 170 may configure a common bit line. A material of each of the plurality of third conductive lines 510 may be substantially the same as the material of each of the plurality of first conductive lines 110 and the plurality of second conductive lines 170 described above with reference to FIG. 5A.

The resistive memory device 500 may have a two-layer stack structure including the plurality of first level memory cells MC21 and the plurality of second level memory cells MC22 provided at two different levels in the vertical direction (e.g., the Z direction). In FIG. 12A, an example has been described where each of the plurality of first level memory cells MC21 and the plurality of second level memory cells MC22 has the same configuration as that of each of the plurality of memory cells MC2 described above with reference to FIGS. 8A and 8B, but the inventive concepts are not limited thereto. Each of the plurality of first level memory cells MC21 and the plurality of second level memory cells MC22 illustrated in FIG. 12A may be configured to have a structure of each of the resistive memory devices 100, 100A, 100B, 200, 200A, 300, and 400 illustrated in FIGS. 5A to 11B and a resistive memory device having a structure which is variously modified and changed therefrom within the scope of the inventive concept.

Figure 13:
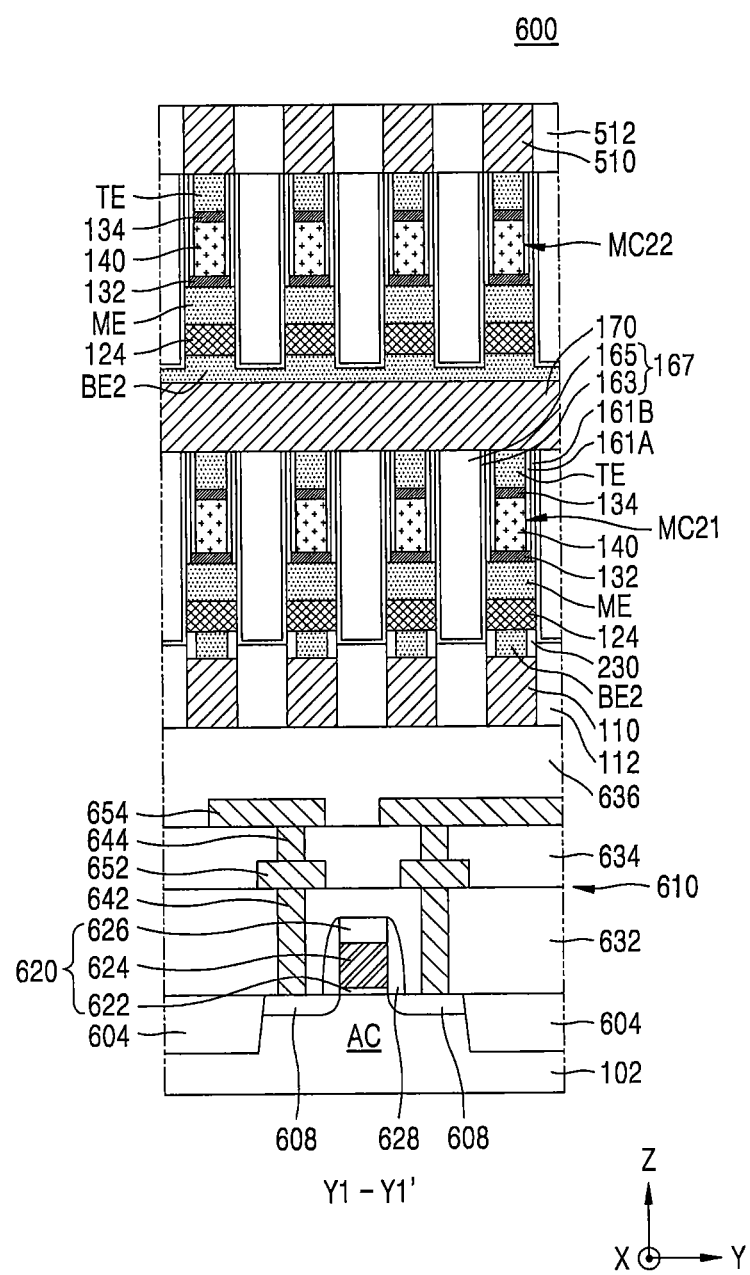
FIG. 13 is a cross-sectional view for describing a resistive memory device according to some embodiments of the inventive concepts.

FIG. 13 is a cross-sectional view for describing a resistive memory device 600 according to some embodiments of the inventive concepts. In FIG. 13, the same reference numerals as FIGS. 4 to 12B refer to like elements, and their repetitive descriptions are omitted. The resistive memory device 600 illustrated in FIG. 13 may have an equivalent circuit configuration described above with reference to FIG. 12B.

Referring to FIG. 13, the resistive memory device 600 may include substantially the same elements as those of the resistive memory device 500 described above with reference to FIGS. 12A and 12B. The resistive memory device 600 may include a plurality of first level memory cells MC21 and a plurality of second level memory cells MC22 provided at different levels in the vertical direction (e.g., the Z direction). However, unlike the resistive memory device 500 described above with reference to FIG. 12A, the resistive memory device 600 may further include a lower structure 610 which is disposed between a substrate 102 and a plurality of first conductive lines 110 and includes a plurality of transistors and a plurality of wirings.

The lower structure 610 may include a plurality of peripheral circuits or driving circuits for driving the plurality of first level memory cells MC21 and the plurality of second level memory cells MC22. The lower structure may include a plurality of circuits for processing data, input/output to the plurality of first level memory cells MC21 and the plurality of second level memory cells MC22, at a high speed. In some embodiments, the lower structure 610 may include at least one of the circuits (for example, the row decoder RD, the column decoder CD, the control logic CL, the write/read circuit 14, the reference signal generator 16, and/or the power generator 18) described above with reference to FIG. 2. The write/read circuit 14 may include a sense amplifier 14A and a write driver 14B. In other embodiments, the lower structure 610 may include a page buffer, a latch circuit, a cache circuit, a sense amplifier, and/or data in/out circuit.

An isolation region 604 defining a plurality of active regions AC may be formed in a substrate 102. The lower structure 610 may include a gate structure 620, a plurality of interlayer insulation layers 632, 634, and 636, a plurality of contact plugs 642 and 644, and a plurality of wirings 652 and 654, which are formed in the active region AC of the substrate 102. The gate structure 620 may include a gate insulation layer 622, a gate 624, and an insulation capping layer 626, which are sequentially stacked in the active region AC of the substrate 102. Both sidewalls of the gate structure 620 may be covered by an insulation spacer 628. The gate insulation layer 622 may include, for example, silicon oxide or silicon nitride. The gate 624 may include, for example, impurity-doped polysilicon, metal, metal nitride, or a combination thereof. The insulation capping layer 626 may include, for example, nitride. The insulation spacer 628 may include, for example, oxide, nitride, or a combination thereof.

A pair of impurity region 608 may be disposed at both sides of the gate structure 620 in the active region AC of the substrate 102. The pair of impurity region 608 may include N-type or P-type impurities. Based on an impurity type included in the pair of impurity region 608, the gate structure 620 and the pair of impurity regions 608 disposed at the both sides thereof may each include an NMOS transistor or a PMOS transistor.

The interlayer insulation layer 632 may be on and/or cover the gate structure 620, and the wiring 652 may be electrically connected to the impurity region 608 through the contact plug 642 passing through the interlayer insulation layer 632. The interlayer insulation layer 634 may be on and/or cover the wiring 652, and the wiring 654 may be electrically connected to the wiring 652 through the contact plug 644 passing through the interlayer insulation layer 634. The interlayer insulation layer 636 may be disposed between the wiring 654 and a plurality of first conductive lines 110.

The plurality of interlayer insulation layers 632, 634, and 636 may include, for example, oxide. The plurality of contact plugs 642 and 644 and the plurality of wirings 652 and 654 may each include, for example, metal, conductive metal nitride, or a combination thereof. For example, the metal may be selected from among W, Al, Cu, and Ti.

In FIG. 13, a configuration of the lower structure 610 is merely an embodiment and may be variously modified and changed within the scope of the inventive concept. For example, the lower structure 610 may include a single-layer wiring structure or a three or more-layer multilayer wiring structure.

In FIG. 13, a structure is illustrated where a two-layer stack structure including the plurality of first level memory cells MC21 and the plurality of second level memory cells MC22 illustrated in FIG. 12A is formed on the lower structure 610, but the inventive concepts are not limited thereto. The resistive memory device 600 illustrated in FIG. 13 may include a one-layer structure or a two, four, or six-layer stack structure including the memory cells included in the resistive memory devices 100, 100A, 100B, 200, 200A, 300, and 400 illustrated in FIGS. 5A to 11B and memory cells having a structure which is variously modified and changed therefrom within the scope of the inventive concept, instead of a two-layer stack structure including the plurality of first level memory cells MC21 and the plurality of second level memory cells MC22.

Figure 14A:
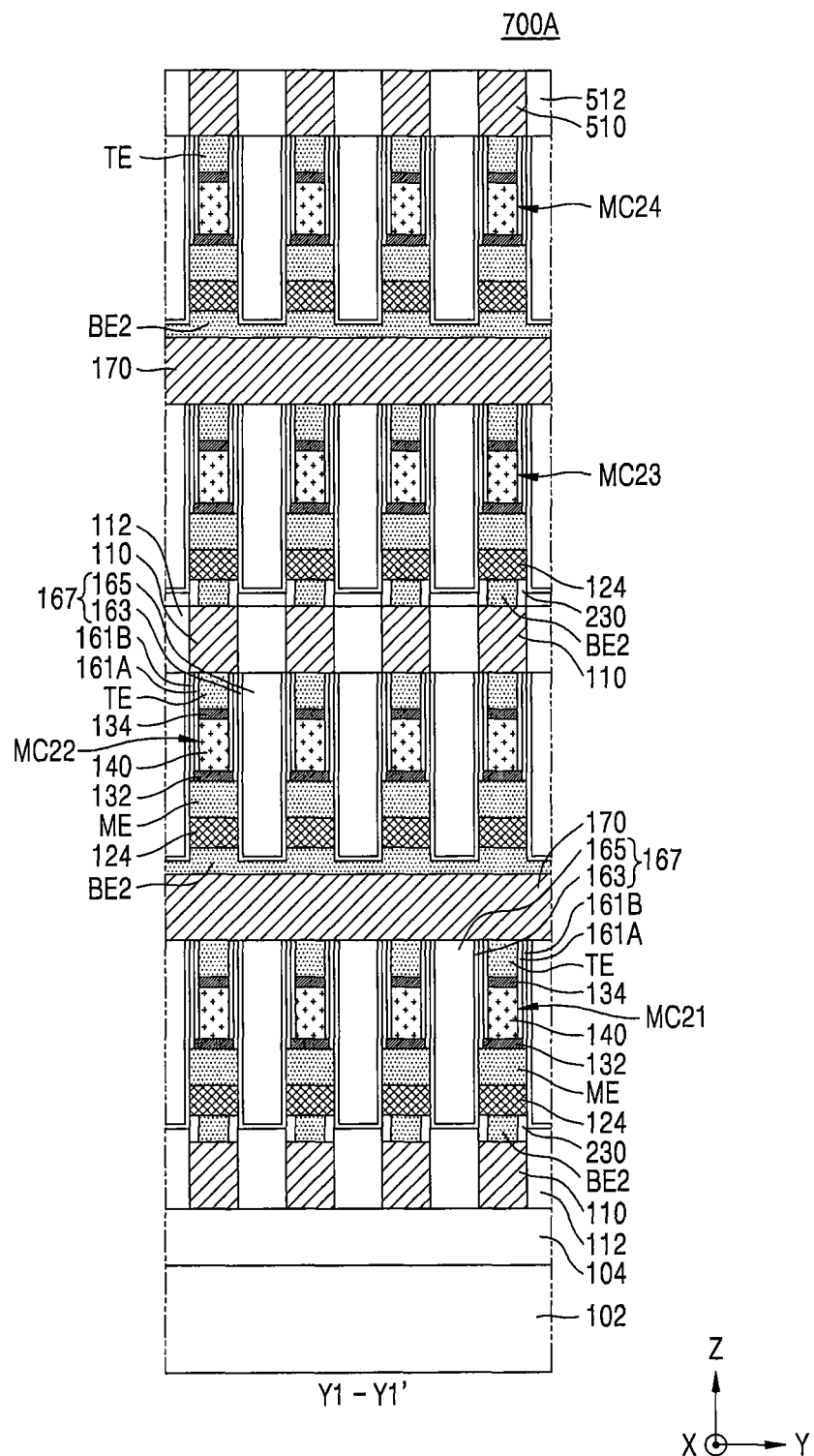
FIGS. 14A and 14B are cross-sectional views for describing a resistive memory device according to some embodiments of the inventive concepts.

FIG. 14A is a cross-sectional view for describing a resistive memory device 700A according to some embodiments of the inventive concepts. In FIG. 14A, the same reference numerals as FIGS. 4 to 13 refer to like elements, and their repetitive descriptions are omitted.

Referring to FIG. 14A, the resistive memory device 700A may include a plurality of first level memory cells MC21, a plurality of second level memory cells MC22, a plurality of third level memory cells MC23, and a plurality of fourth level memory cells MC24 provided at different levels in the vertical direction (e.g., the Z direction). The plurality of third level memory cells MC23 and the plurality of fourth level memory cells MC24 may have a structure which is the same as or similar to that of each of the plurality of first level memory cells MC21 and the plurality of second level memory cells MC22 described above with reference to FIGS. 12A and 12B.

A plurality of first conductive lines 110 may be connected between a plurality of top electrodes TE included in the plurality of second level memory cells MC22 and a plurality of bottom electrodes BE2 included in the plurality of third level memory cells MC23. A top electrode TE of each of the plurality of fourth level memory cells MC24 may be connected to one third conductive line 510 of a plurality of third conductive lines 510.

In FIG. 14A, it is illustrated that each of the plurality of first level memory cells MC21, the plurality of second level memory cells MC22, the plurality of third level memory cells MC23, and the plurality of fourth level memory cells MC24 has the same configuration as that of each of the plurality of memory cells MC2 described above with reference to FIGS. 8A and 8B, but the inventive concepts are not limited thereto. Each of the plurality of first level memory cells MC21, the plurality of second level memory cells MC22, the plurality of third level memory cells MC23, and the plurality of fourth level memory cells MC24 in the resistive memory device 700A illustrated in FIG. 14A may be configured to have a structure of a memory cell selected from among the memory cells included in the resistive memory devices 100, 100A, 100B, 200, 200A, 300, and 400 illustrated in FIGS. 5A to 11B and memory cells having a structure which is variously modified and changed therefrom within the scope of the inventive concept.

Figure 14B:
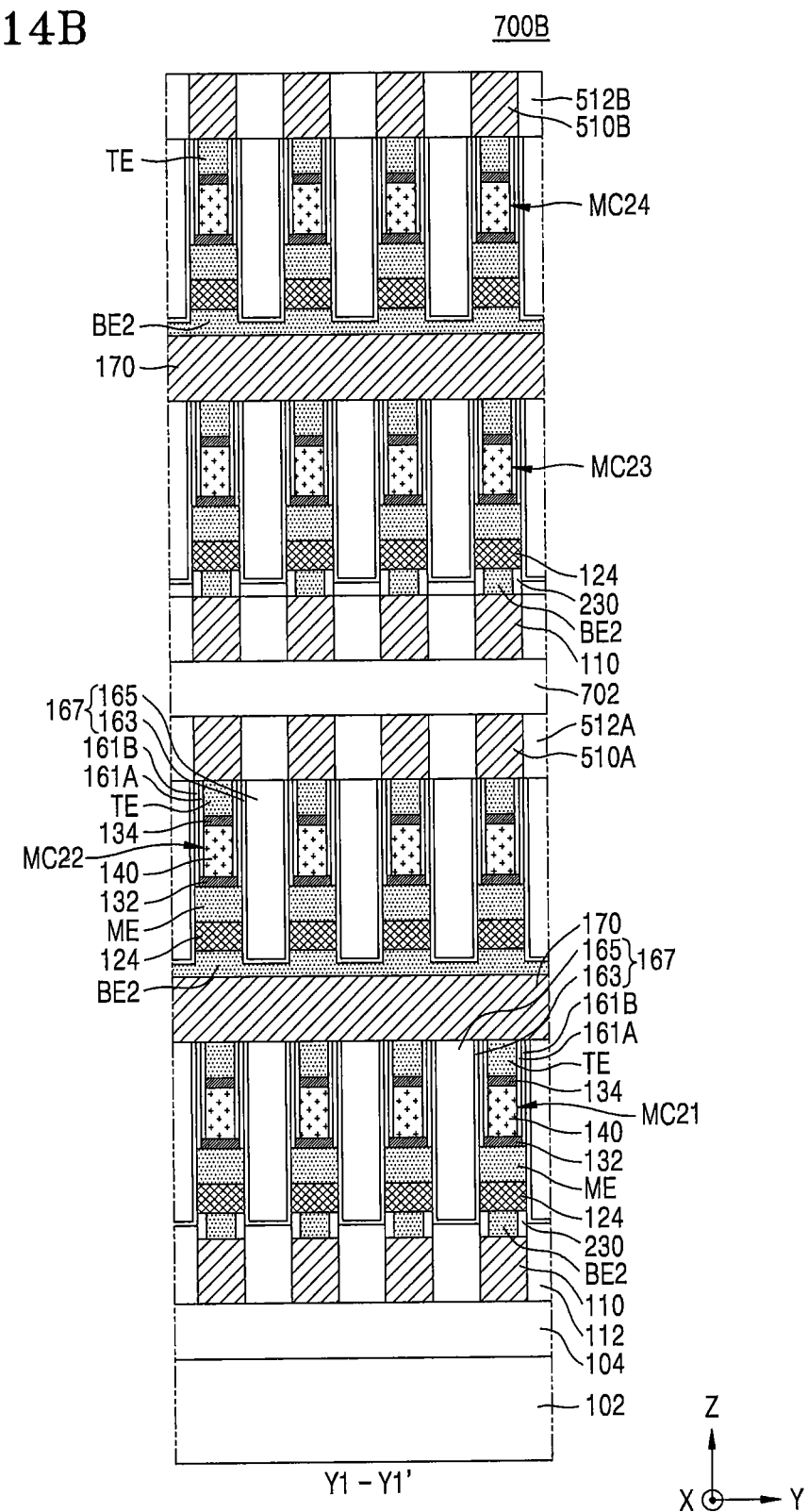

FIG. 14B is a cross-sectional view for describing a resistive memory device 700B according to some embodiments of the inventive concepts. In FIG. 14B, the same reference numerals as FIGS. 4 to 14A refer to like elements, and their repetitive descriptions are omitted.

Referring to FIG. 14B, the resistive memory device 700B may have substantially the same configuration as that of the resistive memory device 700A illustrated in FIG. 14A. A top electrode TE of each of a plurality of second level memory cells MC22 may be connected to one third conductive line 510A of a plurality of third conductive lines 510A. A plurality of third insulation lines 512A may each be disposed between two adjacent third conductive lines 510A of the plurality of third conductive lines 510A. A top electrode TE of each of a plurality of fourth level memory cells MC24 may be connected to one third conductive line 510B of a plurality of third conductive lines 510B. A plurality of third insulation lines 512B may each be disposed between two adjacent third conductive lines 510B of the plurality of third conductive lines 510B. The plurality of third conductive lines 510A and 510B and the plurality of third conductive lines 510A and 510B may respectively have the same configurations as those of the plurality of third conductive lines 510 and the plurality of third insulation lines 512 described above with reference to FIGS. 12A and 12B.

An interlayer insulation layer 702 may be disposed between the plurality of third conductive lines 510A, connected to the top electrode TE of each of the plurality of second level memory cells MC22, and a plurality of first conductive lines 110 connected to a plurality of bottom electrodes BE2 of the plurality of third level memory cells MC23. The interlayer insulation layer 702 may include, for example, oxide, nitride, or a combination thereof.

In FIG. 14B, it is illustrated that each of the plurality of first level memory cells MC21, the plurality of second level memory cells MC22, the plurality of third level memory cells MC23, and the plurality of fourth level memory cells MC24 has the same configuration as that of each of the plurality of memory cells MC2 described above with reference to FIGS. 8A and 8B, but the inventive concepts are not limited thereto. Each of the plurality of first level memory cells MC21, the plurality of second level memory cells MC22, the plurality of third level memory cells MC23, and the plurality of fourth level memory cells MC24 in the resistive memory device 700B illustrated in FIG. 14B may be configured to have a structure of a memory cell selected from among the memory cells included in the resistive memory devices 100, 100A, 100B, 200, 200A, 300, and 400 illustrated in FIGS. 5A to 11B and memory cells having a structure which is variously modified and changed therefrom within the scope of the inventive concept.

FIGS. 15A to 15K are cross-sectional views illustrated in a process sequence for describing a method of manufacturing a resistive memory device, according to some embodiments of the inventive concepts. In each of FIGS. 15A to 15K, region (A) is a cross-sectional view of some elements of a portion corresponding to a cross-sectional surface taken along line X1-X1' of FIG. 4, and region (B) is a cross-sectional view of some elements of a portion corresponding to a cross-sectional surface taken along line Y1-Y1' of FIG. 4. A method of manufacturing the resistive memory device 100 illustrated in FIGS. 4, 5A, and 5B will be described below with reference to FIGS. 15A to 15K.

Figure 15A:
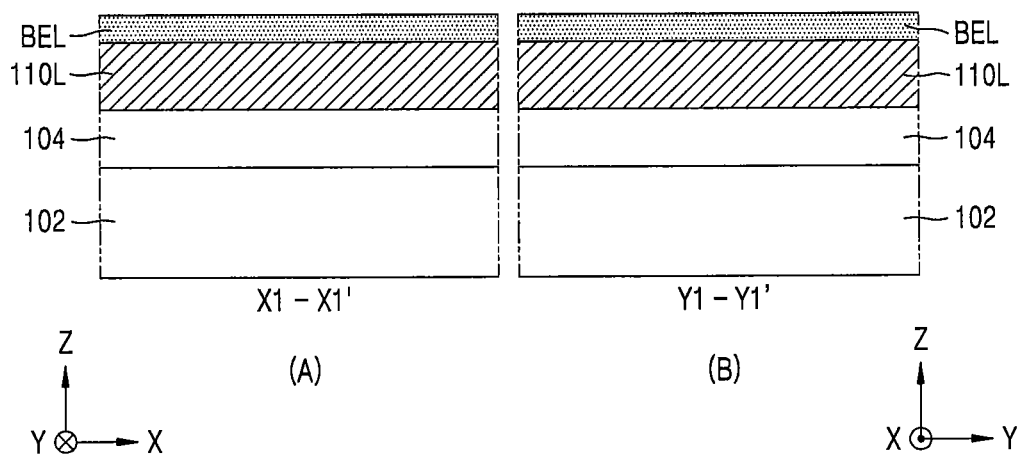
FIGS. 15A to 15K are cross-sectional views illustrated in a process sequence for describing a method of manufacturing a resistive memory device, according to some embodiments of the inventive concepts.

Referring to FIG. 15A, an interlayer insulation layer 104 may be formed on a substrate 102, and a first conductive layer 110L and a bottom electrode layer BEL may be sequentially formed on the interlayer insulation layer 104.

Materials of the first conductive layer 110L and the bottom electrode layer BEL may be the same as the materials of the first conductive line 110 and the bottom electrode BE1 described above with reference to FIGS. 5A and 5B.

Figure 15B:
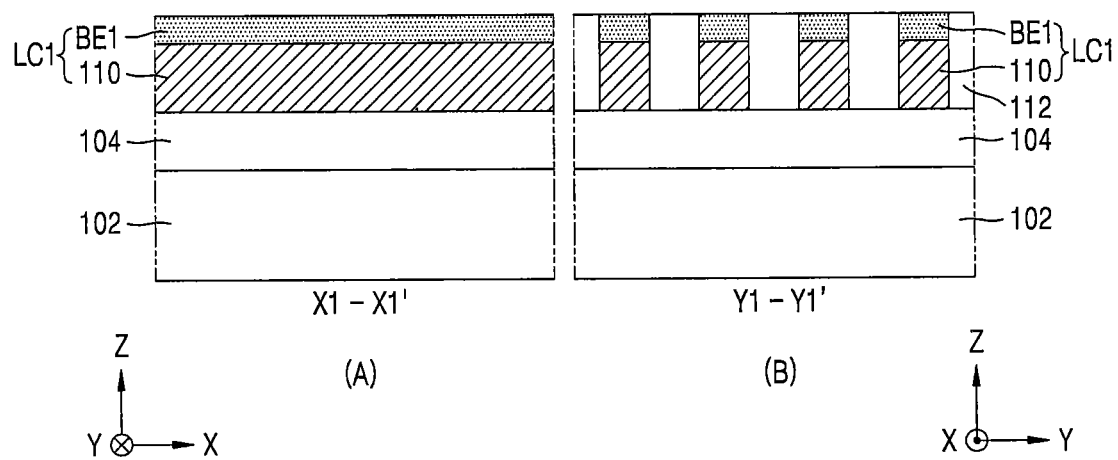

Referring to FIG. 15B, by patterning the first conductive layer 110L and the bottom electrode layer BEL, a plurality of lower conductive lines LC1 may be formed in a stack structure of a first conductive line 110 and a bottom electrode BE1 which extend long (e.g., have a longitudinal axis extending) in a first direction (e.g., the X direction), and a plurality of lower insulation lines 112 filled into spaces between the plurality of lower conductive lines LC1 may be formed.

Figure 15C:
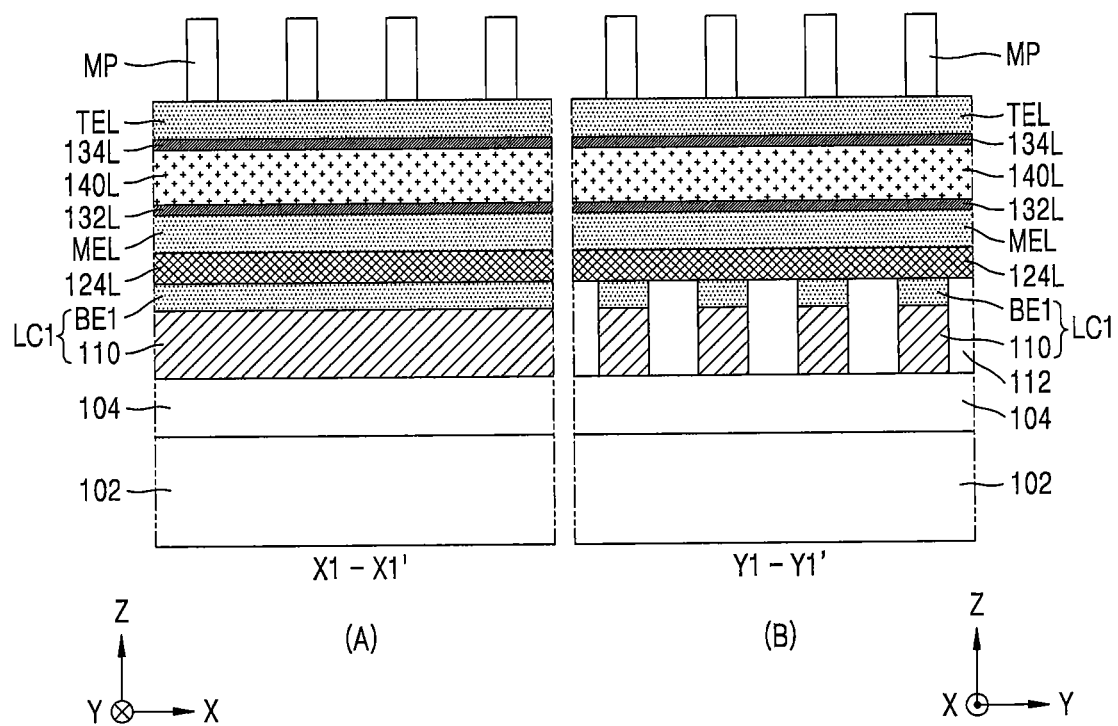

Referring to FIG. 15C, a selection device layer 124L, a middle electrode layer MEL, a lower barrier layer 132L, a resistive memory pattern layer 140L, an upper barrier layer 134L, and a top electrode layer TEL may be sequentially formed on the plurality of lower conductive lines LC1 and the plurality of lower insulation lines 112, and then, a mask pattern MP may be formed on the top electrode layer TEL.

Materials of the selection device layer 124L, the middle electrode layer MEL, the lower barrier layer 132L, the resistive memory pattern layer 140L, the upper barrier layer 134L, and the top electrode layer TEL may be the same materials as those of the selection device 124, the middle electrode ME, the lower barrier 132, the resistive memory pattern 140, the upper barrier 134, and the top electrode TE illustrated in, and described with respect to, FIG. 5A.

The mask pattern MP may be formed to have a planar shape of a plurality of island patterns disposed at positions of the plurality of memory cells MC1 illustrated in FIG. 4 to correspond thereto. In some embodiments, the mask pattern MP may include a hard mask including oxide, nitride, or a combination thereof. In some embodiments, a photolithography process using extreme ultraviolet (EUV) (13.5 nm), KrF excimer laser (248 nm), ArF excimer laser (193 nm), or F2 excimer laser (157 nm) as a light source may be used for forming the mask pattern MP.

Figure 15D:
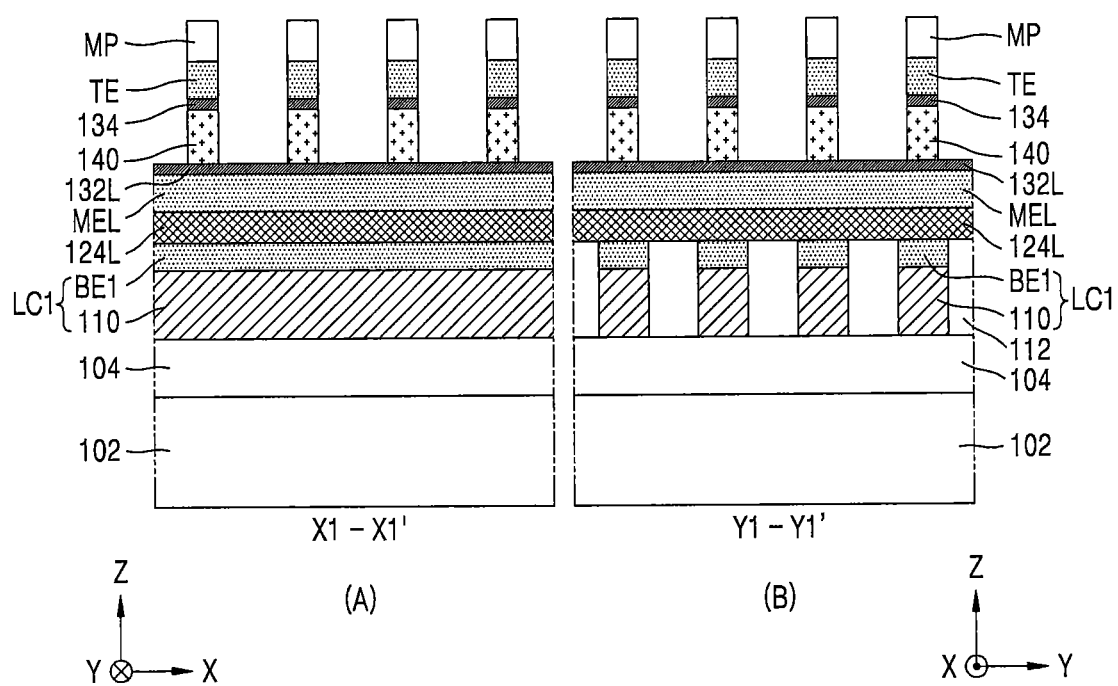

Referring to FIG. 15D, a plurality of top electrodes TE, a plurality of upper barriers 134, and a plurality of resistive memory patterns 140 may be formed by anisotropic-etching the top electrode layer TEL, the upper barrier layer 134L, and the resistive memory pattern layer 140L by using the mask pattern MP as an etch mask in a resultant material of FIG. 15C. A portion of the mask pattern MP may be consumed while the anisotropic process is being performed, and thus, a thickness of the mask pattern MP may decrease.

Figure 15E:
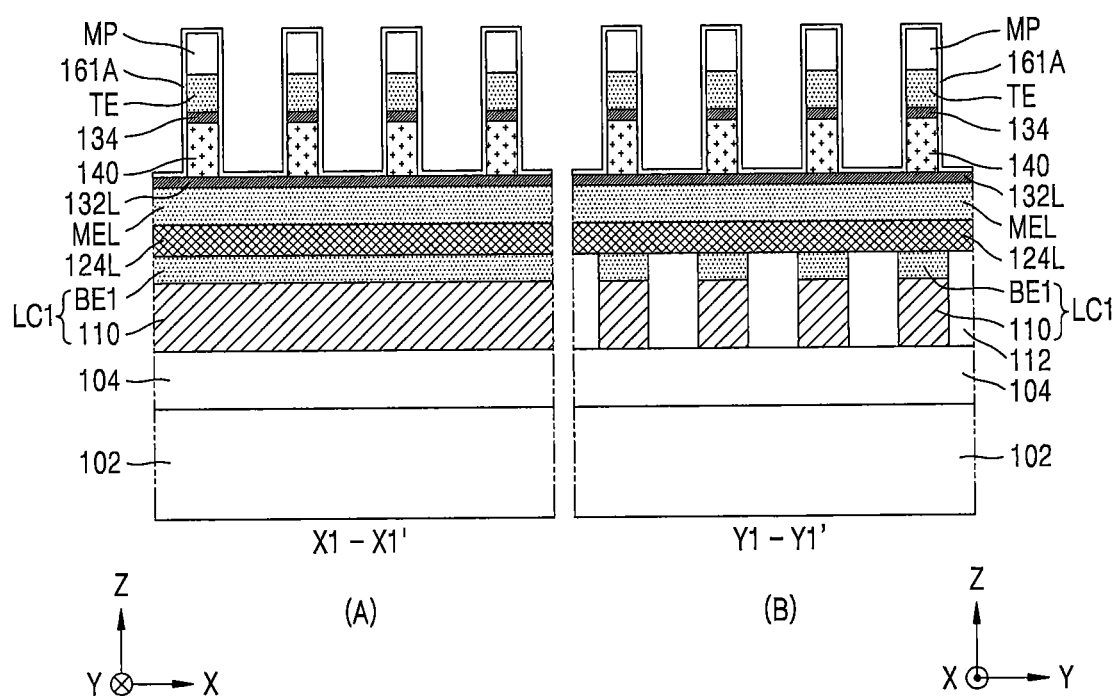

Referring to FIG. 15E, a first insulation liner 161A may be formed to be on and/or cover exposed surfaces in a resultant material of FIG. 15D. The first insulation liner 161A may contact a sidewall of each of the plurality of resistive memory patterns 140, the plurality of upper barriers 134, and the plurality of top electrodes TE.

In some embodiments, the first insulation liner 161A may include silicon oxide. In some embodiments, an atomic layer deposition (ALD) process or a chemical vapor deposition (CVD) process may be performed at a relative low temperature of about 100° C. or less (for example, about 60° C. to about 100° C.), for forming the first insulation liner 161A. As a process temperature for forming the first insulation liner 161A is lowered, the plurality of resistive memory patterns 140 may be prevented from being degraded while the first insulation liner 161A is being formed.

Figure 15F:
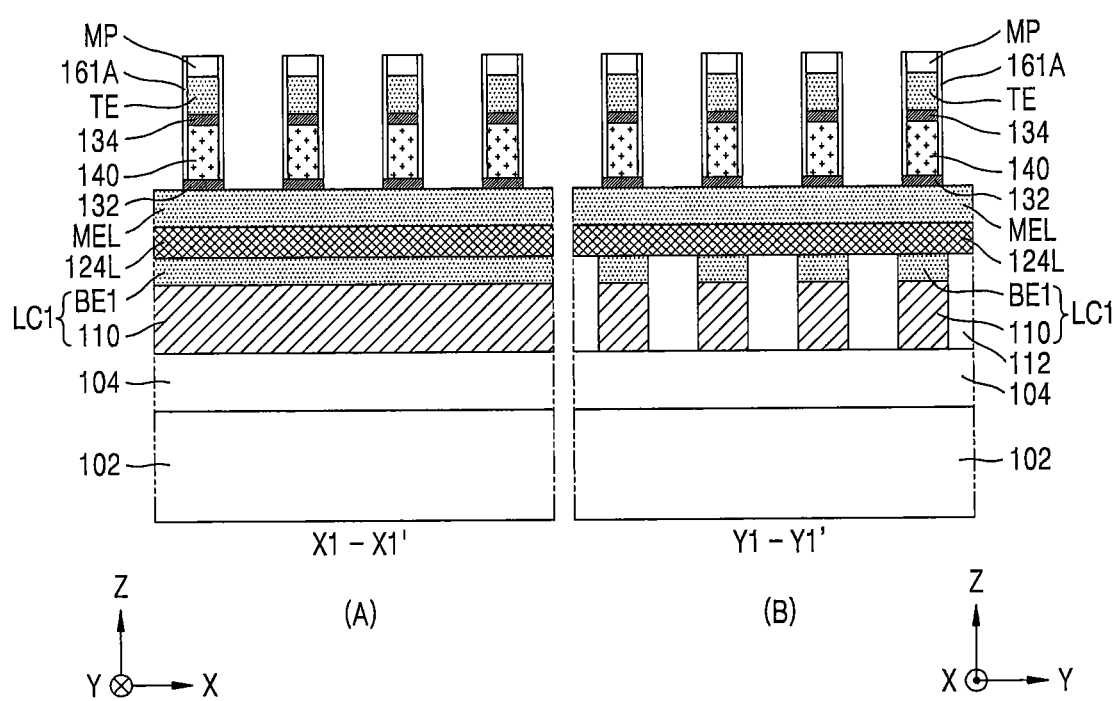

Referring to FIG. 15F, by etching the lower barrier layer 132L by using each of the mask pattern MP and the first insulation liner 161A as an etch mask in a resultant material of FIG. 15E, a plurality of lower barriers 132 may be formed, and a top surface of the middle electrode layer MEL may be exposed. While the lower barrier layer 132L is being etched, a portion of each of the mask pattern MP and the first insulation liner 161A may be consumed, and thus, a height thereof may decrease.

Figure 15G:
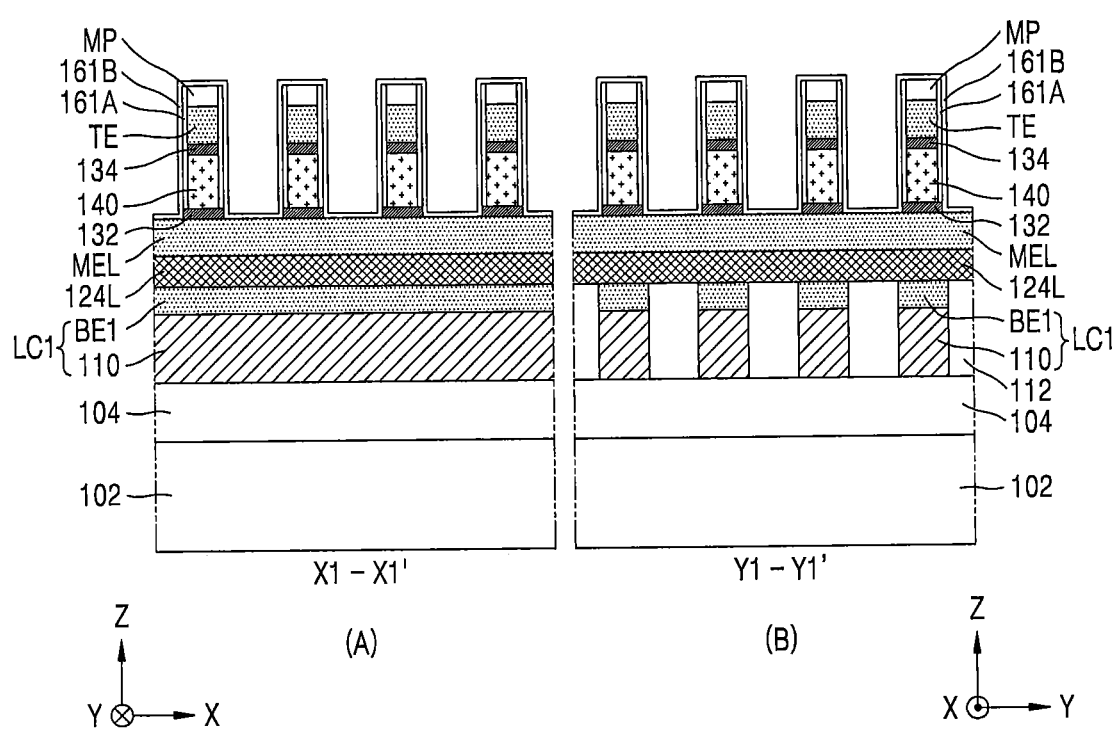

Referring to FIG. 15G, a second insulation liner 161B may be formed to conformally cover exposed surfaces in a resultant material of FIG. 15F. The second insulation liner 161B may be on and/or cover a sidewall of each of the plurality of lower barriers 132, the plurality of resistive memory patterns 140, the plurality of upper barriers 134, and the plurality of top electrodes TE above and/or on the first insulation liner 161A. The second insulation liner 161B may contact the plurality of lower barriers 132. The second insulation liner 161B may be apart from (e.g., separated from) the plurality of resistive memory patterns 140, the plurality of upper barriers 134, and the plurality of top electrodes TE in a horizontal direction (for example, the first horizontal direction (e.g., the X direction) and the second horizontal direction (e.g., the Y direction)) with the first insulation liner 161A therebetween. The second insulation liner 161B may include, for example, silicon nitride.

Figure 15H:
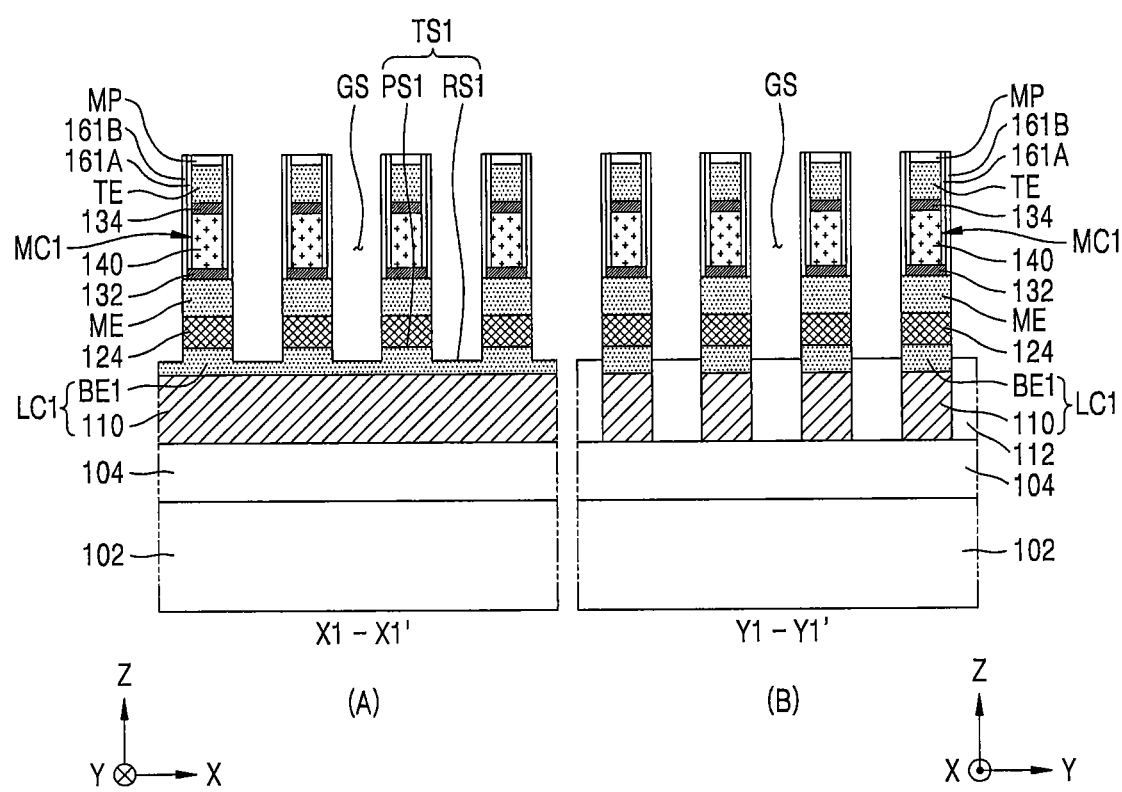

Referring to FIG. 15H, by anisotropic-etching the middle electrode layer MEL and the selection device layer 124L by using each of the mask pattern MP, the first insulation liner 161A, and the second insulation liner 161B as an etch mask in a resultant material of FIG. 15G, a plurality of middle electrodes ME and a plurality of selection devices 124 may be formed, and a gap-fill space GS may be formed to expose a top surface of each of the plurality of bottom electrodes BE1 and a top surface of each of the plurality of lower insulation lines 112. As a result, a plurality of memory cells MC1 may be formed apart from (e.g., separated from) one another in a horizontal direction (for example, the first horizontal direction (e.g., the X direction) and the second horizontal direction (e.g., the Y direction)) with the gap-fill space GS therebetween.

While the middle electrode layer MEL and the selection device layer 124L are being anisotropically etched, the first insulation liner 161A and the second insulation liner 161B may protect the plurality of resistive memory patterns 140 from an etch atmosphere. While the middle electrode layer MEL and the selection device layer 124L are being anisotropically etched, each of the mask pattern MP, the first insulation liner 161A, and the second insulation liner 161B may be consumed, and thus, a thickness thereof may decrease and a height of a top surface of each of the plurality of bottom electrodes BE1 and the plurality of lower insulation lines 112 exposed at a periphery of the plurality of selection devices 124 may be lowered. As a result, a top surface TS1 having a concave-convex shape and including a plurality of protrusion surfaces PS1 and a plurality of recess surfaces RS1 may be formed in each of the plurality of bottom electrodes BE1.

While the middle electrode layer MEL and the selection device layer 124L are being anisotropically etched for forming the plurality of memory cells MC1, a height of the plurality of bottom electrodes BE1 (i.e., a process margin corresponding to a size thereof in the vertical direction (e.g., the Z direction) may be secured, and thus, even when a portion of each of the plurality of bottom electrodes BE1 and the plurality of lower insulation lines 112 is removed by over-etching, the plurality of first conductive lines 110 may not be exposed through the gap-fill space GS.

For example, in a case where a plurality of bottom electrodes formed to have a plurality of island patterns apart from one another in the first horizontal direction (e.g., the X direction) parallel to an extension direction of the first conductive line 110 have to be formed for forming the plurality of memory cells MC1 unlike description given above with reference to FIG. 15H, the bottom electrode BE1 has to be etched so that the first conductive line 110 is exposed through the gap-fill space GS, in a cross-sectional surface taken along line X1-X1' unlike the illustration of region (A) of FIG. 15H. In this case, a defect such as a dented surface or a non-uniform thickness of each of the plurality of first conductive lines 110 may occur because a portion of a metal layer (for example, a W layer) configuring the plurality of first conductive lines is etched by an etch atmosphere for forming the gap-fill space GS, and an electrical characteristic of the plurality of memory cells MC1 may be reduced because a pollutant (for example, metal or metal-containing impurities caused by materials of the plurality of first conductive lines 110) occurring due to etching of the plurality of first conductive lines 110 are deposited on a sidewall of each of the plurality of memory cells MC1 through the gap-fill space GS. Such problems may be worsened due to misalignment occurring when the mask pattern MP is being formed in a process described above with reference to FIG. 15C.

According to an embodiment, the lower bottom electrode BE1 configuring the plurality of memory cells MC1 may have a structure which extends long (e.g., has a longitudinal axis extending) in the first horizontal direction (e.g., the X direction) along with the first conductive line 110, and memory cells MC1 of one group arranged in one row in the first horizontal direction (e.g., the X direction) among the plurality of memory cells MC1 may be implemented to have a structure which shares one bottom electrode BE1 Therefore, a state where the first conductive line 110 is on and/or covered by the bottom electrode BE1 may be maintained while the middle electrode layer MEL and the selection device layer 124L are being anisotropically etched for forming the plurality of memory cells MC1 in a process described above with reference to FIG. 15H, and thus, a process margin may be secured by the height of each of the plurality of bottom electrodes BE1 and the first conductive line 110 may not be exposed through the gap-fill space GS even after the plurality of memory cells MC1 are formed. Particularly, when misalignment occurs while the mask pattern MP is being formed in a process described above with reference to FIG. 15C, a resultant material where a stack structure on the bottom electrode BE1 is offset in a horizontal direction from the bottom electrode BE1 may be obtained similar to the description of the resistive memory device 100B given above with reference to FIG. 7, for example. Even in this case, according to an embodiment, the bottom electrode BE1 may maintain a sufficient thickness for protecting the plurality of first conductive lines 110 so that the plurality of first conductive lines 110 are not exposed to a cleaning process and/or the like. Therefore, a defect such as a dented surface or a non-uniform thickness of each of the plurality of first conductive lines 110 may not occur and/or may be reduced, and metal or metal-containing impurities caused by the plurality of first conductive lines 110 may be prevented and/or hindered from being deposited on the sidewalls of the plurality of memory cells MC1 through the gap-fill space GS.

Figure 15I:
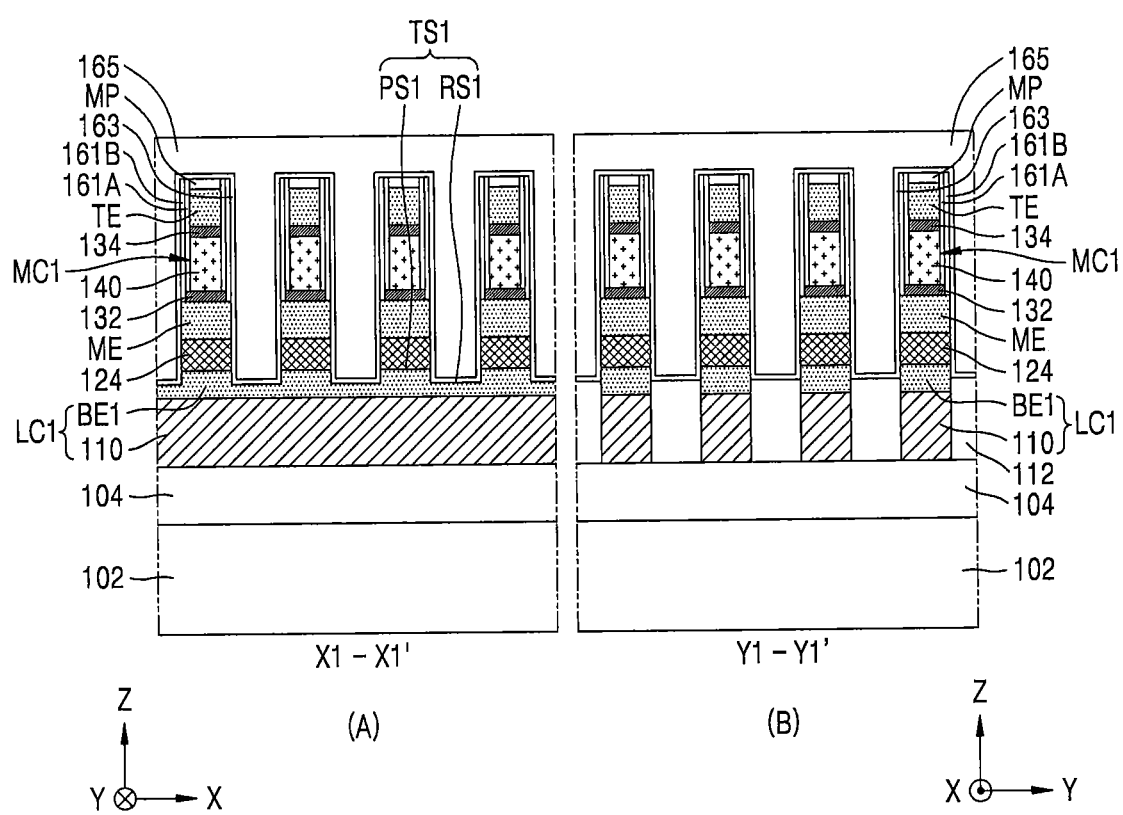

Referring to FIG. 15I, an encapsulation liner 163 may be formed to be on and/or cover exposed surfaces in a resultant material of FIG. 15H. The encapsulation liner 163 may be formed to contact a portion of an upper sidewall of each of the plurality of bottom electrodes BE1, the recess surface RS1 each of the plurality of bottom electrodes BE1, a sidewall of each of the plurality of selection devices 124, and a sidewall of each of the plurality of middle electrodes ME. The encapsulation liner 163 may be on and/or cover a sidewall of each of the plurality of lower barriers 132, the plurality of resistive memory patterns 140, the plurality of upper barriers 134, and the plurality of top electrodes TE above and/or on the first insulation liner 161A. Also, the encapsulation liner 163 may contact a top surface of each of the plurality of lower insulation lines 112.

In some embodiments, the encapsulation liner 163 may include silicon nitride. In some embodiments, an ALD process or a CVD process may be performed at a temperature of about 250° C. or less (for example, about 60° C. to about 250° C.), for forming the encapsulation liner 163. As a process temperature for forming the encapsulation liner 163 is lowered, the plurality of resistive memory patterns 140 may be prevented and/or hindered from being degraded while the encapsulation liner 163 is being formed.

After the encapsulation liner 163 is formed, a gap-fill insulation layer 165 may be formed to be filled into the gap-fill space GS remaining on the encapsulation liner 163, between two adjacent resistive memory patterns 140 of the plurality of resistive memory patterns 140. In some embodiments, a spin coating process, an ALD process, or a CVD process may be performed at a temperature of about 300° C. or less (for example, about 60° C. to about 300° C.), for forming the gap-fill insulation layer 165. As a process temperature for forming the gap-fill insulation layer 165 is lowered, the plurality of resistive memory patterns 140 may be prevented and/or hindered from being degraded while the gap-fill insulation layer 165 is being formed.

Figure 15J:
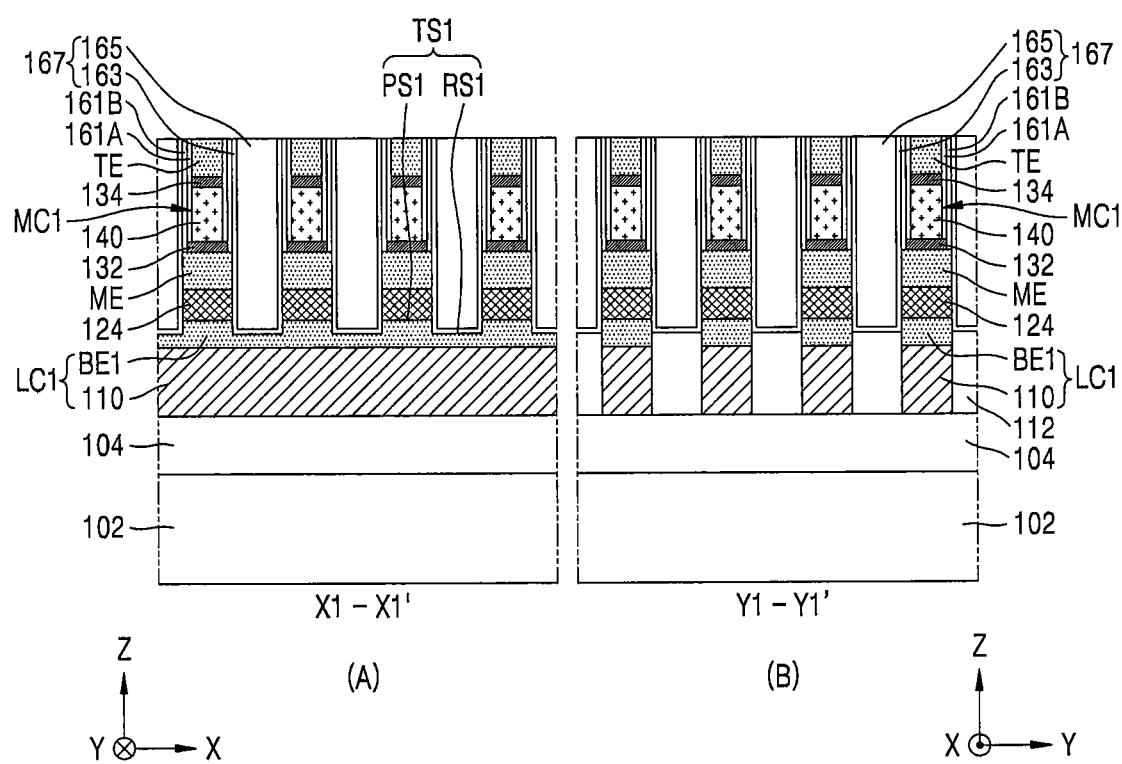

Referring to FIG. 15J, a plurality of top electrodes TE may be exposed by planarizing a top surface of a resultant material of FIG. 15I. As a result, the mask pattern MP may be removed, and a height of each of the first insulation liner 161A, the second insulation liner 161B, the encapsulation liner 163, and the gap-fill insulation layer 165 may be lowered.

Figure 15K:
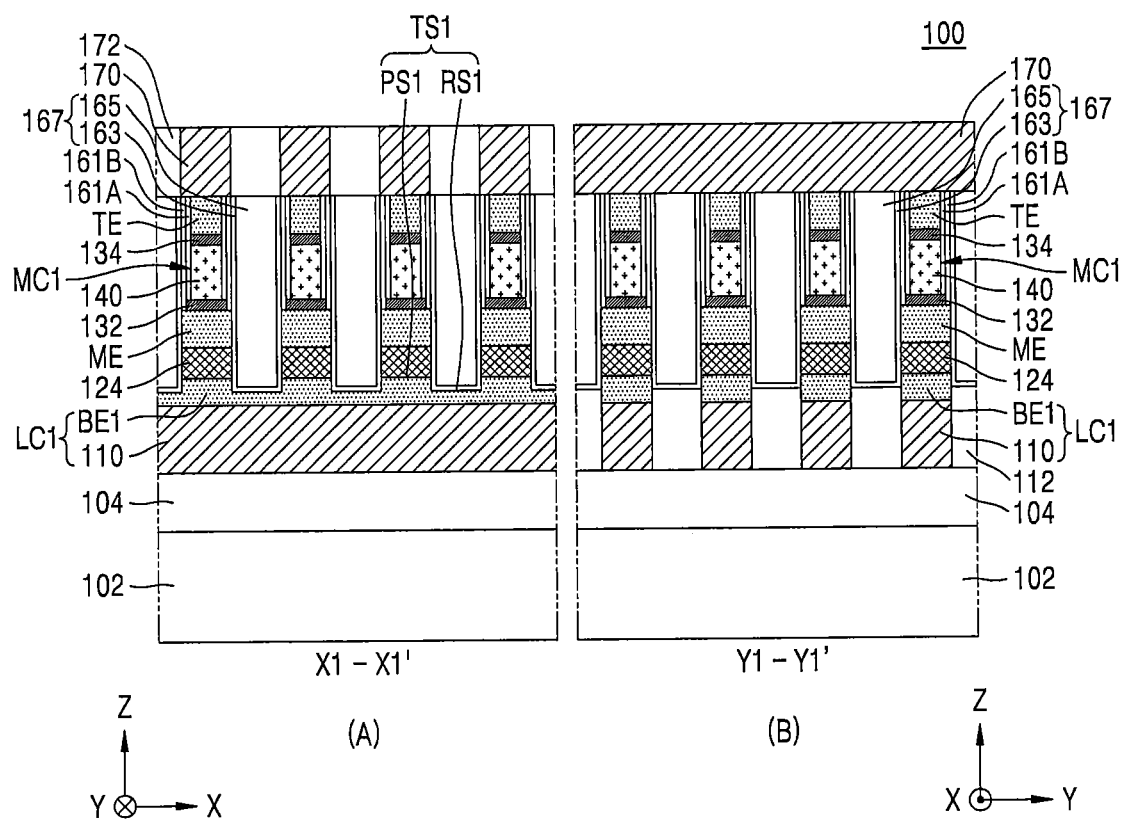

Referring to FIG. 15K, a plurality of second conductive lines 170 and a plurality of second insulation lines 172 may be formed on a resultant material of FIG. 15J.

In some embodiments, by forming the plurality of second conductive lines 170, a plurality of insulation spaces exposing a top surface of the upper insulation structure 167 may be formed between each of the plurality of second conductive lines 170, and then, the plurality of second insulation lines 172 may be filled into the plurality of insulation spaces.

In other embodiments, in a process described above with reference to FIG. 15K, the resistive memory device 200B illustrated in FIG. 9B may be formed by forming the plurality of second insulation lines 272 illustrated in FIG. 9B, instead of the plurality of second insulation lines 172. In a process of forming the resistive memory device 200B, by forming the plurality of second conductive lines 170, the plurality of insulation spaces exposing the top surface of the upper insulation structure 167 may be formed between each of the plurality of second conductive lines 170. At this time, a recessed top surface may be formed in the upper insulation structure 167 by removing a portion of an upper portion of the upper insulation structure 167 through the plurality of insulation spaces on the basis of over-etching. Subsequently, the plurality of second insulation lines 272 filled into the plurality of insulation spaces may be formed on the recessed top surface of the upper insulation structure 167.

FIGS. 16A to 16H are cross-sectional views illustrated in a process sequence for describing a method of manufacturing a resistive memory device, according to some embodiments of the inventive concepts. In each of FIGS. 16A to 16H, region (A) is a cross-sectional view of some elements of a portion corresponding to a cross-sectional surface taken along line X1-X1' of FIG. 4, and region (B) is a cross-sectional view of some elements of a portion corresponding to a cross-sectional surface taken along line Y1-Y1' of FIG. 4. A method of manufacturing the resistive memory device 200 illustrated in FIGS. 8A and 8B will be described below with reference to FIGS. 16A to 16H.

Figure 16A:
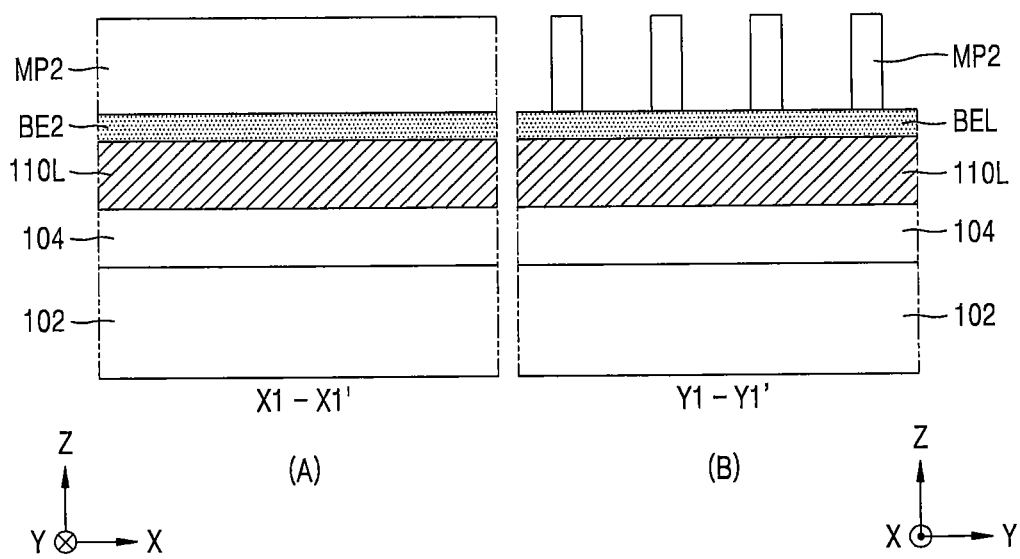
FIGS. 16A to 16H are cross-sectional views illustrated in a process sequence for describing a method of manufacturing a resistive memory device, according to some embodiments of the inventive concepts.

Referring to FIG. 16A, based on the method described above with reference to FIG. 15A, an interlayer insulation layer 104, a first conductive layer 110L, and a bottom electrode layer BEL may be sequentially formed on a substrate 102, and then, a mask pattern MP2 may be formed on the bottom electrode layer BEL.

The mask pattern MP2 may include a plurality of line patterns which extend long (e.g., have a longitudinal axis extending) in a first horizontal direction (e.g., the X direction) and are apart from (e.g., separated from) one another in the second horizontal direction (e.g., the Y direction). In some embodiments, the mask pattern MP2 may include a hard mask including oxide, nitride, or a combination thereof. In some embodiments, a photolithography process using EUV (13.5 nm), KrF excimer laser (248 nm), ArF excimer laser (193 nm), or F2 excimer laser (157 nm) as a light source may be used for forming the mask pattern MP2.

Figure 16B:
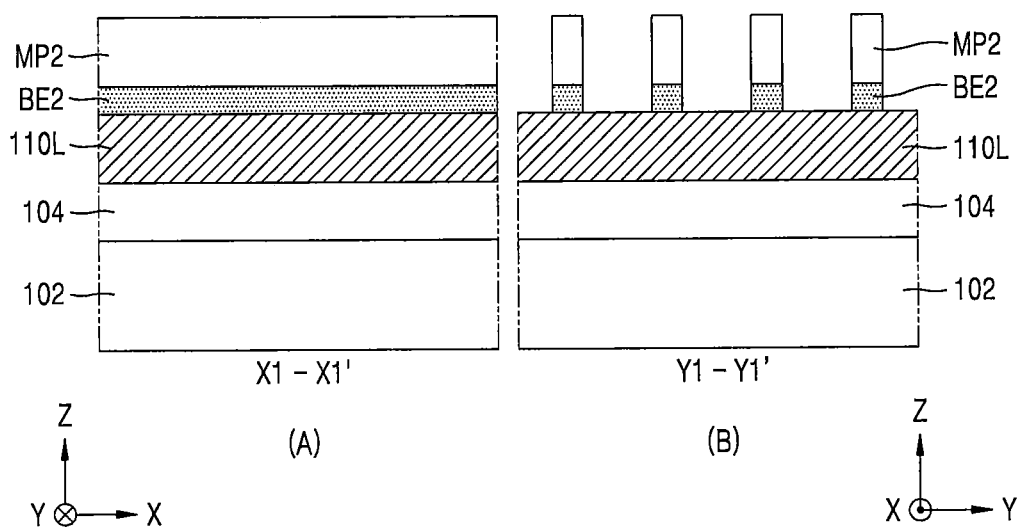

Referring to FIG. 16B, a plurality of bottom electrodes BE2 extending long (e.g., having a longitudinal axis extending) in the first horizontal direction (e.g., the X direction) may be formed by anisotropically etching the bottom electrode layer BEL by using the mask pattern MP2 as an etch mask. A top surface of the first conductive layer 110L may be exposed through a space between two adjacent bottom electrodes BE2 of the plurality of bottom electrodes BE2. While the bottom electrode layer BEL is being etched, a height of the mask pattern MP2 may be lowered.

Figure 16C:
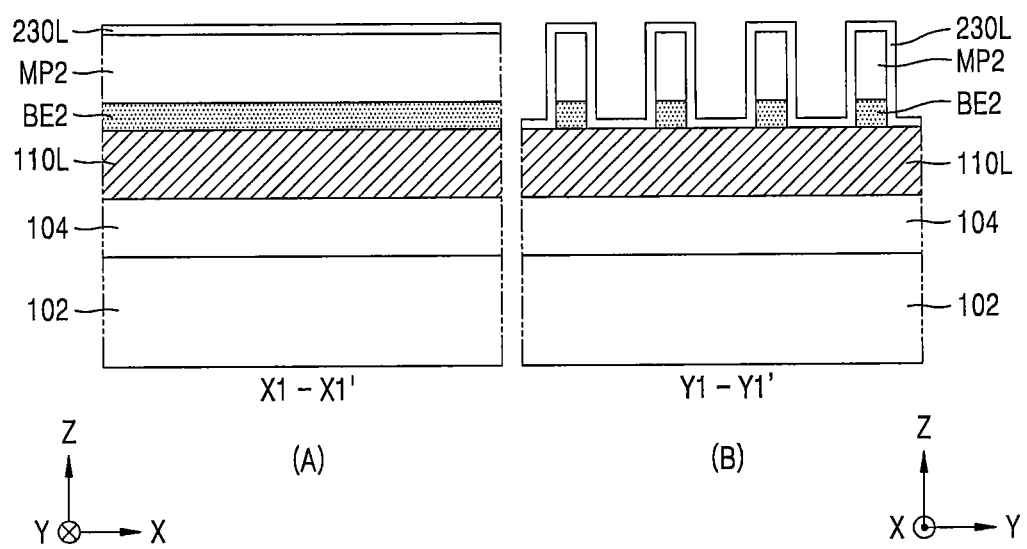

Referring to FIG. 16C, an insulation spacer layer 230L may be formed to conformally cover an exposed surface of a resultant material of FIG. 16B. The insulation spacer layer 230L may contact a sidewall of each of the plurality of bottom electrodes BE2. In some embodiments, the insulation spacer layer 230L may include silicon nitride. An ALD process or a CVD process may be used for forming the insulation spacer layer 230L.

Figure 16D:
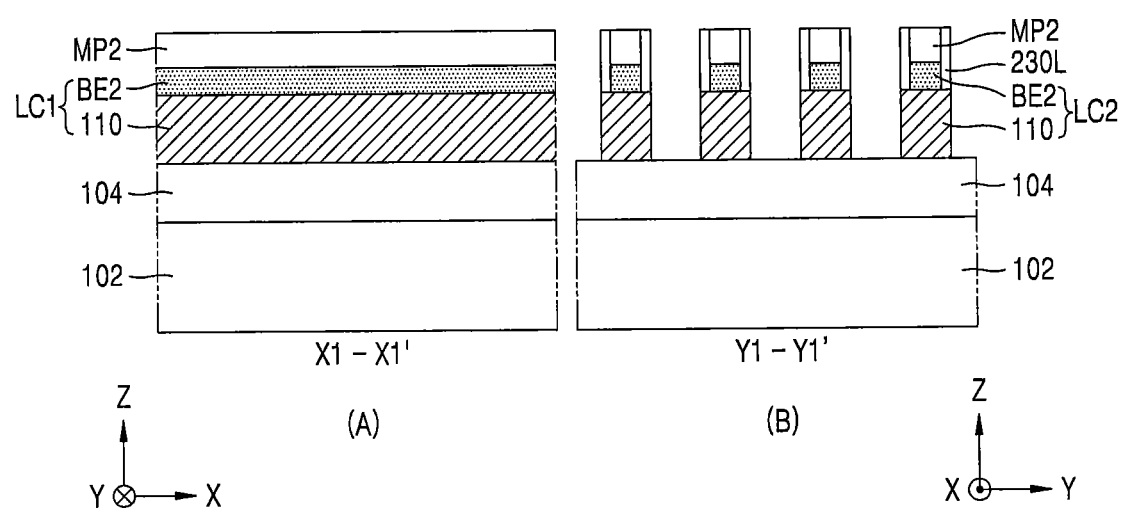

Referring to FIG. 16D, a top surface of the mask pattern MP2 may be exposed by etching back the insulation spacer layer 230L in a resultant material of FIG. 16C, and subsequently, a plurality of first conductive lines 110 may be formed by anisotropically etching the first conductive layer 110L by using each of the mask pattern MP2 and the insulation spacer layer 230L as an etch mask. The plurality of first conductive lines 110 and the plurality of bottom electrodes BE2 may configure a plurality of lower conductive lines LC2. A height of each of the mask pattern MP2 and the insulation spacer layer 230L may be lowered while the first conductive layer 110L is being anisotropically etched.

Figure 16E:
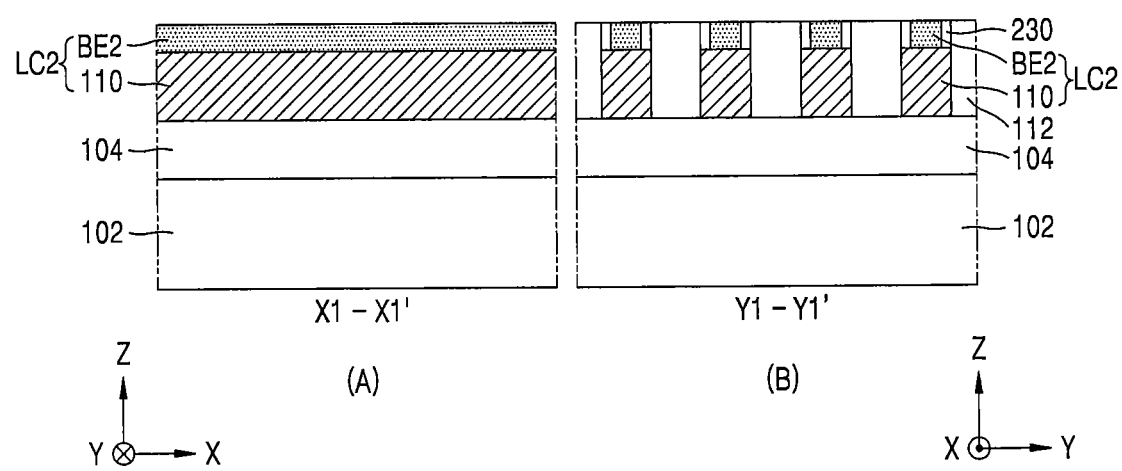

Referring to FIG. 16E, an insulation layer may be formed to cover a top surface of the mask pattern MP2 and to fill empty spaces between each of the lower conductive lines LC2 of the plurality of lower conductive lines LC2 in a resultant material of FIG. 16D, and then, the insulation layer may be planarized to form a plurality of lower insulation lines 112 filling the empty spaces between each of the plurality of lower conductive lines LC2 so that a top surface of each of the plurality of bottom electrodes BE2 is exposed. The mask pattern MP2 may be removed while the resultant material with the insulation layer formed therein is being planarized, and a plurality of insulation spacers 230 may be obtained from the insulation spacer layer 230L.

Figure 16F:
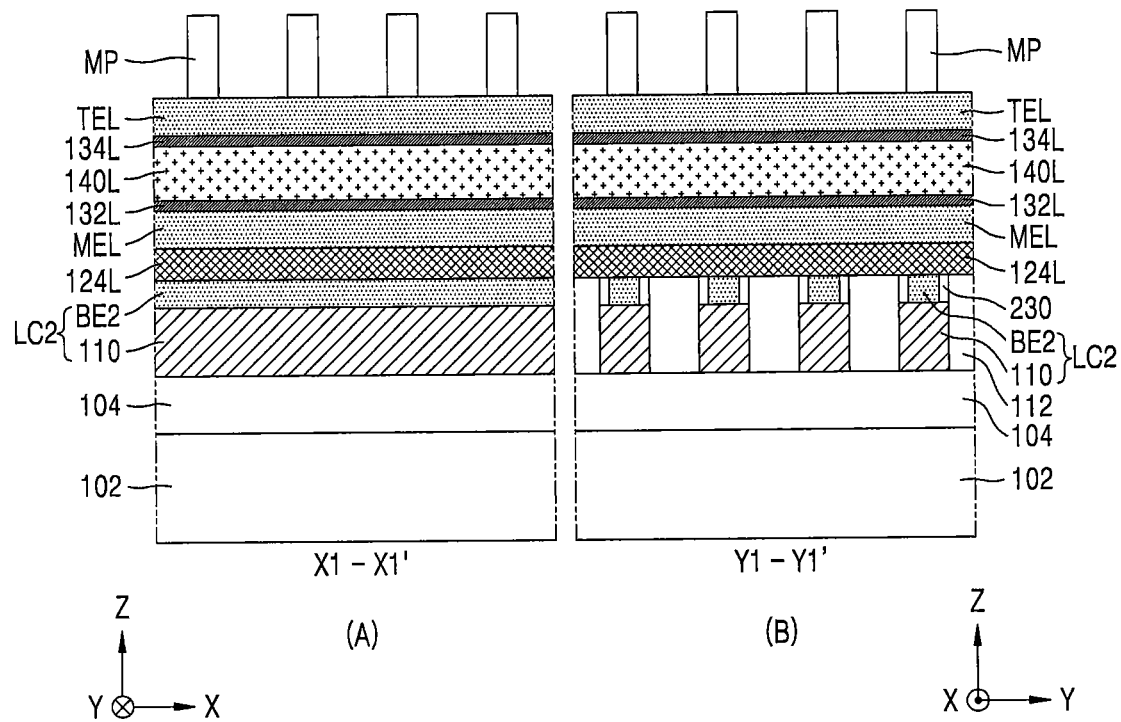

Referring to FIG. 16F, based on the method described above with reference to FIG. 15C, a selection device layer 124L, a middle electrode layer MEL, a lower barrier layer 132L, a resistive memory pattern layer 140L, an upper barrier layer 134L, and a top electrode layer TEL may be sequentially formed on a resultant material of FIG. 16E, and then, a mask pattern MP may be formed on the top electrode layer TEL.

Figure 16G:
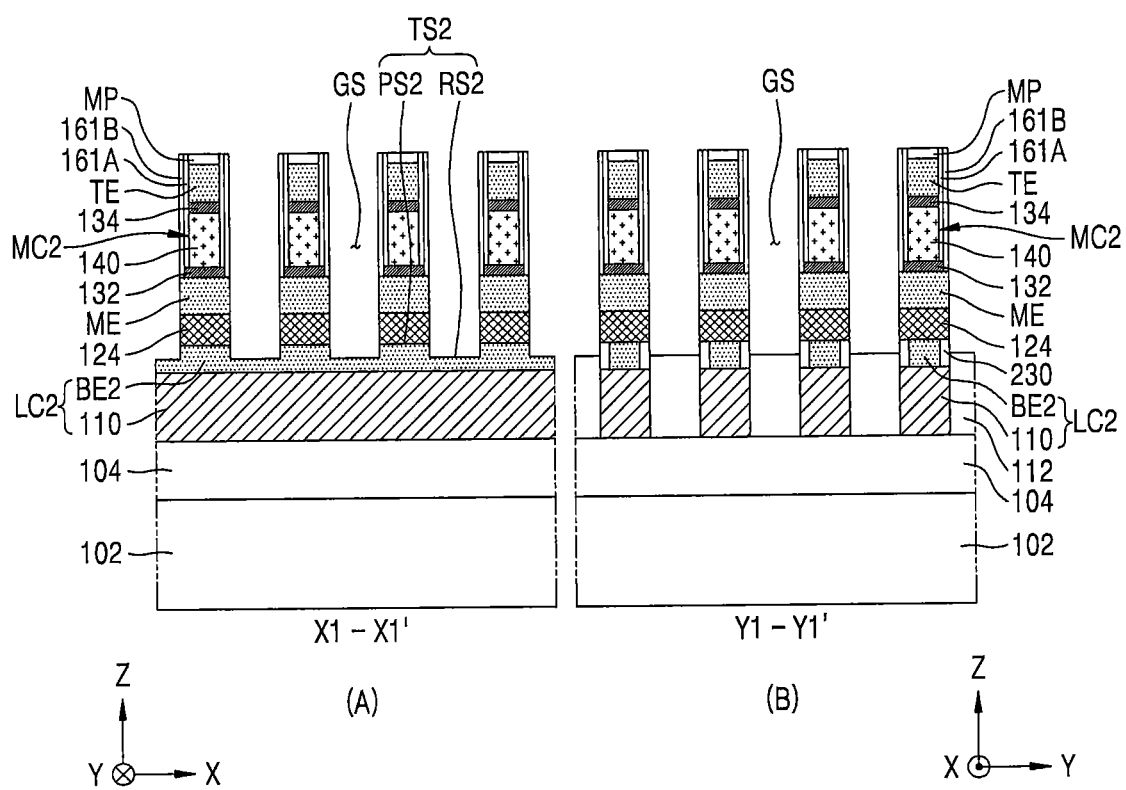

Referring to FIG. 16G, a plurality of memory cells MC2 including a plurality of bottom electrodes BE2, a plurality of selection devices 124, a plurality of middle electrodes ME, a plurality of lower barriers 132, a plurality of resistive memory patterns 140, a plurality of upper barriers 134, and a plurality of top electrodes TE may be formed by performing the processes, described above with reference to FIGS. 15D to 15H, on a resultant material of FIG. 16F.

Memory cells MC2 of one group arranged in one row in the first horizontal direction (e.g., the X direction) among the plurality of memory cells MC2 may share one bottom electrode BE2. Each of the plurality of bottom electrodes BE2 may include a top surface TS2 having a concave-convex shape and including a plurality of protrusion surfaces PS2 and a plurality of recess surfaces RS2.

A state where the first conductive line 110 is on and/or covered by the bottom electrode BE2 and the plurality of insulation spacers 230 may be maintained while structures on the plurality of lower conductive lines LC2 are being etched for forming the plurality of memory cells MC2 in a process described above with reference to FIG. 16G, and thus, the plurality of first conductive lines 110 may not be exposed to an etch atmosphere after the plurality of memory cells MC2 are formed. Particularly, when misalignment occurs while the mask pattern MP is being formed in a process described above with reference to FIG. 16G, a resultant material where a stack structure on the bottom electrode BE2 is offset in a horizontal direction from the bottom electrode BE2 may be obtained similar to the description of the resistive memory device 200A given above with reference to FIG. 9A, for example. Even in this case, according to an embodiment, the bottom electrode BE2 may maintain a sufficient thickness for protecting the plurality of first conductive lines 110 so that the plurality of first conductive lines 110 are not exposed to a cleaning process and/or the like. Therefore, a defect such as a dented surface or a non-uniform thickness of each of the plurality of first conductive lines 110 may not occur and/or may be reduced, and metal or metal-containing impurities caused by the plurality of first conductive lines 110 may be prevented and/or hindered from being deposited on the sidewalls of the plurality of memory cells MC1.

Figure 16H:
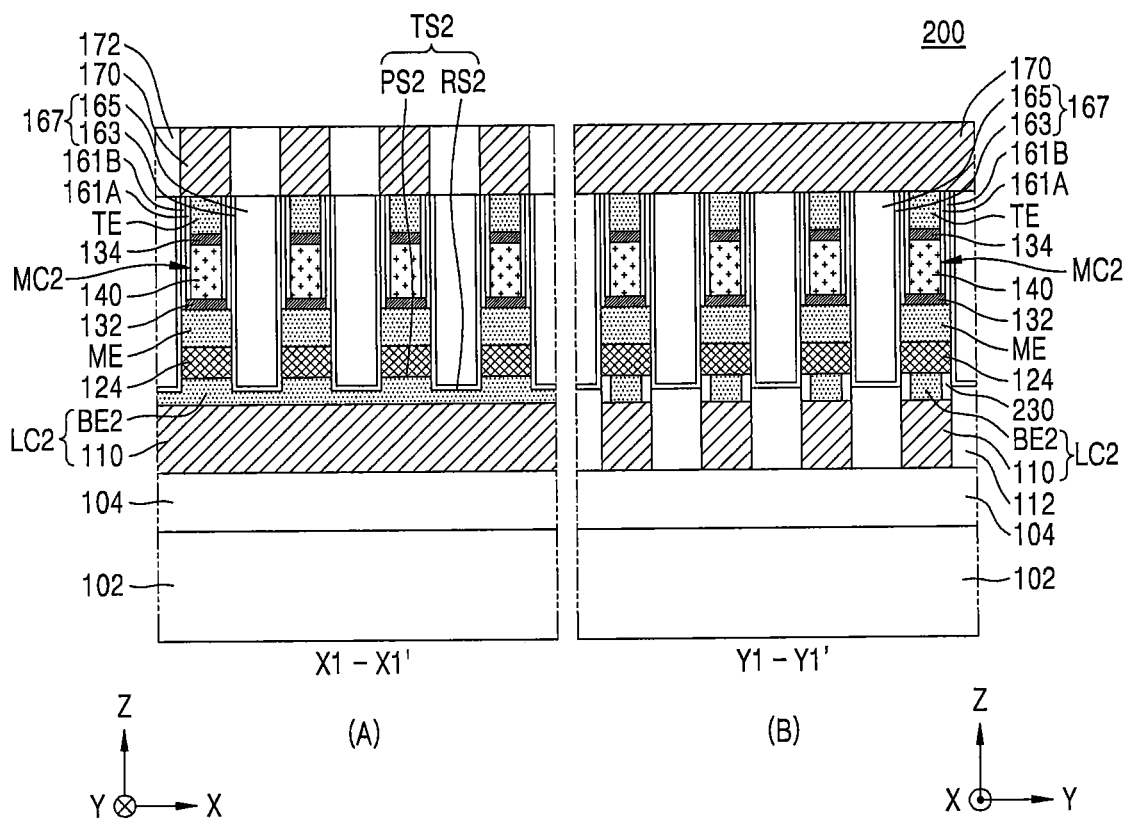

Referring to FIG. 16H, an encapsulation liner 163 and a gap-fill insulation layer 165 may be formed on a resultant material of FIG. 16G by using the method described above with reference to FIGS. 15I and 15J, and a plurality of second conductive lines 170 and a plurality of second insulation lines 172 may be formed by using the method described above with reference to FIG. 15K.

FIGS. 17A to 17D are cross-sectional views illustrated in a process sequence for describing a method of manufacturing a resistive memory device, according to some embodiments of the inventive concepts. In each of FIGS. 17A to 17D, region (A) is a cross-sectional view of some elements of a portion corresponding to a cross-sectional surface taken along line X1-X1' of FIG. 4, and region (B) is a cross-sectional view of some elements of a portion corresponding to a cross-sectional surface taken along line Y1-Y1' of FIG. 4. A method of manufacturing the resistive memory device 300 illustrated in FIGS. 10A and 10B will be described below with reference to FIGS. 17A to 17D.

Figure 17A:
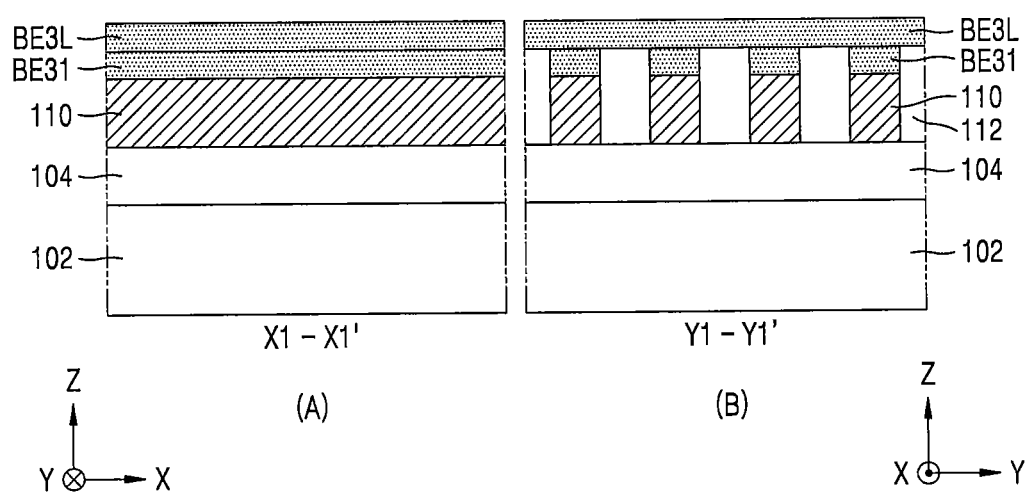
FIGS. 17A to 17D are cross-sectional views illustrated in a process sequence for describing a method of manufacturing a resistive memory device, according to some embodiments of the inventive concepts.

Referring to FIG. 17A, based on the method described above with reference to FIGS. 15A and 15B, an interlayer insulation layer 104, a plurality of first conductive lines 110, a plurality of lower bottom electrodes BE31, and a plurality of lower insulation lines 112 may be formed on a substrate 102 by using the method of forming the interlayer insulation layer 104, the plurality of first conductive lines 110, the plurality of bottom electrodes BE1, and the plurality of lower insulation lines 112 described above with reference to FIGS. 15A and 15B. Each of the plurality of lower bottom electrodes BE31 may include a line pattern which extends long (e.g., has a longitudinal axis extending) in the first horizontal direction (e.g., the X direction).

Subsequently, an upper bottom electrode layer BE3L may be formed on the plurality of lower bottom electrodes BE31 and the plurality of lower insulation lines 112. The upper bottom electrode layer BE3L may include the same material as that of the lower bottom electrode BE31. In some embodiments, the lower bottom electrode BE31 and the upper bottom electrode layer BE3L may have approximately the same or similar thickness in the vertical direction (e.g., the Z direction). In other embodiments, the lower bottom electrode BE31 and the upper bottom electrode layer BE3L may have different thicknesses in the vertical direction (e.g., the Z direction). For example, a thickness of the lower bottom electrode BE31 may be greater than that of the upper bottom electrode layer BE3L in the vertical direction (e.g., the Z direction). As another example, a thickness of the lower bottom electrode BE31 may be less than that of the upper bottom electrode layer BE3L in the vertical direction (e.g., the Z direction).

Figure 17B:
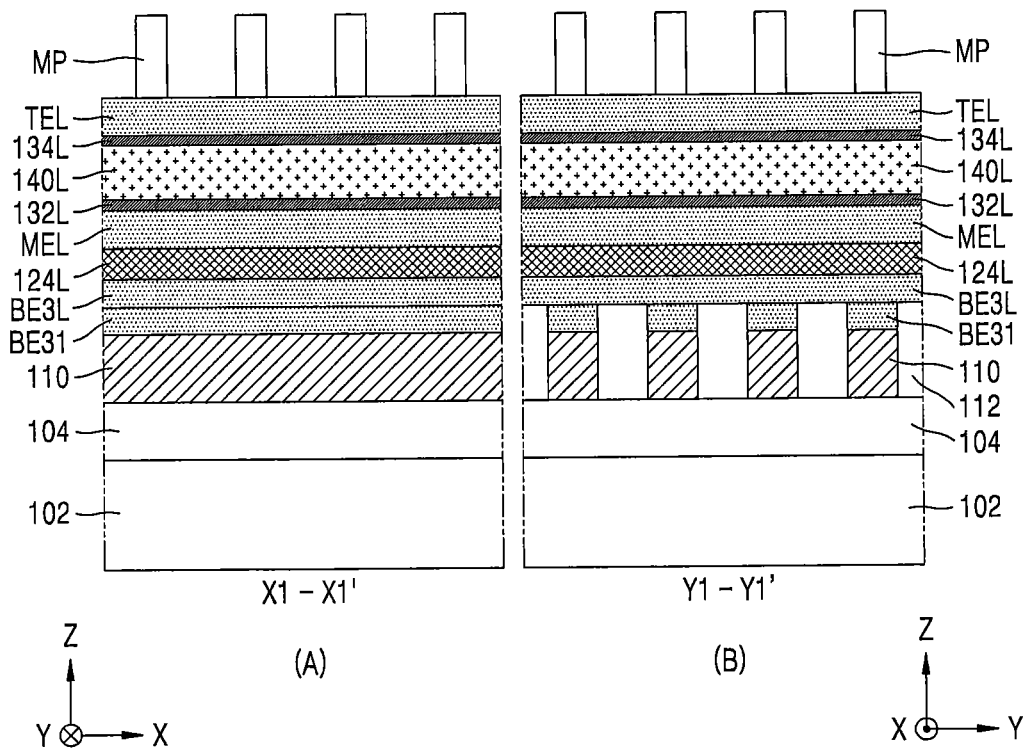

Referring to FIG. 17B, based on the method described above with reference to FIG. 15C, a selection device layer 124L, a middle electrode layer MEL, a lower barrier layer 132L, a resistive memory pattern layer 140L, an upper barrier layer 134L, and a top electrode layer TEL may be sequentially formed on a resultant material of FIG. 17A, and then, a mask pattern MP may be formed on the top electrode layer TEL.

Figure 17C:
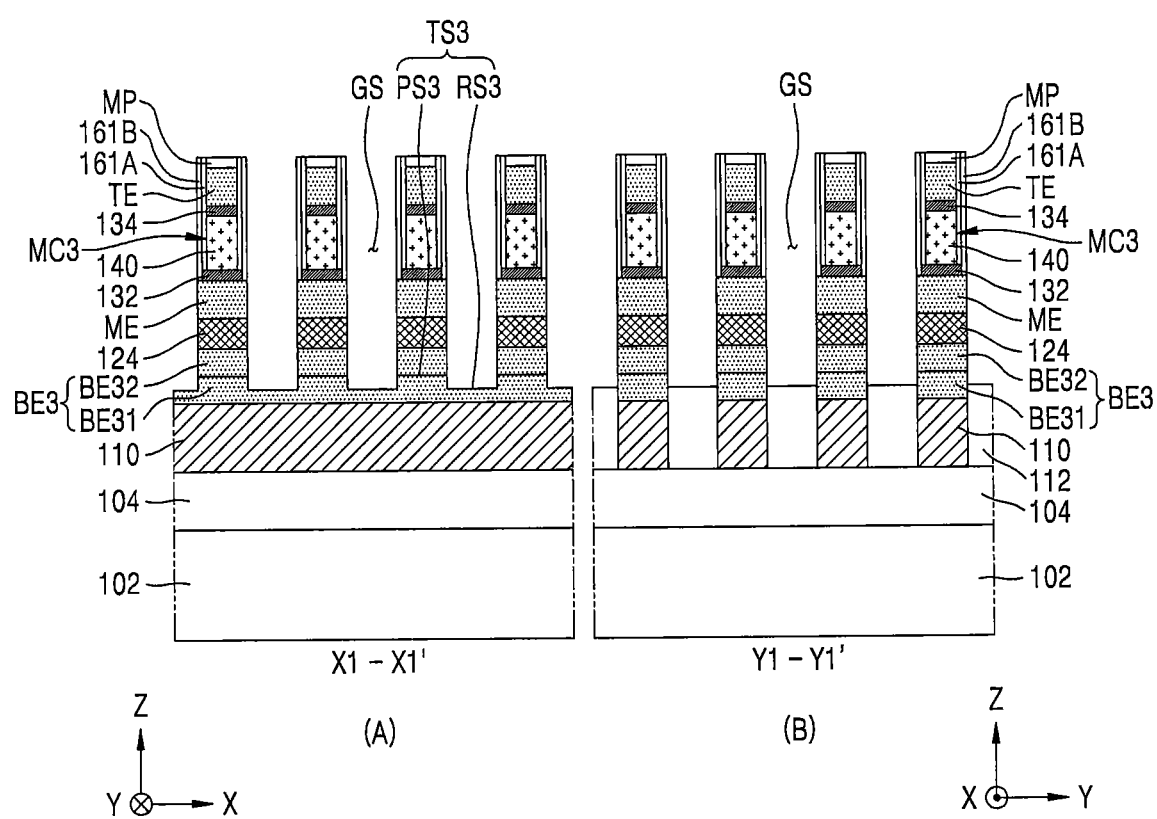

Referring to FIG. 17C, processes similar to the processes described above with reference to FIGS. 15D to 15H may be performed on a resultant material of FIG. 17B. The middle electrode layer MEL and the selection device layer 124L may be anisotropically etched as described above with reference to FIG. 15H, and subsequently, by anisotropically etching the upper bottom electrode layer BE3L, a plurality of upper bottom electrodes BE32 may be formed, thereby forming a plurality of memory cells MC3. The plurality of upper bottom electrodes BE32 may be formed to have an island pattern which is divided into a plurality of portions, and one upper bottom electrode BE32 may be formed in each of the plurality of memory cells MC3.

Subsequently, by etching a portion of the plurality of lower bottom electrodes BE31 and the plurality of lower insulation lines 112 through over-etching, a top surface TS3 having a concave-convex shape and including a plurality of protrusion surfaces PS3 and a plurality of recess surfaces RS3 may be formed in each of the plurality of lower bottom electrodes BE31. The lower bottom electrode BE31 and the upper bottom electrode BE32 may configure the bottom electrode BE3 of the memory cell MC3.

Figure 17D:
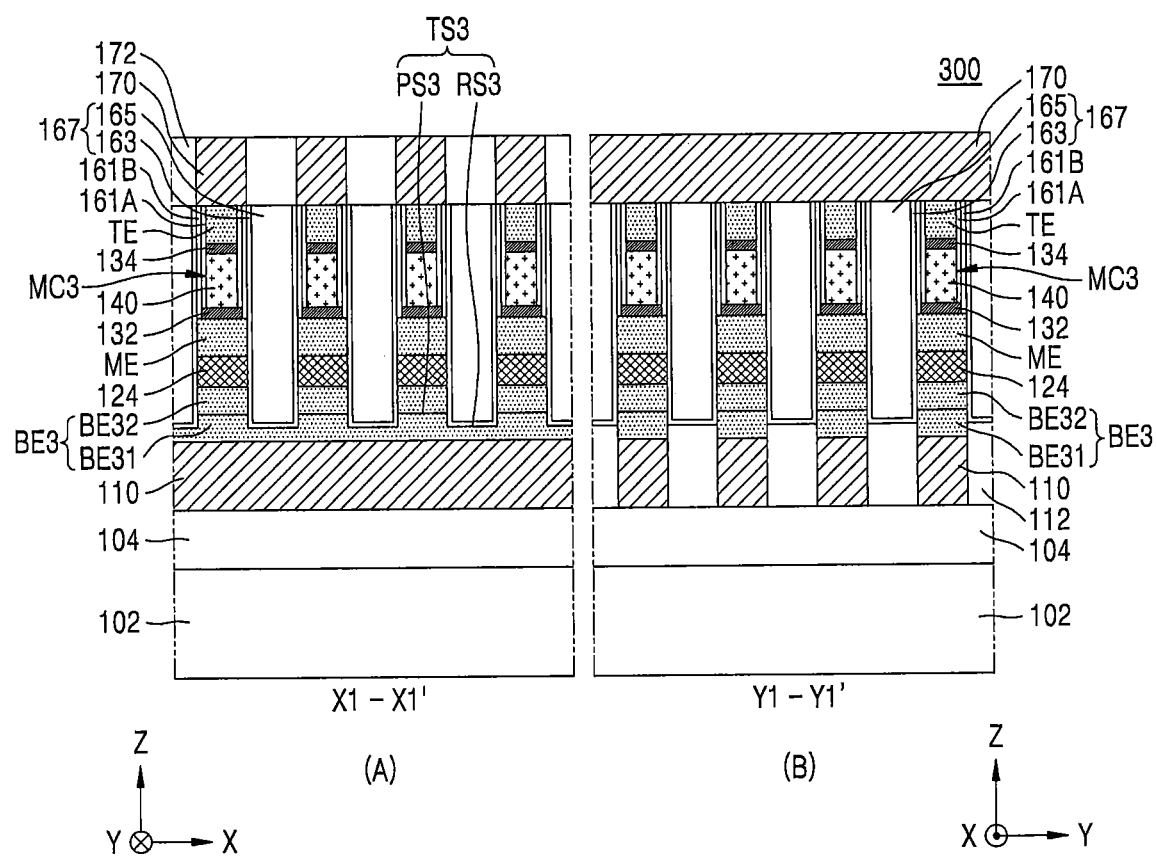

Referring to FIG. 17D, an encapsulation liner 163 and a gap-fill insulation layer 165 may be formed on a resultant material of FIG. 17C by using the method described above with reference to FIGS. 15I and 15J, and a plurality of second conductive lines 170 and a plurality of second insulation lines 172 may be formed by using the method described above with reference to FIG. 15K.

FIGS. 18A to 18E are cross-sectional views illustrated in a process sequence for describing a method of manufacturing a resistive memory device, according to some embodiments of the inventive concepts. In each of FIGS. 18A to 18C, region (A) is a cross-sectional view of some elements of a portion corresponding to a cross-sectional surface taken along line X1-X1' of FIG. 4, and region (B) is a cross-sectional view of some elements of a portion corresponding to a cross-sectional surface taken along line Y1-Y1' of FIG. 4. A method of manufacturing the resistive memory device 400 illustrated in FIGS. 11A and 11B will be described below with reference to FIGS. 18A to 18E.

Figure 18A:
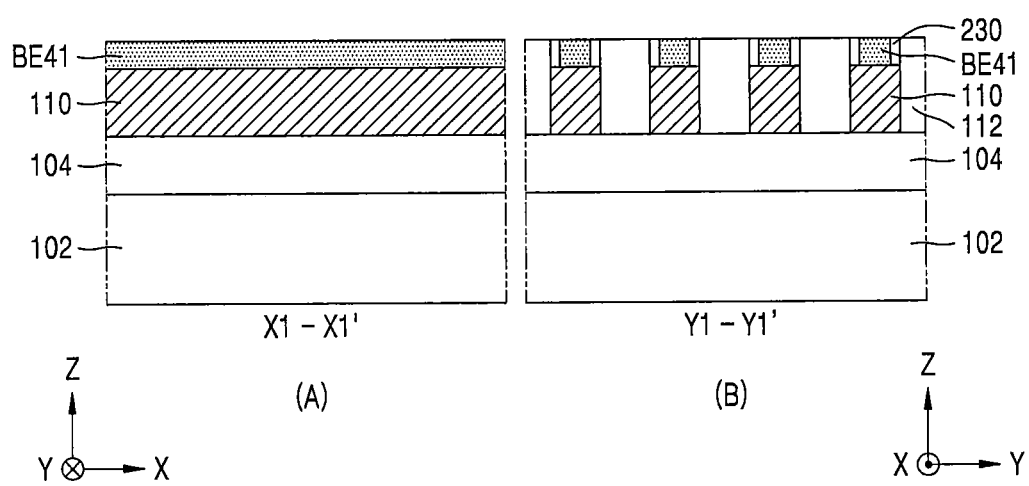
FIGS. 18A to 18E are cross-sectional views illustrated in a process sequence for describing a method of manufacturing a resistive memory device, according to some embodiments of the inventive concepts.

Referring to FIG. 18A, based on a method similar to the method of forming the plurality of first conductive lines 110, the plurality of bottom electrodes BE2, the plurality of insulation spacers 230, and the plurality of lower insulation lines 112 described above with reference to FIGS. 16A to 16E, a plurality of first conductive lines 110, a plurality of lower bottom electrodes BE41, a plurality of insulation spacers 230, and a plurality of lower insulation lines 112 may be formed on an interlayer insulation layer 104 on a substrate 102.

Figure 18B:
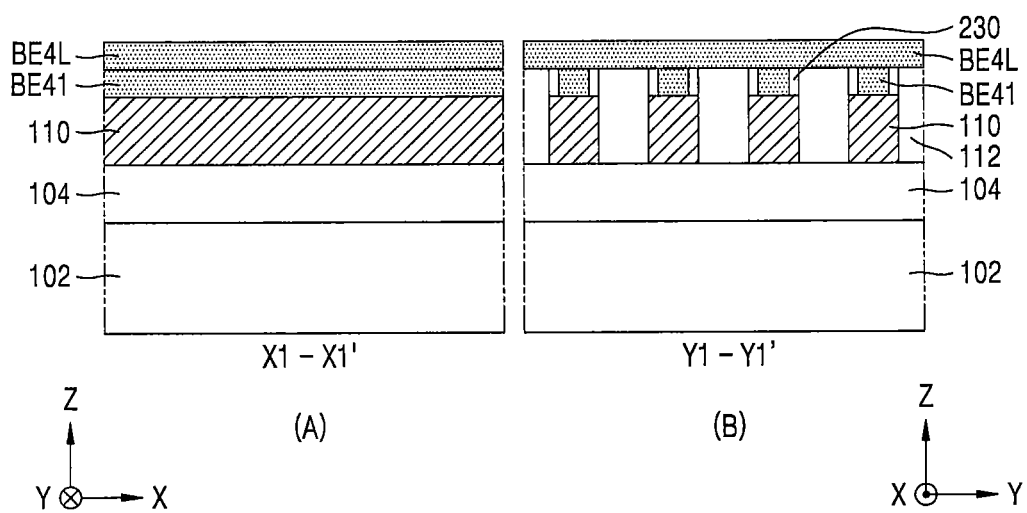

Referring to FIG. 18B, an upper bottom electrode layer BE4L may be formed on the plurality of lower bottom electrodes BE41 and the plurality of lower insulation lines 112. The upper bottom electrode layer BE4L may include the same material as that of each of the plurality of lower bottom electrodes BE41. In some embodiments, the plurality of lower bottom electrodes BE41 and the upper bottom electrode layer BE4L may have an approximately equal or similar thickness in the vertical direction (e.g., the Z direction). In other embodiments, the plurality of lower bottom electrodes BE41 and the upper bottom electrode layer BE4L may have different thicknesses in the vertical direction (e.g., the Z direction). For example, a thickness of the lower bottom electrode BE41 may be greater than that of the upper bottom electrode layer BE4L in the vertical direction (e.g., the Z direction). As another example, a thickness of the lower bottom electrode BE41 may be less than that of the upper bottom electrode layer BE4L in the vertical direction (e.g., the Z direction).

Figure 18C:
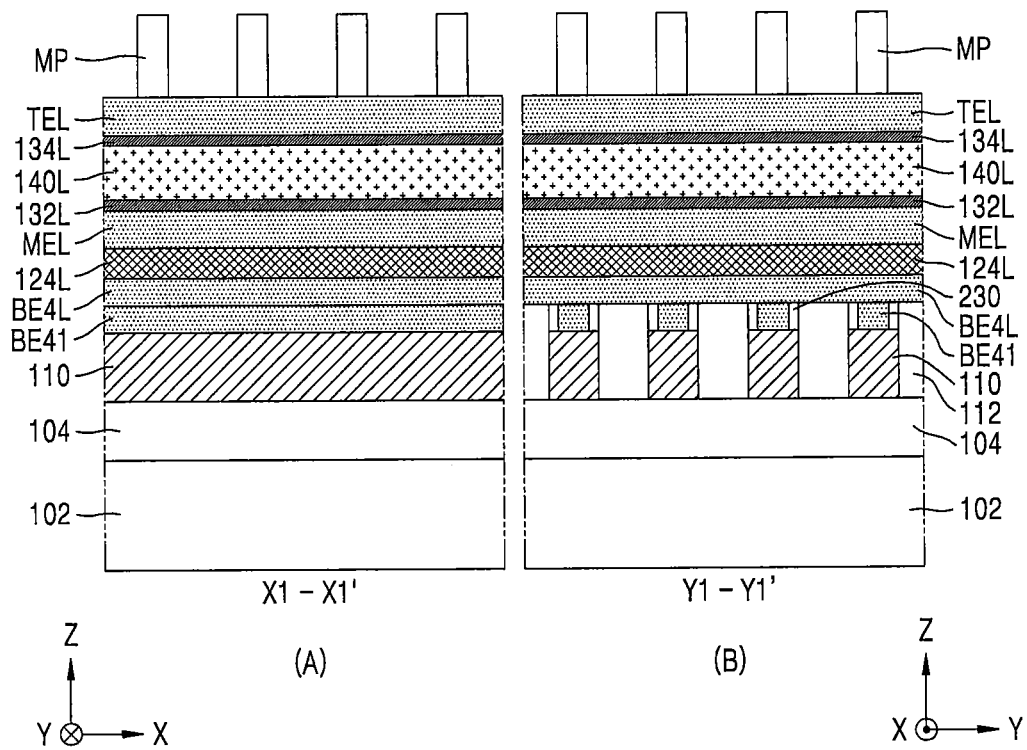

Referring to FIG. 18C, based on the method described above with reference to FIG. 15C, a selection device layer 124L, a middle electrode layer MEL, a lower barrier layer 132L, a resistive memory pattern layer 140L, an upper barrier layer 134L, and a top electrode layer TEL may be sequentially formed on a resultant material of FIG. 18B, and then, a mask pattern MP may be formed on the top electrode layer TEL.

Figure 18D:
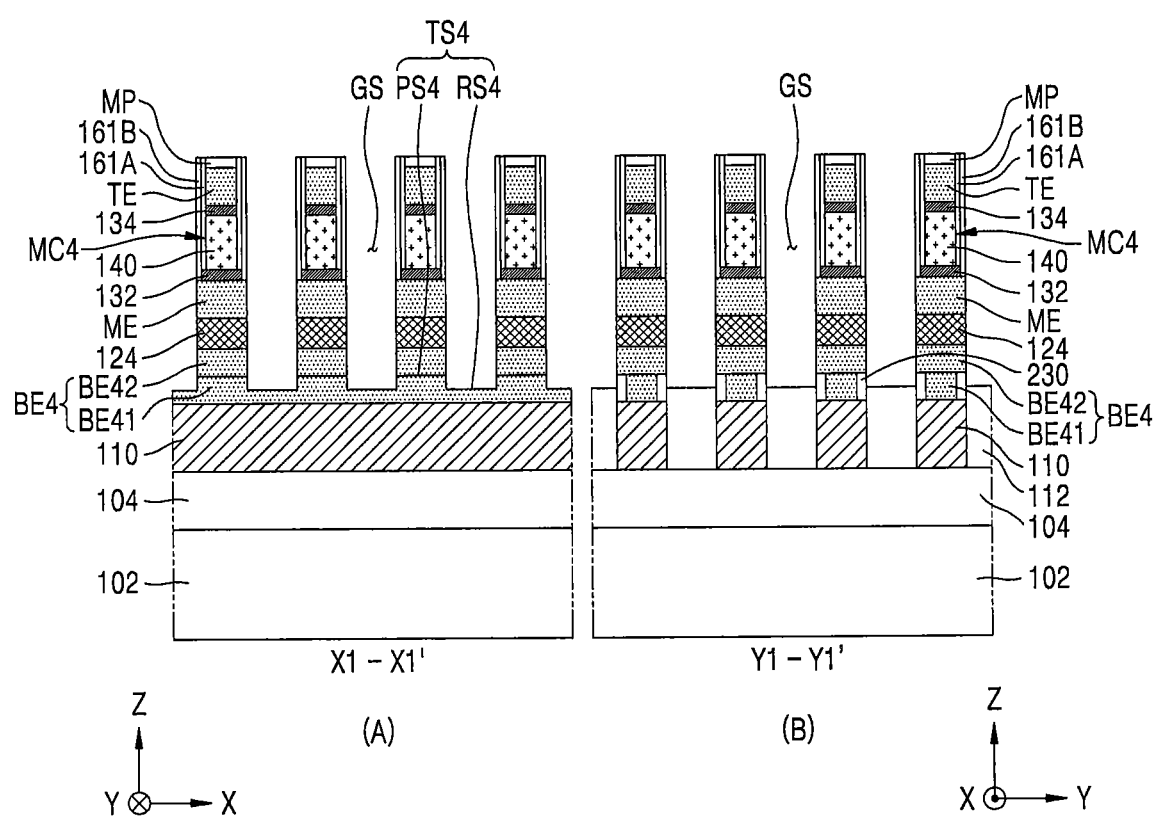

Referring to FIG. 18D, processes similar to the processes described above with reference to FIGS. 15D to 15H may be performed on a resultant material of FIG. 18C. The middle electrode layer MEL and the selection device layer 124L may be anisotropically etched as described above with reference to FIG. 15H, and subsequently, by anisotropically etching the upper bottom electrode layer BE4L, a plurality of upper bottom electrodes BE42 may be formed, thereby forming a plurality of memory cells MC4. The plurality of upper bottom electrodes BE42 may be formed to have an island pattern which is divided into a plurality of portions, and one upper bottom electrode BE42 may be formed in each of the plurality of memory cells MC4.

Subsequently, by etching a portion of the plurality of lower bottom electrodes BE41 and the plurality of lower insulation lines 112 through over-etching, a top surface TS4 having a concave-convex shape and including a plurality of protrusion surfaces PS4 and a plurality of recess surfaces RS4 may be formed in each of the plurality of lower bottom electrodes BE41.

Figure 18E:
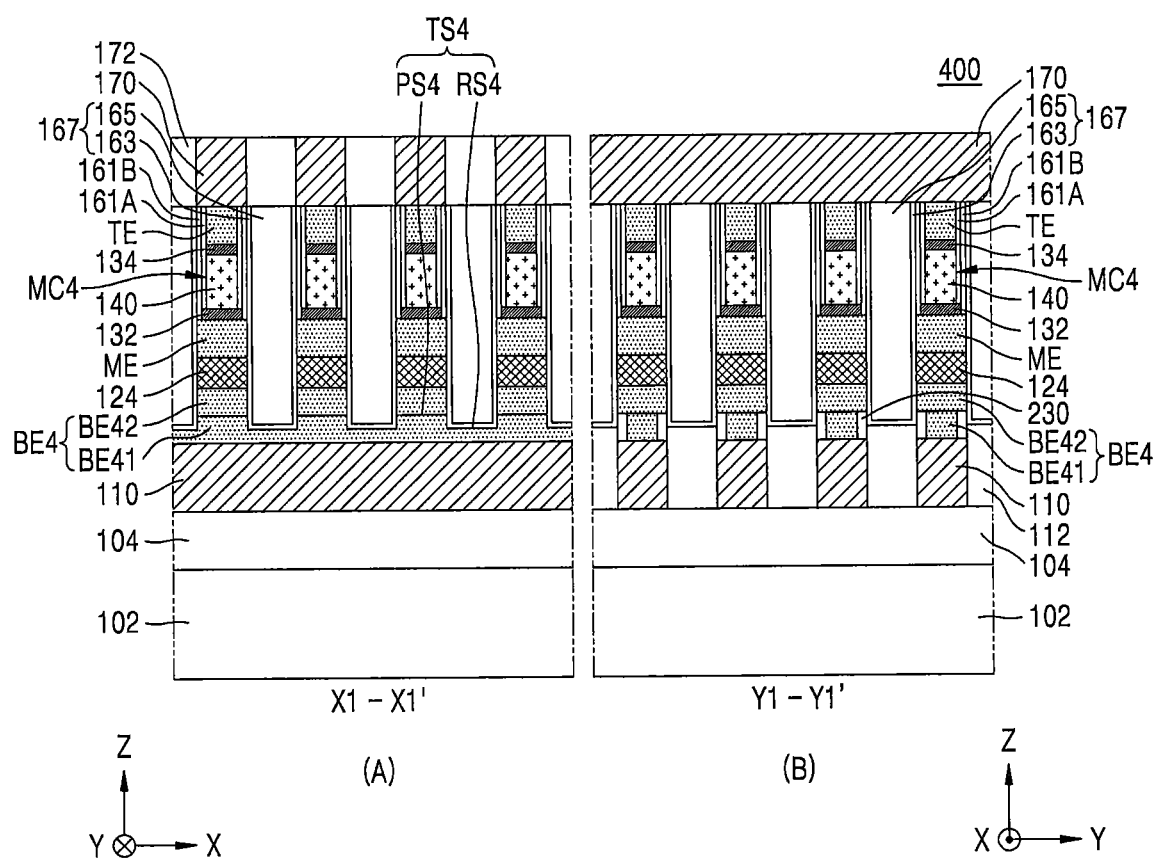

Referring to FIG. 18E, an encapsulation liner 163 and a gap-fill insulation layer 165 may be formed on a resultant material of FIG. 18D by using the method described above with reference to FIGS. 15I and 15J, and a plurality of second conductive lines 170 and a plurality of second insulation lines 172 may be formed by using the method described above with reference to FIG. 15K.

Hereinabove, the methods of manufacturing each of the resistive memory device 100 illustrated in FIGS. 4, 5A, and 5B, the resistive memory device 200 illustrated in FIGS. 8A and 8B, the resistive memory device 300 illustrated in FIGS. 10A and 10B, the resistive memory device 400 illustrated in FIGS. 11A and 11B have been described above with reference to FIGS. 15A to 18E, but it may be understood by those of ordinary skill in the art that the resistive memory devices 100A, 100B, 200A, 200B, 200C, 500, 600, 700A, 700B illustrated in FIGS. 6, 7, 9A to 9C, 12A, 13, 14A, and 14B and/or resistive memory devices having various structures, which are variously modified and changed therefrom within the scope of the inventive concepts, are manufactured by using various methods modified and changed from the descriptions of FIGS. 15A to 18E within the scope of the inventive concepts.

While the inventive concepts have been particularly shown and described with reference to embodiments thereof, it will be understood that various changes in form and details may be made therein without departing from the scope of the following claims.

What is claimed is:

1. A resistive memory device comprising:
a first conductive line extending in a first horizontal direction on a substrate;
a plurality of second conductive lines separated from the first conductive line in a vertical direction and extending in a second horizontal direction, intersecting with the first horizontal direction, on the substrate;
a plurality of memory cells respectively connected between the first conductive line and one second conductive line selected from among the plurality of second conductive lines at a plurality of intersection points between the first conductive line and the plurality of second conductive lines, each of the plurality of memory cells comprising a selection device and a resistive memory pattern; and
a bottom electrode shared by the plurality of memory cells, the bottom electrode having a variable thickness in the first horizontal direction and comprising a top surface having a concave-convex shape;
wherein the bottom electrode is between the first conductive line and the selection device; and
wherein a width of the bottom electrode is less than a width of the selection device in the second horizontal direction.

2. The resistive memory device of claim 1,
wherein the bottom electrode comprises a plurality of protrusion surfaces, respectively facing the selection devices of the plurality of memory cells, and a plurality of recess surfaces at a periphery of the selection devices and at a level that is lower than the plurality of protrusion surfaces, and
wherein, in the vertical direction, a thickness of a first portion of the bottom electrode comprising one of the plurality of protrusion surfaces is greater than a thickness of a second portion of the bottom electrode comprising one of the plurality of recess surfaces.

3. The resistive memory device of claim 1, further comprising an insulation spacer on a sidewall of the bottom electrode,
wherein the insulation spacer extends between a top surface of the first conductive line and a bottom surface of the selection device.

4. The resistive memory device of claim 1, further comprising an insulation spacer on a sidewall of the bottom electrode,
wherein the insulation spacer has a variable thickness in the first horizontal direction.

5. The resistive memory device of claim 1, wherein a width of the bottom electrode is less than a width of the first conductive line in the second horizontal direction.

6. The resistive memory device of claim 1, further comprising a pair of insulation spacers on sidewalls of the bottom electrode,
wherein a sum of a width of the bottom electrode and a width of each of the pair of insulation spacers is the same as a width of the first conductive line in the second horizontal direction.

7. The resistive memory device of claim 1, further comprising:
a lower insulation line on a sidewall of the first conductive line; and
an upper insulation structure on a sidewall of each of the plurality of memory cells,
wherein a level of an interface between the lower insulation line and the upper insulation structure is higher than a level of an uppermost surface of the first conductive line and is equal to or lower than a level of an uppermost surface of the bottom electrode.

8. The resistive memory device of claim 1, wherein each of the plurality of second conductive lines comprises a multilayer comprising a conductive metal nitride layer and a metal layer.

9. A resistive memory device comprising:
a plurality of first conductive lines extending in a first horizontal direction on a substrate;
a plurality of second conductive lines separated from the plurality of first conductive lines in a vertical direction and extending in a second horizontal direction intersecting with the first horizontal direction on the substrate; and
a plurality of memory cells at respective intersection points between the plurality of first conductive lines and the plurality of second conductive lines, each of the plurality of memory cells comprising a selection device and a resistive memory pattern;
a pair of insulation spacers on sidewalls of the one of the plurality of bottom electrodes between one of the plurality of first conductive lines and a corresponding selection device,
wherein each of the plurality of memory cells comprises one of a plurality of bottom electrodes extending in the first horizontal direction between the plurality of first conductive lines and the selection devices, each of the plurality of bottom electrodes having a variable thickness in the first horizontal direction and comprising a top surface having a concave-convex shape,
wherein a first group among the plurality of memory cells that are arranged in one row in the first horizontal direction share a first bottom electrode selected from among the plurality of bottom electrodes, and
wherein the pair of insulation spacers have a variable thickness in the first horizontal direction.

10. The resistive memory device of claim 9, further comprising:
an upper insulation structure on a sidewall of each of the plurality of memory cells,
wherein each of the pair of insulation spacers comprises a top surface comprising a protrusion surface and a recess surface,
wherein the protrusion surface contacts a bottom surface of a corresponding selection device, and
wherein the recess surface contacts a bottom surface of the upper insulation structure.

11. The resistive memory device of claim 9,
wherein the first bottom electrode comprises:
a lower bottom electrode shared by the memory cells of the first group that extends in the first horizontal direction, the lower bottom electrode having a width defined by the pair of insulation spacers; and a plurality of upper bottom electrodes each comprising a bottom surface contacting a top surface of each of the pair of insulation spacers and a top surface of the lower bottom electrode, the plurality of upper bottom electrodes being respectively in the memory cells of the first group.

12. The resistive memory device of claim 9, further comprising:

a plurality of lower insulation lines respectively on sidewalls of the plurality of first conductive lines; and an upper insulation structure on a sidewall of each of the plurality of memory cells, wherein a level of an interface between the lower insulation line and the upper insulation structure is higher than a level of an uppermost surface of each of the plurality of first conductive lines and is equal to or lower than a level of an uppermost surface of each of the plurality of bottom electrodes.

13. A resistive memory device comprising:

a first conductive line extending in a first horizontal direction on a substrate;

a plurality of second conductive lines separated from the first conductive line in a vertical direction and extending on the substrate in a second horizontal direction intersecting with the first horizontal direction;

a plurality of memory cells respectively at a plurality of intersection points between the first conductive line and the plurality of second conductive lines and arranged in one row in the first horizontal direction on the first conductive line;

a bottom electrode shared by the plurality of memory cells, the bottom electrode having a variable thickness in the first horizontal direction and comprising a bottom surface contacting a top surface of the first conductive line and a top surface having alternating recess and protrusion surfaces;

a pair of insulation spacers on sidewalls of the bottom electrode and on the first conductive line;

a plurality of lower insulation lines on a sidewall of the first conductive line and a sidewall of each of the pair of insulation spacers; and an upper insulation structure on a sidewall of each of the plurality of memory cells and on the plurality of lower insulation lines.

14. The resistive memory device of claim 13, wherein each of the plurality of memory cells comprises a selection device, a middle electrode, a lower barrier, a resistive memory pattern, an upper barrier, and a top electrode sequentially stacked in the vertical direction on the bottom electrode, wherein the resistive memory device further comprises:

a first insulation liner contacting a sidewall of the resistive memory pattern, the first insulation liner comprising a bottom surface contacting a top surface of the lower barrier; and a second insulation liner on the sidewall of the resistive memory pattern with the first insulation liner therebetween, the second insulation liner comprising a bottom surface contacting a top surface of the middle electrode, and wherein the first insulation liner and the second insulation liner comprise different insulating materials.

15. The resistive memory device of claim 13, wherein the upper insulation structure comprises an encapsulation liner on a sidewall of each of the plurality of memory cells and a gap-fill insulation layer separated from each of the plurality of memory cells with the encapsulation liner therebetween and within a space between two adjacent memory cells of the plurality of memory cells on the encapsulation liner, and a level of an interface between a lower insulation line of the lower insulation lines and the encapsulation liner is higher than a level of an uppermost surface of the first conductive line and is equal to or lower than a level of an uppermost surface of the bottom electrode.

* * * * *